US012787434B2

(12) United States Patent
Kusunoki et al.

(10) Patent No.: US 12,787,434 B2
(45) Date of Patent: Nov. 3, 2026

(54) SEMICONDUCTOR DEVICE AND DISPLAY DEVICE

(71) Applicant: Semiconductor Energy Laboratory Co., Ltd., Atsugi (JP)

(72) Inventors: Koji Kusunoki, Isehara (JP); Susumu Kawashima, Atsugi (JP); Hideaki Shishido, Atsugi (JP); Tomoaki Atsumi, Hadano (JP); Motoharu Saito, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 623 days.

(21) Appl. No.: 18/140,797

(22) Filed: Apr. 28, 2023

(65) Prior Publication Data

US 2023/0369344 A1 Nov. 16, 2023

(30) Foreign Application Priority Data

May 13, 2022 (JP) ................................ 2022-079206

(51) Int. Cl.
*H10D 86/60* (2025.01)
*G09G 3/3233* (2016.01)
*H10D 86/40* (2025.01)

(52) U.S. Cl.
CPC ........... *H10D 86/60* (2025.01); *G09G 3/3233* (2013.01); *H10D 86/431* (2025.01); *G09G 2300/0842* (2013.01); *G09G 2310/08* (2013.01)

(58) Field of Classification Search
None
See application file for complete search history.

(56) References Cited

U.S. PATENT DOCUMENTS

2011/0017995 A1* 1/2011 Yamazaki ............ H10D 86/423 257/E27.111
2015/0364513 A1* 12/2015 Takahashi ............ H10D 86/423 257/292
2018/0061908 A1* 3/2018 Shim .................. H10K 59/1213
(Continued)

FOREIGN PATENT DOCUMENTS

WO WO-2016/038508 3/2016

*Primary Examiner* — Jeff W Natalini
*Assistant Examiner* — Jacob Raul Marin
(74) *Attorney, Agent, or Firm* — Eric J. Robinson; Robinson Intellectual Property Law Office, P.C.

(57) ABSTRACT

A semiconductor device including a first transistor, a second transistor, and an insulating layer is provided. The first transistor includes a first semiconductor layer and a first conductive layer. The second transistor includes a second semiconductor layer and a second conductive layer. The insulating layer includes a first side surface over the first conductive layer and a second side surface over the second conductive layer. A gate insulating layer includes a portion facing the first side surface with the first semiconductor layer therebetween and a portion facing the second side surface with the second semiconductor layer therebetween. A gate electrode includes a portion facing the first side surface with the gate insulating layer and the first semiconductor layer therebetween and a portion facing the second side surface with the gate insulating layer and the second semiconductor layer therebetween. The first semiconductor layer is electrically connected to the second semiconductor layer.

8 Claims, 26 Drawing Sheets

(56) References Cited

U.S. PATENT DOCUMENTS

2018/0374841 A1 12/2018 Anderson et al.
2020/0006554 A1 1/2020 Cheng et al.
2020/0279858 A1 9/2020 Xie et al.
2020/0292998 A1 9/2020 Yoshizumi et al.
2020/0357893 A1* 11/2020 Nakazawa ......... H10D 86/0221
2021/0020785 A1 1/2021 Sato et al.
2021/0091207 A1 3/2021 Yu et al.
2021/0167194 A1 6/2021 Yamazaki et al.
2021/0320212 A1 10/2021 Yamazaki et al.
2021/0376126 A1 12/2021 Sohn et al.
2022/0028994 A1* 1/2022 Chen .................... H10D 84/038
2022/0045167 A1 2/2022 Do et al.
2022/0115046 A1* 4/2022 Kang ............... G11C 29/50008
2022/0123143 A1 4/2022 Song et al.
2022/0149166 A1* 5/2022 Lee ...................... H10D 30/668
2022/0165623 A1 5/2022 Jun et al.
2022/0190125 A1 6/2022 Wu et al.
2022/0328694 A1 10/2022 Hanaoka et al.
2023/0029551 A1 2/2023 Hsieh
2023/0050036 A1 2/2023 Yamazaki et al.
2023/0072305 A1 3/2023 Cheng et al.
2023/0079244 A1 3/2023 Yamazaki et al.
2023/0103070 A1 3/2023 Jun et al.
2023/0126578 A1 4/2023 Reznicek et al.
2023/0178558 A1 6/2023 Do
2023/0187493 A1 6/2023 Hong et al.

* cited by examiner

FIG. 12A1
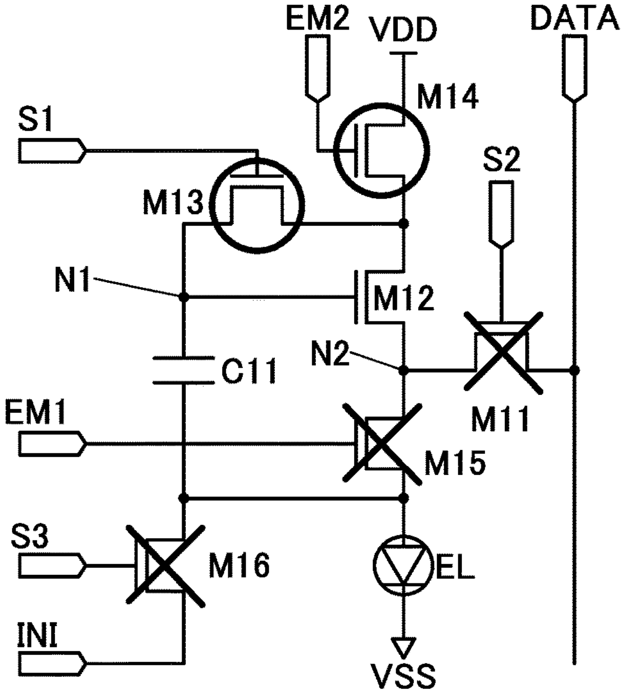
FIG. 12A2
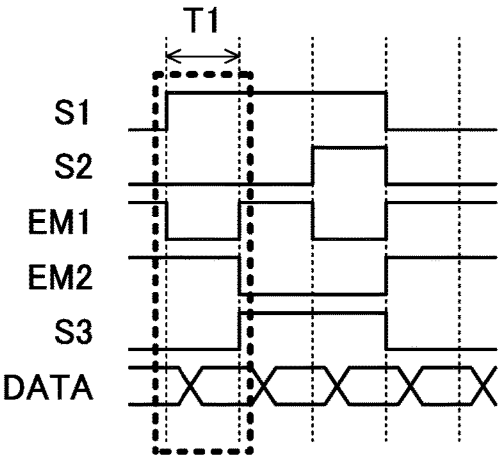
FIG. 12B1
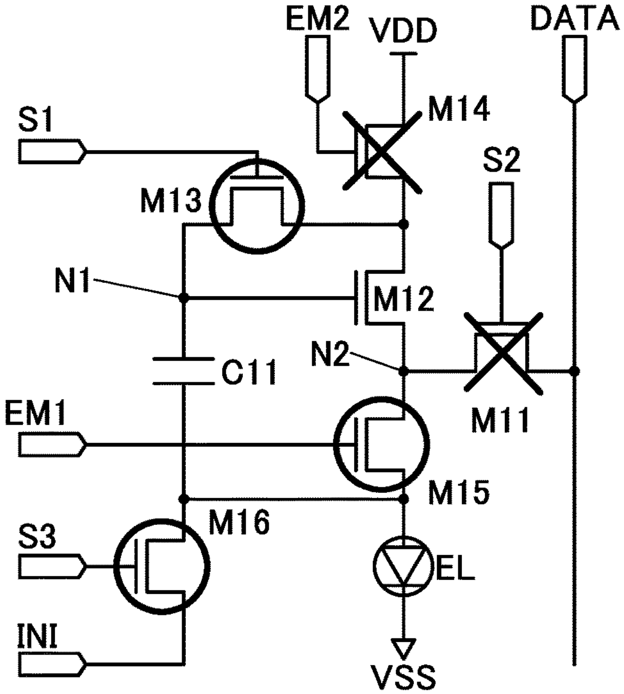
FIG. 12B2
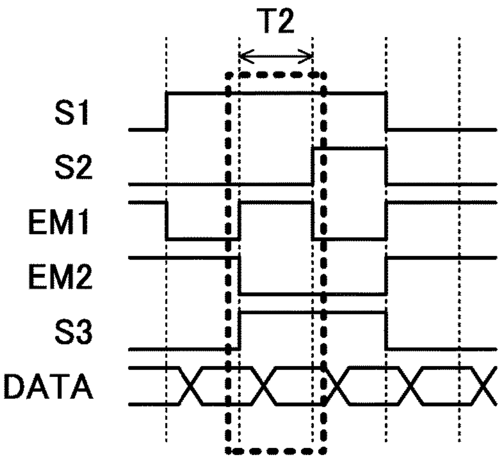

FIG. 13A1
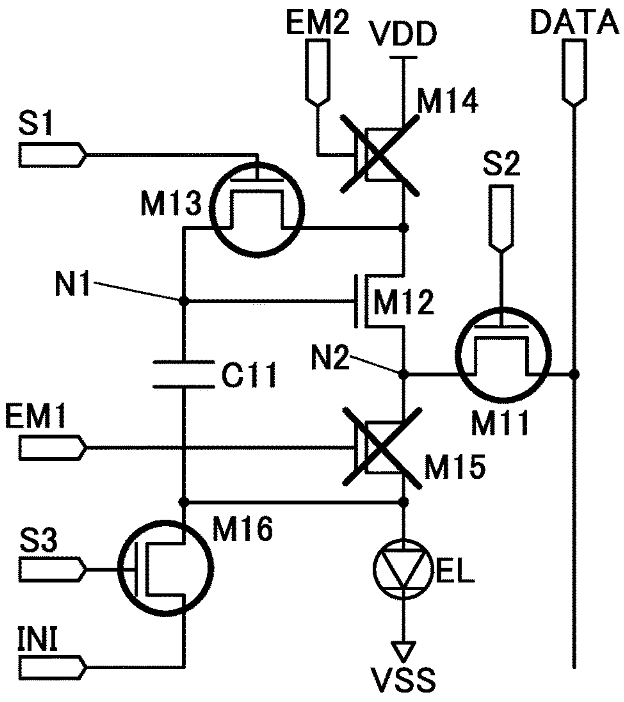
FIG. 13A2
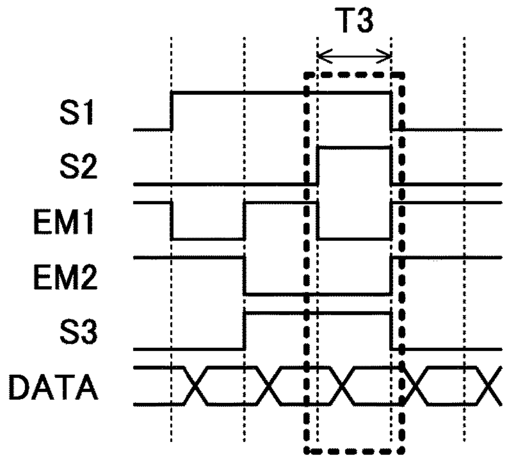
FIG. 13B1
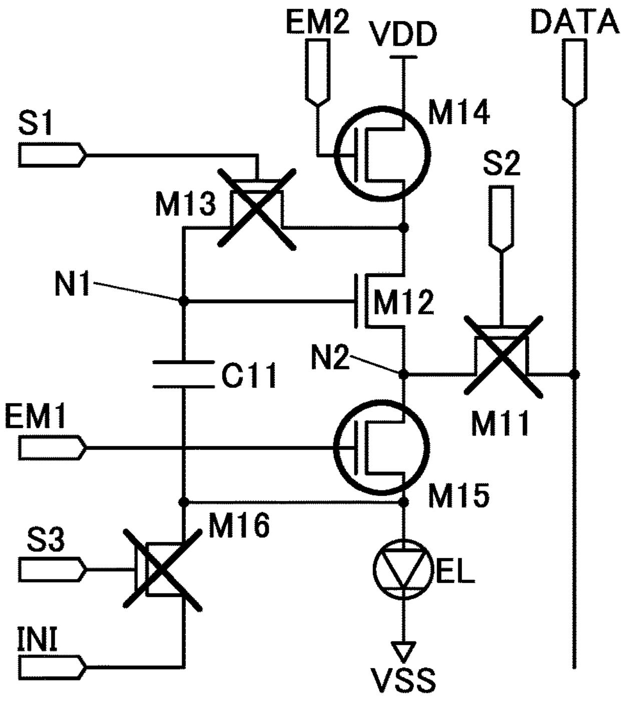
FIG. 13B2
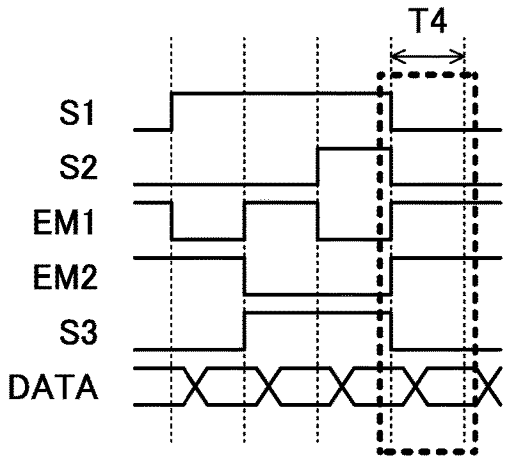

SEMICONDUCTOR DEVICE AND DISPLAY DEVICE

BACKGROUND OF THE INVENTION

1. Field of the Invention

One embodiment of the present invention relates to a semiconductor device and a method for manufacturing the semiconductor device. One embodiment of the present invention relates to a transistor and a method for manufacturing the transistor. One embodiment of the present invention relates to a display device including a semiconductor device.

Note that one embodiment of the present invention is not limited to the above technical field. Examples of the technical field of one embodiment of the present invention disclosed in this specification and the like include a semiconductor device, a display device, a light-emitting apparatus, a power storage device, a memory device, an electronic device, a lighting device, an input device, an input/output device, a driving method thereof, and a manufacturing method thereof. A semiconductor device generally means a device that can function by utilizing semiconductor characteristics.

2. Description of the Related Art

Miniaturization of transistors has been required. For example, a display device in which a transistor occupies only a small area of a pixel can have downsized pixels, leading to high resolution. In addition, in such a display device, the number of transistors provided per unit area can be increased, that is, a large number of transistors can be provided in the pixel without increasing the pixel size, so that a correction function or the like can be added to the pixel.

In recent years, the resolution of a display panel has been increased. As a device that requires a high-resolution display panel, a device for virtual reality (VR) or augmented reality (AR) has been actively developed in recent years besides a tablet terminal, a smartphone, and a watch-type terminal. For a high-resolution display panel, a light-emitting element such as an organic electroluminescent (EL) element or a light-emitting diode (LED) is mainly used.

Patent Document 1 discloses a high-resolution display device using an organic EL device (also referred to as organic EL element).

REFERENCE

Patent Document

[Patent Document 1] International Publication No. 2016/038508

SUMMARY OF THE INVENTION

An object of one embodiment of the present invention is to provide a transistor that can be miniaturized. Another object is to provide a transistor with favorable electrical characteristics. Another object is to provide a transistor having a small difference in characteristics between before and after a source and a drain are interchanged with each other. Another object is to provide a transistor whose channel length can be shortened. Another object is to provide a transistor that occupies a small area. Another object is to provide a semiconductor device with reduced wiring resistance. Another object is to provide a display device that can easily achieve higher resolution. Another object is to provide a highly reliable transistor and a semiconductor device.

Note that the description of these objects does not preclude the existence of other objects. In one embodiment of the present invention, there is no need to achieve all these objects. Objects other than these can be derived from the description of the specification, the drawings, the claims, and the like.

One embodiment of the present invention is a semiconductor device including a first transistor, a second transistor, and an insulating layer. The first transistor includes a first semiconductor layer, a gate insulating layer, a gate electrode, and a first conductive layer. The second transistor includes a second semiconductor layer, the gate insulating layer, the gate electrode, and a second conductive layer. The insulating layer includes a first side surface and a second side surface. The first side surface is over the first conductive layer. The second side surface is over the second conductive layer. The first semiconductor layer includes a portion over the insulating layer, a portion in contact with the first side surface, and a portion in contact with a top surface of the first conductive layer. The second semiconductor layer includes a portion over the insulating layer, a portion in contact with the second side surface, and a portion in contact with a top surface of the second conductive layer. The gate insulating layer includes a portion over the insulating layer, a portion facing the first side surface with the first semiconductor layer therebetween, and a portion facing the second side surface with the second semiconductor layer therebetween. The gate electrode includes a portion over the insulating layer, a portion facing the first side surface with the gate insulating layer and the first semiconductor layer therebetween, and a portion facing the second side surface with the gate insulating layer and the second semiconductor layer therebetween. Over the insulating layer, the first semiconductor layer is electrically connected to the second semiconductor layer.

Another embodiment of the present invention is a semiconductor device including a first transistor, a second transistor, and an insulating layer. The first transistor includes a first semiconductor layer, a gate insulating layer, a gate electrode, and a first conductive layer. The second transistor includes a second semiconductor layer, the gate insulating layer, the gate electrode, and a second conductive layer. The insulating layer includes a first side surface and a second side surface. The first side surface is over the first conductive layer. The second side surface is over the second conductive layer. The first semiconductor layer includes a portion over the insulating layer, a portion in contact with the first side surface, and a portion in contact with a top surface of the first conductive layer. The second semiconductor layer includes a portion over the insulating layer, a portion in contact with the second side surface, and a portion in contact with a top surface of the second conductive layer. The gate insulating layer includes a portion over the insulating layer, a portion facing the first side surface with the first semiconductor layer therebetween, and a portion facing the second side surface with the second semiconductor layer therebetween. The gate electrode includes a portion over the insulating layer, a portion facing the first side surface with the gate insulating layer and the first semiconductor layer therebetween, and a portion facing the second side surface with the gate insulating layer and the second semiconductor layer therebetween. Under the insulating layer, the first conductive layer is electrically connected to the second conductive layer.

In the above, the semiconductor device preferably further includes a third conductive layer over the insulating layer. The first semiconductor layer and the second semiconductor layer each preferably include a portion in contact with the third conductive layer.

In the above, the semiconductor device preferably further includes a third conductive layer over the insulating layer. The first semiconductor layer and the second semiconductor layer each preferably include a portion in contact with the third conductive layer. The first conductive layer, the first semiconductor layer, the third conductive layer, the gate insulating layer, and the gate electrode preferably overlap with each other over part of the insulating layer. The second conductive layer, the second semiconductor layer, the third conductive layer, the gate insulating layer, and the gate electrode preferably overlap with each other over part of the insulating layer.

In the above, the semiconductor device preferably further includes a fourth conductive layer in contact with the third conductive layer over the insulating layer. The third conductive layer preferably includes an oxide and the fourth conductive layer preferably includes a metal or an alloy.

In the above, the semiconductor device preferably further includes a fifth conductive layer under the insulating layer. The fifth conductive layer is preferably in contact with one or both of the first conductive layer and the second conductive layer. The first conductive layer and the second conductive layer each preferably include an oxide and the fifth conductive layer preferably includes a metal or an alloy.

In the above, the first semiconductor layer is preferably part of a first film and the second semiconductor layer is preferably another part of the first film.

In the above, the first semiconductor layer is preferably part of a second film and the second semiconductor layer is preferably another part of the second film.

Another embodiment of the present invention is a semiconductor device including a third transistor, a fourth transistor, a capacitor, and first to fourth wirings. One of a source electrode and a drain electrode of the third transistor is electrically connected to the first wiring, the other of the source electrode and the drain electrode of the third transistor is electrically connected to one of a source electrode and a drain electrode of the fourth transistor and one terminal of the capacitor, and a gate electrode of the third transistor is electrically connected to the other terminal of the capacitor and the second wiring. The other of the source electrode and the drain electrode of the fourth transistor is electrically connected to the third wiring and a gate of the fourth transistor is electrically connected to the fourth wiring. A first potential and a second potential are alternately supplied to the first wiring. A third potential is supplied to the third wiring. The first potential is lower than the second potential. The third potential is lower than the second potential. A first signal is supplied to the fourth wiring. A second signal obtained by inverting the first signal is supplied to the second wiring. The third transistor is formed using the first and second transistors of the semiconductor device described above.

Another embodiment of the present invention is a display device including a fifth transistor, a sixth transistor, a seventh transistor, a light-emitting element, and fifth to seventh wirings. A gate electrode of the fifth transistor is electrically connected to the fifth wiring, one of a source electrode and a drain electrode of the fifth transistor is electrically connected to the sixth wiring, and the other of the source electrode and the drain electrode of the fifth transistor is electrically connected to one of a source electrode and a drain electrode of the sixth transistor and one electrode of the light-emitting element. A gate electrode of the sixth transistor is electrically connected to one of a source electrode and a drain electrode of the seventh transistor and the other of the source electrode and the drain electrode of the sixth transistor is electrically connected to the other of the source electrode and the drain electrode of the seventh transistor. A gate electrode of the seventh transistor is electrically connected to the seventh wiring. A third signal is supplied to the fifth wiring. A data signal is supplied to the sixth wiring. A fourth signal is supplied to the seventh wiring. The sixth transistor is formed using the first and second transistors of the semiconductor device described above.

According to one embodiment of the present invention, a transistor that can be miniaturized can be provided. A transistor with favorable electrical characteristics can be provided. A transistor having a small difference in characteristics before and after a source and a drain are interchanged can be provided. A transistor whose channel length can be shortened can be provided. A transistor that occupies a small area can be provided. A semiconductor device with reduced wiring resistance can be provided. A display device that can easily achieve higher resolution can be provided. A highly reliable transistor and a semiconductor device can be provided.

Note that the description of these effects does not preclude the existence of other effects. One embodiment of the present invention does not necessarily have all these effects. Effects other than these can be derived from the description of the specification, the drawings, the claims, and the like.

BRIEF DESCRIPTION OF THE DRAWINGS

In the accompanying drawings:

FIGS. 12A1 and 12B1 are circuit diagrams of a semiconductor device and FIGS. 12A2 and 12B2 are timing charts;

FIGS. 13A1 and 13B1 are circuit diagrams of a semiconductor device and FIGS. 13A2 and 13B2 are timing charts;

DETAILED DESCRIPTION OF THE INVENTION

Figure 1A:
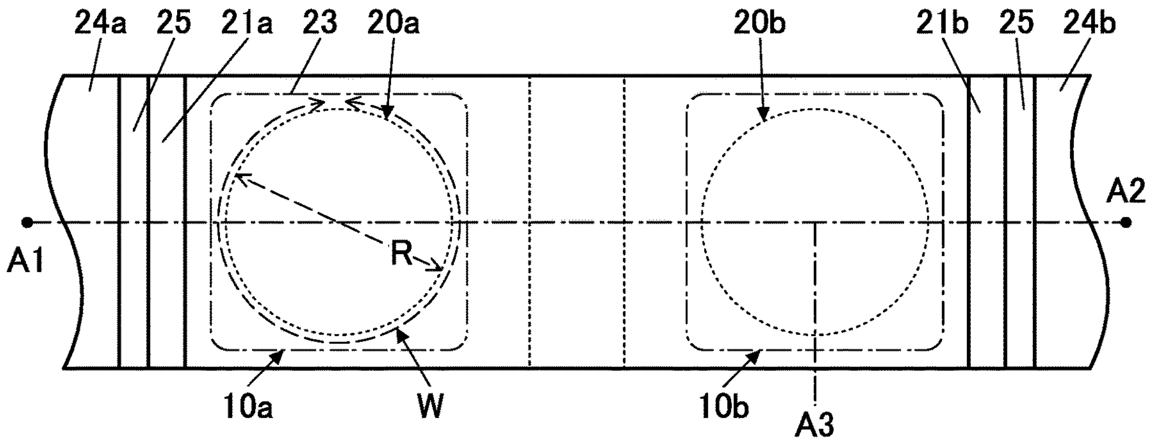
FIGS. 1A to 1D illustrate a structure example of a semiconductor device.

Embodiments will be described below with reference to the drawings. Note that the embodiments can be implemented with many different modes, and it will be readily understood by those skilled in the art that modes and details thereof can be changed in various ways without departing from the spirit and scope thereof. Therefore, the present invention should not be construed as being limited to the description of embodiments below.

Note that in structures of the invention described below, the same portions or portions having similar functions are denoted by the same reference numerals in different drawings, and the description thereof is not repeated. The same hatching pattern is used for portions having similar functions, and the portions are not denoted by specific reference numerals in some cases.

Note that in each drawing described in this specification, the size, the layer thickness, or the region of each component is exaggerated for clarity in some cases. Therefore, the size, the layer thickness, or the region is not limited to the illustrated scale.

Note that in this specification and the like, ordinal numbers such as "first" and "second" are used in order to avoid confusion among components and do not limit the number of components.

A transistor is a kind of semiconductor element and enables amplification of current or voltage, switching operation for controlling conduction or non-conduction, and the like. A transistor in this specification includes, in its category, an insulated-gate field effect transistor (IGFET) and a thin film transistor (TFT).

The functions of a "source" and a "drain" are sometimes replaced with each other when a transistor of opposite polarity is used or when the direction of current flow is changed in circuit operation, for example. Thus, the terms "source" and "drain" can be used interchangeably in this specification.

In this specification and the like, one of a source and a drain of a transistor is referred to as a "first electrode" and the other of the source and the drain is referred to as a "second electrode" in some cases. Note that a gate is also referred to as a "gate" or a "gate electrode".

In this specification and the like, the term "electrically connected" includes the case where components are connected through an "object having any electric function". There is no particular limitation on an "object having any electric function" as long as electric signals can be transmitted and received between components that are connected through the object. Examples of the "object having any electric function" are a switching element such as a transistor, a resistor, a coil, a capacitor, and an element with a variety of functions as well as an electrode and a wiring.

Note that in this specification and the like, the expression "having substantially the same top surface shapes" means that at least outlines of stacked layers partly overlap each other. For example, the case of patterning or partly patterning an upper layer and a lower layer with the use of the same mask pattern is included in the expression. The expression "having substantially the same top surface shapes" also sometimes includes the case where the outlines do not completely overlap with each other; for instance, the edge of the upper layer may be positioned on the inner side or the outer side of the edge of the lower layer.

Note that the expressions indicating directions such as "over" and "under" are basically used to correspond to the directions of drawings. However, in some cases, the term "over" or "under" in the specification indicates a direction that does not correspond to the apparent direction in the drawings, for the purpose of easy description or the like. For example, when a stacked order (formation order) of a stacked body or the like is described, even in the case where a surface on which the stacked body is provided (e.g., a formation surface, a support surface, a bonding surface, or a planarization surface) is positioned above the stacked body in the drawings, the direction and the opposite direction are referred to as "under" and "over", respectively, in some cases.

Embodiment 1

This embodiment describes structure examples of a transistor, which is an example of a semiconductor device of one embodiment of the present invention, and an example of a method for manufacturing the transistor.

The transistor of one embodiment of the present invention includes a semiconductor layer, a gate insulating layer, a gate electrode, a first electrode, and a second electrode. The first electrode functions as one of a source electrode and a drain electrode, and the second electrode functions as the other of the source electrode and the drain electrode.

The second electrode is provided above the first electrode. Between the first electrode and the second electrode, an insulating layer functioning as a spacer is provided. An opening reaching the first electrode is provided in the insulating layer, and the semiconductor layer is provided in contact with the first electrode, the second electrode, and a side wall (also referred to as a side surface) of the insulating layer in the opening. The gate insulating layer and the gate electrode are provided to cover the semiconductor layer. Note that the opening may be replaced with a groove (a slit).

Here, the first electrode and the second electrode may be provided independently from the semiconductor layer or part of the semiconductor layer may function as the first electrode or the second electrode.

In the transistor having the above structure, the source electrode and the drain electrode are positioned at different heights, so that current flows in the height direction in the semiconductor layer. In other words, the channel length direction includes a height (vertical) component, so that one embodiment of the present invention can also be referred to as a vertical transistor, a vertical channel transistor, or the like.

In the above transistor, the source electrode, the semiconductor layer, and the drain electrode can be provided to overlap with each other. Thus, the area occupied by the above transistor can be significantly smaller than that of a so-called planar transistor in which a semiconductor layer is provided over a flat surface.

Moreover, the channel length of the above transistor can be precisely adjusted by the thickness of the insulating layer; therefore, a variation in the channel length can be extremely smaller than that of a planar transistor. Furthermore, by reducing the thickness of an insulating layer, a transistor with an extremely short channel length can be manufactured. For example, it is possible to manufacture a transistor with a channel length of 2 μm or shorter, 1 μm or shorter, 500 nm or shorter, 300 nm or shorter, 200 nm or shorter, 100 nm or shorter, 50 nm or shorter, 30 nm or shorter, or 20 nm or shorter and nm or longer, 7 nm or longer, or 10 nm or longer. Therefore, it is possible to achieve a transistor with an extremely short channel length that could not be achieved with a conventional light-exposure apparatus for mass production of flat panel displays (the minimum line width: approximately 2 μm or approximately 1.5 μm, for example). Moreover, it is also possible to achieve a transistor with a channel length shorter than 10 nm without using an extremely expensive light-exposure apparatus used in the latest LSI technology.

A metal oxide having semiconductor characteristics (also referred to as an oxide semiconductor) is particularly preferable for the semiconductor layer because both high performance and high productivity can be achieved. In particular, an oxide semiconductor having crystallinity is further preferable because high reliability can be achieved.

Meanwhile, such a vertical transistor has a vertically asymmetrical shape, so that the electrical characteristics might somewhat change between the case where the first electrode and the second electrode respectively function as a source and a drain and the case where the first electrode and the second electrode respectively function as a drain and a source. In addition, since the gate electrode is formed over the insulating layer functioning as a spacer, the parasitic capacitance between the gate electrode and the second electrode is higher than that between the gate electrode and the first electrode. For these reasons, in the case of designing a circuit with use of a vertical transistor, considering the above asymmetry is important.

Note that some circuits may be driven so that a source and a drain of a transistor are interchanged with each other period by period. The above transistor having an asymmetrical shape is not preferable for such a circuit in some cases because the voltage-current characteristics differ between before and after the source and the drain are interchanged with each other.

In view of this, in one embodiment of the present invention, first electrodes or second electrodes of two vertical transistors are electrically connected to each other. Gate electrodes of the two vertical transistors are also electrically connected to each other to be one gate electrode shared by the two vertical transistors, whereby the two vertical transistors are connected in series. A pair of vertical transistors connected in series in such a manner can be regarded as one transistor in which the above-described problems due to asymmetry are suppressed.

Here, the two transistors can also be connected in series by connecting the first electrode of one transistor to the second electrode of the other transistor; however, such a structure cannot reduce a difference in characteristics between before and after the source and the drain are interchanged with each other. Therefore, in one embodiment of the present invention, connecting the first electrodes or the second electrodes is important for reducing a difference in characteristics between before and after the source and the drain are interchanged with each other.

With use of such a transistor, any circuit can be replaced with a circuit including a vertical transistor. Note that the number of connected transistors is not limited to 2 as long as it is an even number.

In addition, a structure in which 2× transistors (x is an integer greater than or equal to 1) are connected in series can reduce the asymmetry of the electrical characteristics and can also be regarded as one transistor with a channel length 2×times the channel length of one vertical transistor. Some circuits may require both a transistor with a short channel length and a transistor with a long channel length. With the above structure, it is possible to achieve a circuit including transistors with different channel lengths with use of vertical transistors obtained through the same manufacturing process, without differentiating the thickness of the insulating layer functioning as a spacer between the transistors.

More specific examples will be described below with reference to drawings.

Structure Example 1

Figure 1B:
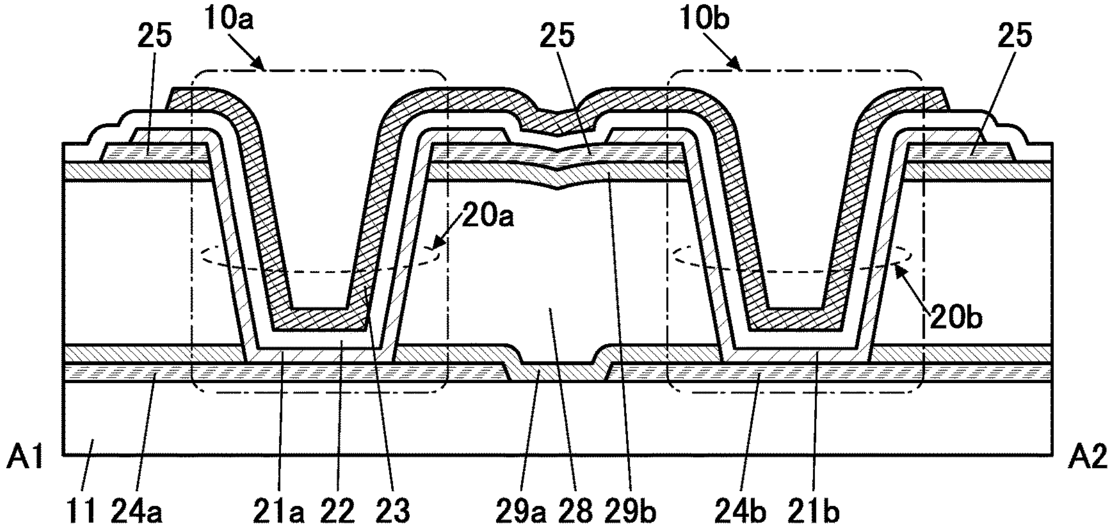
Figure 2:
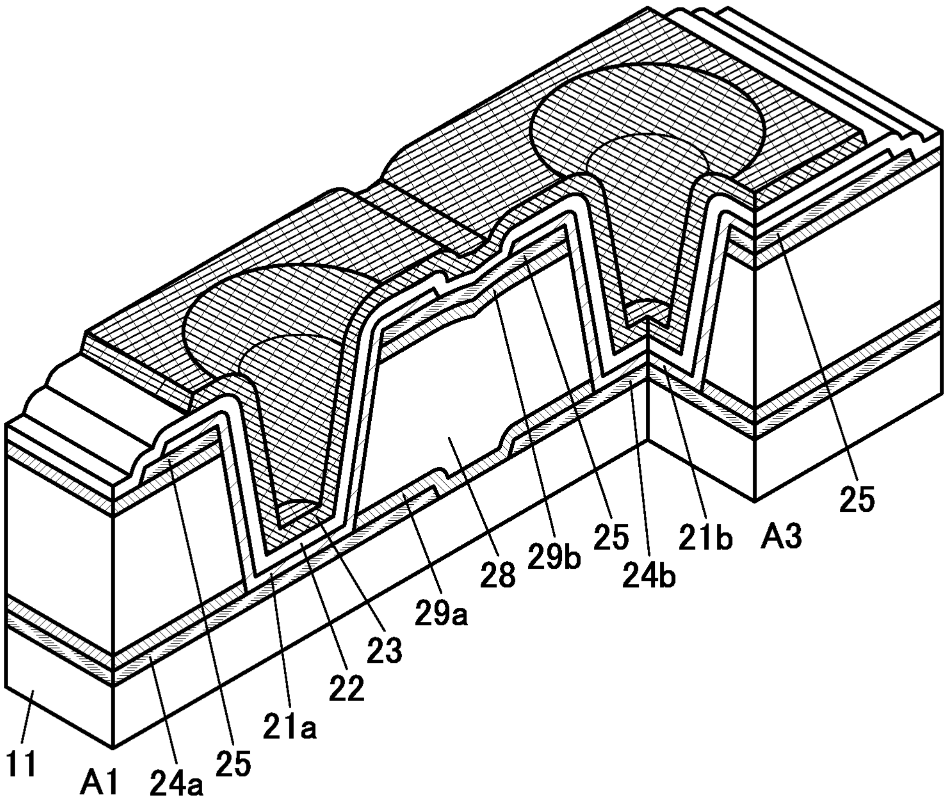
FIG. 2 illustrates a structure example of a semiconductor device.

FIG. 1A is a schematic top view of a semiconductor device including a transistor 10*a* and a transistor 10*b*. FIG. 1B is a schematic cross-sectional view taken along the cutting line A1-A2 in FIG. 1A. FIG. 2 is a schematic perspective view obtained by a cut along the cutting line A1 and A3 in FIG. 1A. For easy viewing, some components (e.g., an insulating layer) are not illustrated in the schematic top view.

The transistor 10*a* and the transistor 10*b* are manufactured through the same manufacturing process and have similar structures. The transistor 10*a* and the transistor 10*b* are preferably formed to be substantially plane-symmetry. Therefore, the transistor 10*a* and the transistor 10*b* have channel lengths substantially equal to each other and channel widths substantially equal to each other.

The transistor 10*a* is provided over the substrate 11 and includes a semiconductor layer 21*a*, an insulating layer 22, a conductive layer 23, a conductive layer 24*a*, and a conductive layer 25. The transistor 10*b* is also provided over the substrate and includes a semiconductor layer 21*b*, the insulating layer 22, the conductive layer 23, a conductive layer 24*b*, and the conductive layer 25.

The insulating layer 22 is shared by the two transistors, and one part of the insulating layer 22 functions as a gate insulating layer of the transistor 10*a* and another part of the insulating layer 22 functions as a gate insulating layer of the transistor 10*b*. The conductive layer 23 is also shared by the two transistors, and one part of the conductive layer 23 functions as a gate electrode of the transistor 10*a* and another part of the conductive layer 23 functions as a gate electrode of the transistor 10*b*. Part of the conductive layer 24*a* functions as one of a source electrode and a drain electrode of the transistor 10*a*, and part of the conductive layer 24*b* functions as one of a source electrode and a drain electrode of the transistor 10*b*. The conductive layer 25 is shared by the two transistors, and one part of the conductive layer 25 functions as the other of the source electrode and the drain electrode of the transistor 10*a*, and another part of the conductive layer 25 functions as the other of the source electrode and the drain electrode of the transistor 10*b*.

Figure 1C:
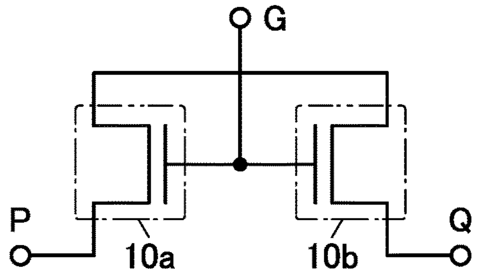

That is, it can be said that the transistor 10*a* and the transistor 10*b* are connected in series because they share the gate electrode and the other of the source electrode and the drain electrode of the transistor 10*a* is electrically connected to the other of the source electrode and the drain electrode of the transistor 10*b*. FIG. 1C illustrates an example of a circuit diagram corresponding to the transistor 10*a* and the transistor 10*b* connected in series. Note that P, Q, and G represent wirings corresponding to the conductive layer 24*a*, the conductive layer 24*b*, and the conductive layer 23, respectively.

Figure 1D:
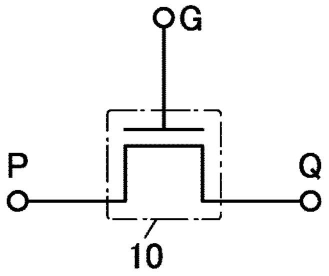

The two transistors connected in series as illustrated in FIG. 1C can be regarded as one transistor 10 as illustrated in FIG. 1D. In the case where the channel length and the channel width of each of the two transistors are respectively represented by L and W, the transistor 10 can be regarded to have a channel length of 2×L and a channel width of W.

Note that the transistor 10*a* and the transistor 10*b* have similar structures as described above, so that in the following description, in some cases, detailed description is made only on the structure of one of the transistors, which is also referred to for the structure of the other of the transistors; thus the detailed description of the other transistor structure is omitted. For example, in the following description, only the transistor 10*a* is described in detail and the transistor 10*b* is not described in detail in some cases. In such a case, the transistor 10*b* is considered on the assumption that the components of the transistor 10*a* such as the conductive layer 24*a* and the semiconductor layer 21*a* are replaced with the components of the transistor 10*b* such as the conductive layer 24*b* and the semiconductor layer 21*b*.

As illustrated in FIG. 1B and FIG. 2, the conductive layers 24*a* and 24*b* are provided over the substrate 11 and an insulating layer 29*a*, an insulating layer 28, and an insulating layer 29*b* are provided in this order to cover the conductive layers 24*a* and 24*b*. Moreover, the conductive layer 25 is provided over the insulating layer 29*b*. An opening 20*a* and an opening 20*b* respectively reaching the conductive layer 24*a* and the conductive layer 24*b* are provided in the conductive layer 25, the insulating layer 29*b*, the insulating layer 28, and the insulating layer 29*a*. For example, it can also be said that side walls (side surfaces) of the conductive layer 25, the insulating layer 29*b*, the insulating layer 28, and the insulating layer 29*a* in the opening 20*a* overlap with the conductive layer 24*a*.

The semiconductor layer 21*a* is in contact with a top surface of the conductive layer 24*a* positioned at the bottom of the opening 20*a*; the side surfaces of the conductive layer 25 and the insulating layers 29*a*, 28, and 29*b* in the opening 20*a*; and a top surface of the conductive layer 25. A portion of the semiconductor layer 21*a* that is in contact with the conductive layer 25 functions as one of a source region and a drain region, a portion of the semiconductor layer 21*a* that is in contact with the conductive layer 24 functions as the other of the source region and the drain region, and a region between these portions (in particular, a region in contact with the insulating layer 28) functions as a region where a channel is formed (a channel formation region). It is preferable that in the semiconductor layer 21*a*, a region in contact with the insulating layer 29*a* and a region in contact with the insulating layer 29*b* have a higher carrier concentration and a lower resistance than the channel formation region.

The insulating layer 22 functioning as a gate insulating layer is provided to cover the insulating layer 29*b*, the conductive layer 25, the semiconductor layer 21*a*, and the semiconductor layer 21*b*. In addition, the conductive layer 23 functioning as a gate electrode is provided to cover the insulating layer 22.

As described above, in the transistor 10*a*, the semiconductor layer 21*a* includes the portion that is in contact with the side surface of the insulating layer 28 and functions as a channel formation region. In the opening 20*a*, the insulating layer 22 includes a portion facing the side surface of the insulating layer 28 with the semiconductor layer 21*a* therebetween. The conductive layer 23 includes a portion facing the side surface of the insulating layer 28 with the semiconductor layer 21*a* and the insulating layer 22 therebetween. An interface between the semiconductor layer 21*a* and the insulating layer 22 and an interface between the insulating layer 22 and the conductive layer 23 each include a portion parallel to the side surface of the insulating layer 28.

Note that an insulating layer functioning as a planarization layer, an interlayer insulating layer, or a protective layer may be provided to cover the insulating layer 22 and the conductive layer 23. A conductive layer functioning as a wiring electrically connected to the conductive layers 24*a*, 24*b*, 25, and 23 and the like may be provided over the insulating layer. A pixel electrode, an organic layer, a common electrode, and the like constituting a light-emitting element may be provided over the insulating layer.

The semiconductor layers 21*a* and 21*b* preferably include a metal oxide (an oxide semiconductor).

Examples of a metal oxide that can be used for the semiconductor layers 21*a* and 21*b* include an In oxide, a Ga oxide, and a Zn oxide. The metal oxide preferably contains at least In or Zn. The metal oxide preferably contains two or three elements selected from In, an element M, and Zn. The element M is a metal element or metalloid element that has a high bonding energy with oxygen, such as a metal element or metalloid element whose bonding energy with oxygen is higher than that of In. Specific examples of the element M include Al, Ga, Sn, Y, Ti, V, Cr, Mn, Fe, Co, Ni, Zr, Mo, Hf, Ta, W, La, Ce, Nd, Mg, Ca, Sr, Ba, B, Si, Ge, and Sb. The element M contained in the metal oxide is preferably one or more kinds selected from the above elements. Specifically, the element M is preferably one or more kinds selected from Al, Ga, Y, and Sn, further preferably Ga. Hereinafter, a metal oxide containing In, the element M, and Zn is referred to as In-M-Zn oxide in some cases. In this specification and the like, a metal element and a metalloid element may be collectively referred to as a “metal element” and a “metal element” in this specification and the like may refer to a metalloid element.

When the metal oxide is In-M-Zn oxide, the proportion of the number of In atoms is preferably greater than or equal to that of the number of element M atoms in the In-M-Zn oxide. Examples of the atomic ratio of the metal elements of such In-M-Zn oxide include In:M:Zn=1:1:1, In:M:Zn=1:1:1.2, In:M:Zn=2:1:3, In:M:Zn=3:1:2, In:M:Zn=4:2:3, In:M:Zn=4:2:4.1, In:M:Zn=5:1:3, In:M:Zn=5:1:6, In:M:Zn=5:1:7, In:M:Zn=5:1:8, In:M:Zn=6:1:6, and In:M:Zn=5:2:5 and a composition in the vicinity of any of the above atomic ratios. Note that the vicinity of the atomic ratio includes ±30% of an intended atomic ratio. By increasing the proportion of the number of In atoms in the metal oxide, the on-state current, field-effect mobility, or the like of the transistor can be improved.

The proportion of the number of In atoms may be less than that of the number of element M atoms in the In-M-Zn oxide. Examples of the atomic ratio of the metal elements of such In-M-Zn oxide include In:M:Zn=1:3:2, In:M:Zn=1:3:3, and In:M:Zn=1:3:4 and a composition in the vicinity of any of the above atomic ratios. By increasing the proportion of the number of element M atoms in the metal oxide, generation of oxygen vacancies can be suppressed.

For the semiconductor layers 21*a* and 21*b*, for example, In—Zn oxide, In—Ga oxide, In—Sn oxide, In—Ti oxide, In—Ga—Al oxide, In—Ga—Sn oxide, In—Ga—Zn oxide, In—Sn—Zn oxide, In—Al—Zn oxide, In—Ti—Zn oxide, In—Ga—Sn—Zn oxide, or In—Ga—Al—Zn oxide can be used. Alternatively, Ga—Zn oxide may be used.

Note that the metal oxide may contain, instead of or in addition to In, one or more kinds selected from metal elements belonging to a period of a higher number in the periodic table. As the overlap between orbits of metal elements is larger, the metal oxide tends to have higher carrier conductivity. Thus, a transistor containing a metal element belonging to a period of a higher number in the periodic table can have high field-effect mobility in some cases. Examples of the metal element belonging to a period of a higher number in the periodic table include metal elements belonging to Period 5 and metal elements belonging to Period 6. Specific examples of the metal element include Y, Zr, Ag, Cd, Sn, Sb, Ba, Pb, Bi, La, Ce, Pr, Nd, Pm, Sm, and Eu. Note that La, Ce, Pr, Nd, Pm, Sm, and Eu are referred to as light rare earth elements.

The metal oxide may contain one or more kinds selected from nonmetallic elements. A transistor including the metal oxide containing a nonmetallic element can have high field-effect mobility in some cases. Examples of the nonmetallic element include carbon, nitrogen, phosphorus, sulfur, selenium, fluorine, chlorine, bromine, and hydrogen.

A sputtering method or an atomic layer deposition (ALD) method can be suitably used for forming the metal oxide. Note that in the case where the metal oxide is formed by a sputtering method, the atomic ratio of the deposited metal oxide may be different from the atomic ratio of a target. In particular, the zinc content of the deposited metal oxide may be reduced to approximately 50% of that of the target.

In this specification and the like, the content of a certain metal element in a metal oxide refers to the proportion of the number of atoms of the metal element to the total number of metal element atoms contained in the metal oxide. In the case where a metal oxide contains a metal element X, a metal element Y, and a metal element Z whose atomic numbers are respectively represented by $A_X$, $A_Y$, and $A_Z$, the content of the metal element X can be represented by $A_X/(A_X+A_Y+A_Z)$. Moreover, in the case where the atomic ratio of the metal element X to the metal element Y and the metal element Z contained in the metal oxide is represented by $B_X:B_Y:B_Z$, the content of the metal element X can be represented by $B_X/(B_X+B_Y+B_Z)$.

In the case of using a metal oxide containing In, for example, an increase in the In content enables a transistor to have a high on-state current.

When the semiconductor layer 21 includes a metal oxide not containing Ga or having a low Ga content, a transistor can have high reliability against positive bias application. That is, the transistor can show a small amount of change in the threshold voltage in the positive bias temperature stress (PBTS) test. In the case of using a metal oxide containing Ga, the Ga content is preferably lower than the In content. Accordingly, the transistor can have high mobility and high reliability.

Meanwhile, a transistor having a high Ga content can have high reliability against light. That is, the transistor can show a small amount of change in the threshold voltage of the transistor in the negative bias temperature illumination stress (NBTIS) test. Specifically, a metal oxide in which the proportion of the number of Ga atoms is greater than or equal to that of the number of In atoms has a wider band gap and can reduce the amount of change in the threshold voltage of the transistor in the NBTIS test.

Furthermore, a metal oxide having a high zinc content has high crystallinity whereby diffusion of impurities can be inhibited. Consequently, a change in electrical characteristics of the transistor is suppressed and the transistor can have high reliability.

The semiconductor layers 21*a* and 21*b* may each have a stacked-layer structure including two or more metal oxide layers. The two or more metal oxide layers included in each of the semiconductor layers 21*a* and 21*b* may have the same composition or substantially the same compositions. Employing a stacked-layer structure of metal oxide layers having the same composition can reduce the manufacturing cost because the metal oxide layers can be formed using the same sputtering target. Note that a stacked-layer structure including two or more metal oxide layers having different compositions may be employed.

It is preferable to use a metal oxide layer having crystallinity as each of the semiconductor layers 21*a* and 21*b*. For example, a metal oxide layer having a c-axis aligned crystal (CAAC) structure, a polycrystalline structure, a nano-crystal (nc) structure, or the like can be used. By using a metal oxide layer having crystallinity as each of the semiconductor layers 21*a* and 21*b*, the density of defect states in the semiconductor layers 21*a* and 21*b* can be reduced, which enables the semiconductor device to have high reliability.

As the crystallinity of the metal oxide layer used as each of the semiconductor layers 21*a* and 21*b* becomes higher, the density of defect states in the semiconductor layers 21*a* and 21*b* can be reduced. In contrast, the use of a metal oxide layer having low crystallinity enables a transistor to flow large current.

A transistor including an oxide semiconductor (hereinafter referred to as an OS transistor) has much higher field-effect mobility than a transistor including amorphous silicon. In addition, the OS transistor has an extremely low leakage current between a source and a drain in an off state (the leakage current is hereinafter also referred to as an off-state current), and charge accumulated in a capacitor that is connected in series to the transistor can be held for a long period. Furthermore, the power consumption of the semiconductor device can be reduced with the OS transistor.

The semiconductor device of one embodiment of the present invention can be used for a display device, for example. To increase the emission luminance of a light-emitting device included in a pixel circuit of a display device, it is necessary to increase the amount of current flowing through the light-emitting device. For this, it is necessary to increase the source-drain voltage of a driving transistor included in the pixel circuit. Since an OS transistor has a higher withstand voltage between the source and the drain than a transistor including silicon (hereinafter referred to as a Si transistor), a high voltage can be applied between the source and the drain of the OS transistor. Thus, with the use of an OS transistor as a driving transistor included in the pixel circuit, the amount of current flowing through the light-emitting device can be increased, resulting in an increase in emission luminance of the light-emitting device.

When transistors operate in a saturation region, a change in source-drain current relative to a change in gate-source voltage can be smaller in an OS transistor than in a Si transistor. Accordingly, when an OS transistor is used as the driving transistor included in the pixel circuit, the amount of current flowing through the light-emitting device can be precisely controlled. Accordingly, the gray level in the pixel circuit can be increased. Moreover, a stable current can flow through the light-emitting device even when the electrical characteristics (e.g., resistance) of the light-emitting device change or the electrical characteristics of the light-emitting devices vary.

As described above, with use of an OS transistor as a driving transistor included in the pixel circuit, it is possible to achieve "inhibition of black floating", "increase in emission luminance", "increase in gray level", "reduction in influence of variation in light-emitting devices", and the like.

A change in electrical characteristics of an OS transistor due to irradiation with radiation is small, i.e., an OS transistor has high resistance to radiation; thus, an OS transistor can be suitably used even in an environment where radiation can enter. It can also be said that an OS transistor has high reliability against radiation. For example, an OS transistor can be suitably used for a pixel circuit of an X-ray flat panel detector. Moreover, an OS transistor can be suitably used for a semiconductor device used in space. Examples of radiation include electromagnetic radiation (e.g., X-rays and gamma rays) and particle radiation (e.g., alpha rays, beta rays, a proton beam, and a neutron beam).

Note that a semiconductor material that can be used for the semiconductor layers 21*a* and 21*b* is not limited to an oxide semiconductor. For example, a single-element semiconductor or a compound semiconductor can be used. Examples of the single-element semiconductor include silicon (such as single crystal silicon, polycrystalline silicon, microcrystalline silicon, and amorphous silicon) and germanium. Examples of the compound semiconductor include gallium arsenide and silicon germanium. Examples of the compound semiconductor include an organic semiconductor, a nitride semiconductor, and an oxide semiconductor. These semiconductor materials may contain impurities as dopants.

Alternatively, the semiconductor layers 21*a* and 21*b* may include a layered material functioning as a semiconductor. The layered material generally refers to a group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, high two-dimensional electrical conductivity. When a material that functions as a semiconductor and has high two-dimensional electrical conductivity is used for a channel formation region, the transistor can have a high on-state current.

Examples of the layered material include graphene, silicene, and chalcogenide. Chalcogenide is a compound containing chalcogen (an element belonging to Group 16). Examples of chalcogenide include transition metal chalcogenide and chalcogenide of Group 13 elements. Specific examples of the transition metal chalcogenide which can be used for a semiconductor layer of a transistor include molybdenum sulfide (typically $MoS_2$), molybdenum selenide (typically $MoSe_2$), molybdenum telluride (typically $MoTe_2$), tungsten sulfide (typically $WS_2$), tungsten selenide (typically $WSe_2$), tungsten telluride (typically $WTe_2$), hafnium sulfide (typically $HfS_2$), hafnium selenide (typically $HfSe_2$), zirconium sulfide (typically $ZrS_2$), and zirconium selenide (typically $ZrSe_2$).

There is no particular limitation on the crystallinity of a semiconductor material used for the semiconductor layers 21*a* and 21*b*, and any of an amorphous semiconductor, a single crystal semiconductor, and a semiconductor having other crystallinity than single crystal (a polycrystalline semiconductor, a microcrystalline semiconductor, or a semiconductor partly including crystal regions) may be used. It is preferable to use a semiconductor having crystallinity, in which case deterioration of the transistor characteristics can be suppressed.

The top surface of the conductive layer 24*a*, a top surface of the conductive layer 24*b*, and the top surface of the conductive layer 25 are each in contact with the semiconductor layer 21*a* and/or the semiconductor layer 21*b*. Here, when the semiconductor layers 21*a* and 21*b* are formed using an oxide semiconductor and the conductive layer 24*a*, 24*b*, or 25 is formed using, for example, a metal that is likely to be oxidized such as aluminum, an insulating oxide (e.g., aluminum oxide) is formed between the conductive layer and the semiconductor layer, which might inhibit continuity between the conductive layer and the semiconductor layer. Therefore, the conductive layers 24*a*, 24*b*, and 25 are preferably formed using a conductive material that is less likely to be oxidized, a conductive material that maintains low electric resistance even when oxidized, or an oxide conductive material.

For the conductive layers 24*a*, 24*b*, and 25, for example, tantalum nitride, titanium nitride, a nitride containing titanium and aluminum, a nitride containing tantalum and aluminum, ruthenium, ruthenium oxide, ruthenium nitride, an oxide containing strontium and ruthenium, or an oxide containing lanthanum and nickel is preferably used. These materials are preferable because they are conductive materials that are less likely to be oxidized or materials that maintain the conductivity even when oxidized.

Alternatively, a conductive oxide such as indium oxide, zinc oxide, In—Sn oxide, In—Zn oxide, In—W oxide, In—W—Zn oxide, In—Ti oxide, In—Ti—Sn oxide, In—Sn oxide containing silicon, or zinc oxide to which gallium is added can be used. A conductive oxide containing indium is particularly preferable because of its high conductivity.

The insulating layer 22 functions as a gate insulating layer. In the case where the semiconductor layers 21*a* and 21*b* are formed using an oxide semiconductor, an oxide insulating film is preferably used for at least portions of the insulating layer 22 that are in contact with the semiconductor layers 21*a* and 21*b*. For example, one or more of silicon oxide, silicon oxynitride, aluminum oxide, aluminum oxynitride, hafnium oxide, hafnium oxynitride, gallium oxide, gallium oxynitride, yttrium oxide, yttrium oxynitride, and Ga—Zn oxide can be used. In addition, as the insulating layer 22, a nitride insulating film of silicon nitride, silicon nitride oxide, aluminum nitride, or aluminum nitride oxide can also be used. The insulating layer 22 may have a stacked-layer structure, e.g., a stacked-layer structure including at least one oxide insulating film and at least one nitride insulating film.

Note that in this specification and the like, oxynitride refers to a material that contains more oxygen than nitrogen. Nitride oxide refers to a material that contains more nitrogen than oxygen.

The conductive layer 23 functions as a gate electrode and can be formed using a variety of conductive materials. The conductive layer 23 can be formed using one or more of chromium, copper, aluminum, gold, silver, zinc, molybdenum, tantalum, titanium, tungsten, manganese, nickel, iron, cobalt, and niobium or an alloy including one or more of these metal elements as its component, for example. For the conductive layer 23, the nitride and the oxide that can be used for the conductive layers 24*a*, 24*b*, and 25 may be used.

The insulating layer 28 includes portions in contact with the semiconductor layers 21*a* and 21*b*. In the case where the semiconductor layers 21a and 21b are formed using an oxide semiconductor, an oxide is preferably used for at least the portions of the insulating layer 28 that are in contact with the semiconductor layers 21a and 21b in order to improve the properties of the interface between the insulating layer 28 and the semiconductor layer 21a and the properties of the interface between the insulating layer 28 and the semiconductor layer 21b. For example, silicon oxide or silicon oxynitride can be suitably used.

As the insulating layer 28, it is further preferable to use a film from which oxygen is released by heating. Accordingly, oxygen can be supplied to the semiconductor layers 21a and 21b owing to heat applied during the manufacturing process of the transistors 10a and 10b, the amount of oxygen vacancy in the semiconductor layers 21a and 21b can be reduced, and reliability can be improved. Examples of a method for supplying oxygen to the insulating layer 28 include heat treatment in an oxygen atmosphere and plasma treatment in an oxygen atmosphere. Alternatively, an oxide film may be deposited over a top surface of the insulating layer by a sputtering method in an oxygen atmosphere to supply oxygen. After that, the oxide film may be removed.

The insulating layer 28 is preferably formed by a deposition method such as a sputtering method or a plasma-enhanced chemical vapor deposition (PECVD) method. In particular, when a deposition gas not containing a hydrogen gas is used in a sputtering method, a film having an extremely low hydrogen content can be deposited. Therefore, supply of hydrogen to the semiconductor layers 21a and 21b is inhibited and the electrical characteristics of the transistors 10a and 10b can be stabilized.

As the insulating layers 29a and 29b, films in which oxygen is less likely to be diffused are preferably used. Accordingly, it is possible to prevent oxygen contained in the insulating layer 28 from being diffused toward the substrate 11 side and the insulating layer 22 side through the insulating layer 29b and the insulating layer 29b, respectively, due to heating. In other words, when the insulating layers 29a and 29b in which oxygen is less likely to be diffused are respectively provided above and below the insulating layer 28 so that the insulating layer 28 is sandwiched therebetween, oxygen can be enclosed in the insulating layer 28. Accordingly, oxygen can be effectively supplied to the semiconductor layers 21a and 21b.

For the insulating layers 29a and 29b, for example, one or more of silicon nitride, silicon nitride oxide, silicon oxynitride, aluminum oxide, aluminum oxynitride, aluminum nitride, hafnium oxide, and hafnium aluminate can be used. Silicon nitride and silicon nitride oxide are particularly suitable for the insulating layers 29a and 29b because they release fewer impurities (e.g., water and hydrogen) and are less likely to transmit oxygen and hydrogen.

Figure 3:
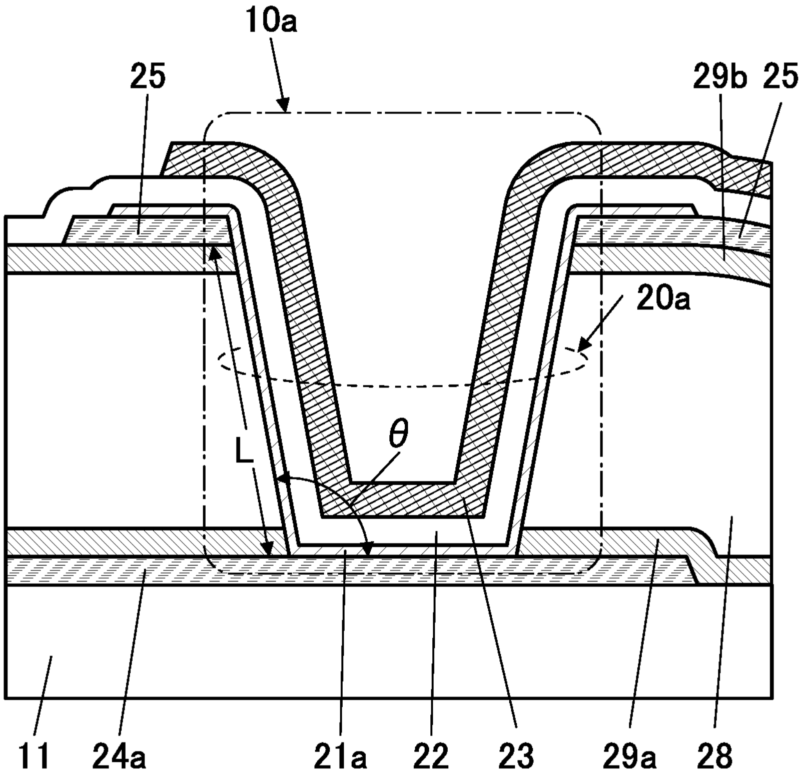
FIG. 3 illustrates a structure example of a semiconductor device.

FIG. 3 is an enlarged view of a cross section of the transistor 10a.

In this specification and the like, the channel length L of the transistor 10a refers to the shortest distance between a portion of the semiconductor layer 21a in contact with the conductive layer 24a and a portion of the semiconductor layer 21a in contact with the conductive layer 25 as illustrated in FIG. 3. As the slopes of the side surfaces of the insulating layers 29a, 28, and 29b in the opening 20a are close to perpendicular to the substrate surface, the channel length L is shorter.

The channel width W of the transistor 10a is equal to the perimeter of the opening 20a. When the top surface shape of the opening 20a is a circular shape having a diameter R as illustrated in FIG. 1A, the channel width W of the transistor 10a is equal to the circumference of the opening 20a, i.e., the channel width W is $n \times R$. When the top surface shape of the opening 20a is a circular shape, the channel width W of the transistor can be the smallest.

Actually, the diameter of the opening 20a changes with depth in many cases. In this case, the average value of the diameters at three points corresponding to the highest, lowest, halfway points at the insulating layer 28 in a cross-sectional view can be used as the diameter of the opening 20a. Without being limited to the above, the diameter of the opening 20a may be any of the diameters at the three points corresponding to the highest, lowest, halfway points at the insulating layer 28.

FIG. 3 illustrates an example where in the opening 20a, the side surfaces of the insulating layers 28, 29a, and 29b are inclined upward, i.e., the side surfaces have so-called tapered shapes. Here, when the angle between the side surface of the insulating layer 28 in the opening 20a and the top surface of the insulating layer 24a at the bottom of the opening 20a is denoted by an angle θ, it is preferable that the angle θ have a portion greater than or equal to 90° and less than or equal to 135°, preferably less than or equal to 125°, further preferably less than or equal to 120°, still further preferably less than or equal to 110°. As the angle θ is closer to 90°, i.e., the slope of the side surface of the insulating layer 28 is close to perpendicular to the substrate surface, the area occupied by the transistor 10a can be reduced. Note that in the case where a stack of the semiconductor layer 21a, the insulating layer 22, and the conductive layer 23 can cover the side surface of the insulating layer 28, the angle θ may be less than 90°.

The semiconductor layers 21a and 21b are deposited along the side surfaces of the insulating layers 29a, 28, and 29b in the opening. At this time, if film deposition is performed by a deposition method such as a sputtering method or a plasma CVD method, a film deposited on a surface inclined with respect to the substrate surface or a surface perpendicular to the substrate surface tends to be thinner than a film deposited on a surface horizontal to the substrate surface. Thus, when the semiconductor layers 21a and 21b are formed by a sputtering method, portions in contact with the insulating layer 28 may be thinner than portions in contact with the top surface of the conductive layer 24a and portions in contact with the top surface of the conductive layer 25.

In a manner similar to the above, the insulating layer 22 and the conductive layer 23 may be deposited so that portions deposited along the side surface of the insulating layer 28 or the like in the opening are thinner than portions formed over the top surfaces of the conductive layers 24a and 25.

Meanwhile, a film deposited by an ALD method or the like can have a uniform thickness regardless of the tilt angle of a formation surface, so that thickness variation hardly occurs in the semiconductor layer 21a, the semiconductor layer 21b, the insulating layer 22, the conductive layer 23, and the like.

As described above, when one transistor 10a is focused on, the side surface of the insulating layer 28 or the like in the opening 20a is inclined, so that the channel width W is smaller in a position closer to the conductive layer 24a and is larger in a position closer to the conductive layer 25 in fact. A capacitor is formed in a portion where the conductive layer 23 and the conductive layer 25 overlap with each other with the insulating layer 22 therebetween. Due to such a vertically asymmetrical shape, the electrical characteristics such as voltage-current characteristics, a subthreshold value, threshold voltage, field-effect mobility, and frequency dependence do not perfectly match before and after the source and the drain of the transistor 10 are interchanged with each other. However, in one embodiment of the present invention, an even number of transistors are connected in series as described above, which can reduce a difference in the electrical characteristics between before and after the source and the drain are interchanged with each other.

Structure Example 2

A structure example partly different from Structure example 1 described above will be described below. Note that portions similar to those in Structure example 1 described above are not described below in some cases.

Figure 4A:
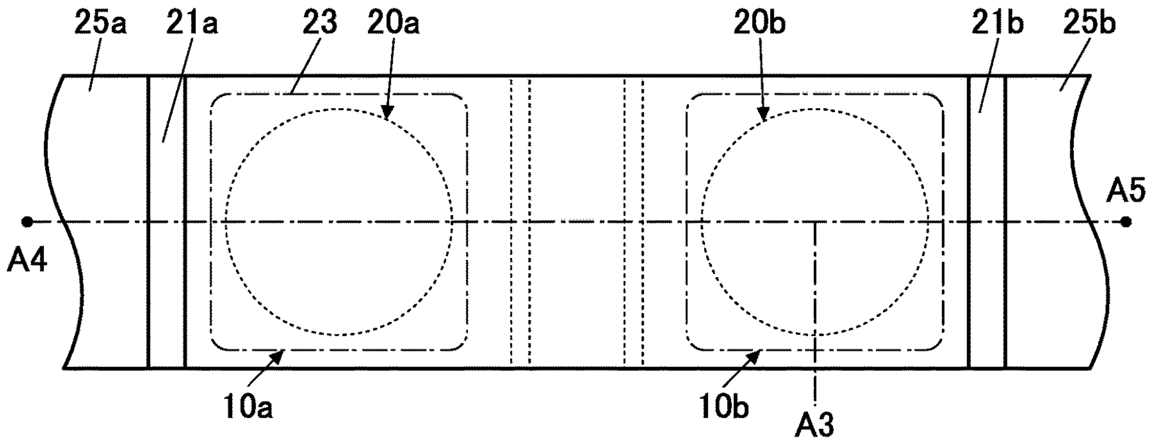
FIGS. 4A to 4D illustrate a structure example of a semiconductor device.
Figure 4B:
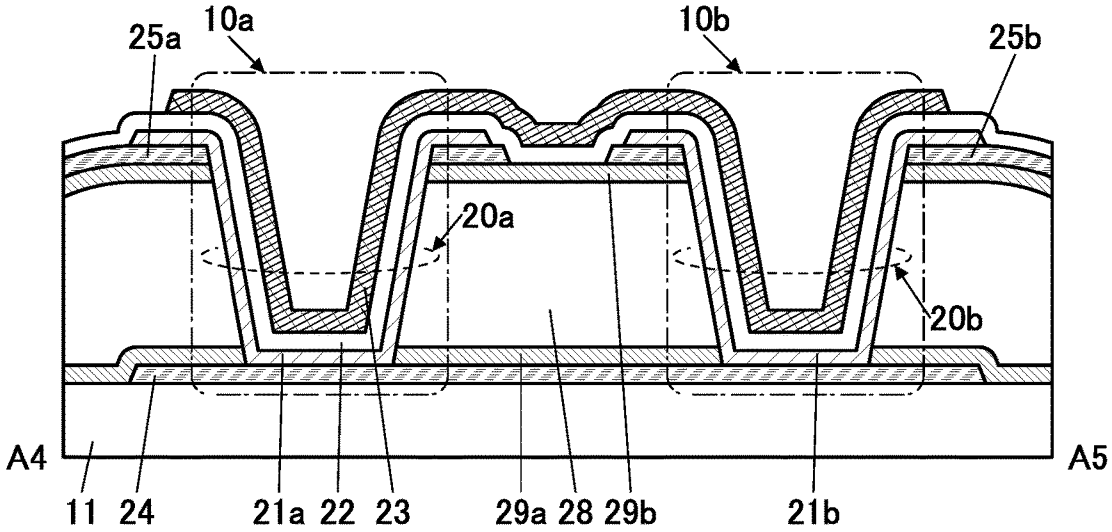

FIG. 4A is a schematic top view of a semiconductor device and FIG. 4B is a schematic cross-sectional view taken along the cutting line A4-A5 in FIG. 4A.

In Structure example 1 described above, the example is described where two transistors are connected in series through the conductive layer (the conductive layer 25) positioned above the insulating layer 28. This structure example describes a structure in which two transistors are connected in series through a conductive layer 24 positioned below the insulating layer 28.

The conductive layer 24 is shared by the transistors 10*a* and 10*b*, and one part of the conductive layer 24 functions as one of the source electrode and the drain electrode of the transistor 10*a*, and another part of the conductive layer 24 functions as one of the source electrode and the drain electrode of the transistor 10*b*. For the conductive layer 24, a material similar to that used for the conductive layers 24*a* and 24*b* in Structure example 1 can be used.

The conductive layer 25*a* functions as the other of the source electrode and the drain electrode of the transistor 10*a*. The conductive layer 25*b* functions as the other of the source electrode and the drain electrode of the transistor 10*b*. For the conductive layers 25*a* and 25*b*, a material similar to that used for the conductive layer 25 in Structure example 1 can be used.

Figure 4C:
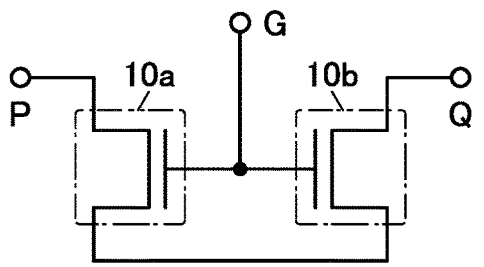
Figure 4D:
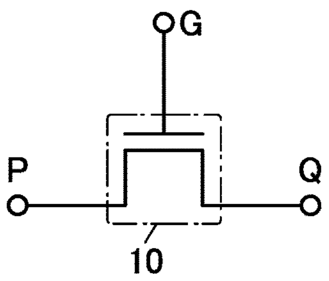

FIG. 4C is a circuit diagram corresponding to the transistor 10*a* and the transistor 10*b* connected in series. Such a structure can be regarded as one transistor 10 as illustrated in FIG. 4D.

Structure example 1 is an example where the wiring P and the wiring Q are positioned below the insulating layer 28, and Structure example 2 is an example where the wiring P and the wiring Q are positioned above the insulating layer 28. Structure example 1 and Structure example 2 can be separately formed over the same substrate through the same manufacturing process only by changing the top surface shape of the conductive layer, so that the semiconductor device of one embodiment of the present invention can include both of the structures. Both Structure example 1 and Structure example 2 can be separately formed in accordance with the design; for example, Structure example 1 is employed when the wirings P and Q for connecting the transistors 10*a* and 10*b* are desired to be placed below the insulating layer 28 and Structure example 2 is employed when the wirings P and Q are desired to be placed above the insulating layer 28.

Structure Example 3

A structure example some components of which are different from those of Structure example 1 and Structure example 2 described above will be described below.

Structure Example 3-1

Figure 5A:
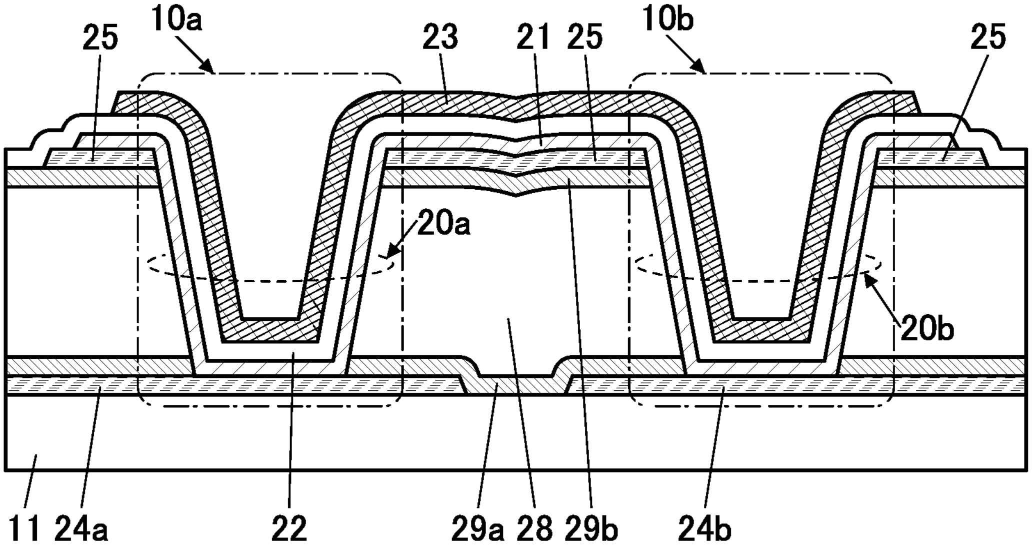
FIGS. 5A and 5B illustrate structure examples of a semiconductor device.

FIG. 5A is different from Structure example 1 mainly in the structure of a semiconductor layer. In FIG. 5A, the transistor 10*a* and the transistor 10*b* share one semiconductor layer 21. Thus, one part of the semiconductor layer 21 functions as a semiconductor layer where a channel of the transistor 10*a* is formed, and another part of the semiconductor layer 21 functions as a semiconductor layer of the transistor 10*b*.

In a region between the transistor 10*a* and the transistor 10*b*, the conductive layer 25, the semiconductor layer 21, the insulating layer 22, and the conductive layer 23 are stacked in this order over the insulating layer 28. This portion functions as a capacitor including the insulating layer 22 as a dielectric.

In the structure exemplified in FIG. 1B or the like, a space is provided between the semiconductor layers 21*a* and 21*b* to separate them; however, in the structure illustrated in FIG. 5A, there is no need to separately form two semiconductor layers and thus the space is unnecessary. Therefore, the distance between the transistor 10*a* and the transistor 10*b* can be shortened, and the area occupied by the transistor 10*a* and the transistor 10*b* can be reduced.

Structure Example 3-2

Figure 5B:
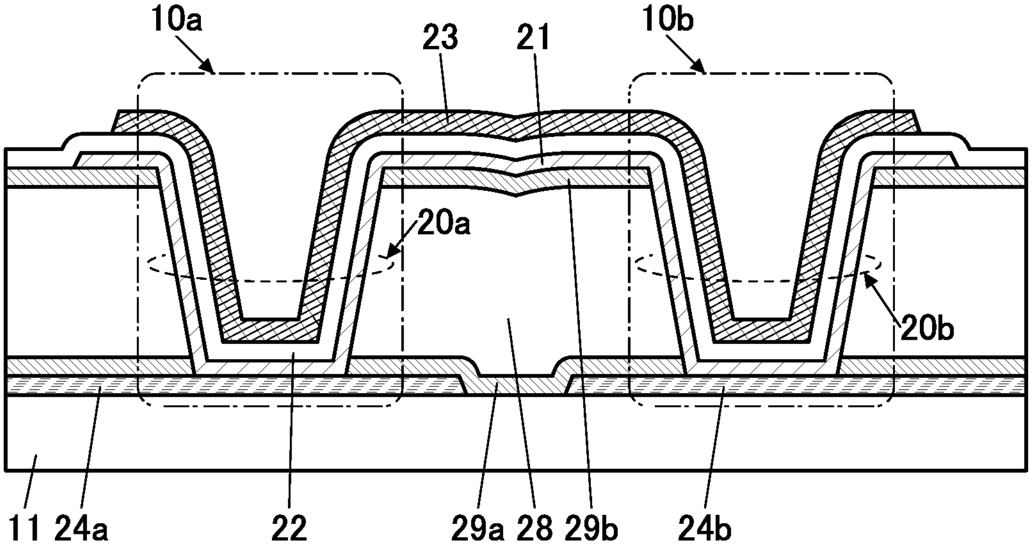

FIG. 5B illustrates an example where the conductive layer 25 is omitted in Structure example 3-1 described above.

A portion of the semiconductor layer 21 that is positioned over the insulating layer 29*b* preferably has a higher carrier concentration and a lower resistance than a portion in contact with the side surface of the insulating layer 28. With this structure, the portion of the semiconductor layer 21 that is positioned over the insulating layer 29*b* can be used as a wiring.

When the conductive layer 23 functioning as a gate is supplied with a potential for turning on the transistors 10*a* and 10*b*, a channel can be formed also in the portion of the semiconductor layer 21 that is positioned over the insulating layer 29*b*. Thus, the portion of the semiconductor layer 21 that is positioned over the insulating layer 29*b* has a low resistance when the transistors 10*a* and 10*b* are in an on state and has a high resistance when the transistors 10*a* and 10*b* are in an off state. As described above, the resistance of the portion of the semiconductor layer 21 that is positioned over the insulating layer 29*b* changes in accordance with the operation of the transistors 10*a* and 10*b*, so that the transistors 10*a* and 10*b* can operate without problems even when the conductive layer 25 is omitted. Such a structure is particularly preferable when the distance between the transistors 10*a* and 10*b* is sufficiently short.

Structure Example 3-3

As described above, in the conductive layer in contact with the semiconductor layer (e.g., the conductive layer 24 and the conductive layer 25), a surface in contact with the semiconductor layer might be oxidized. Thus, such a conductive layer is preferably formed using a conductive material that is less likely to be oxidized, a conductive material that maintains low electric resistance even when oxidized, or an oxide conductive material. However, in the case of using such a material, a sufficient reduction in electric resistance might be difficult. Therefore, it is preferable to provide a low-resistance conductive layer in contact with the conductive layer 24, the conductive layer 25, or the like for supporting conductivity.

Figure 6A:
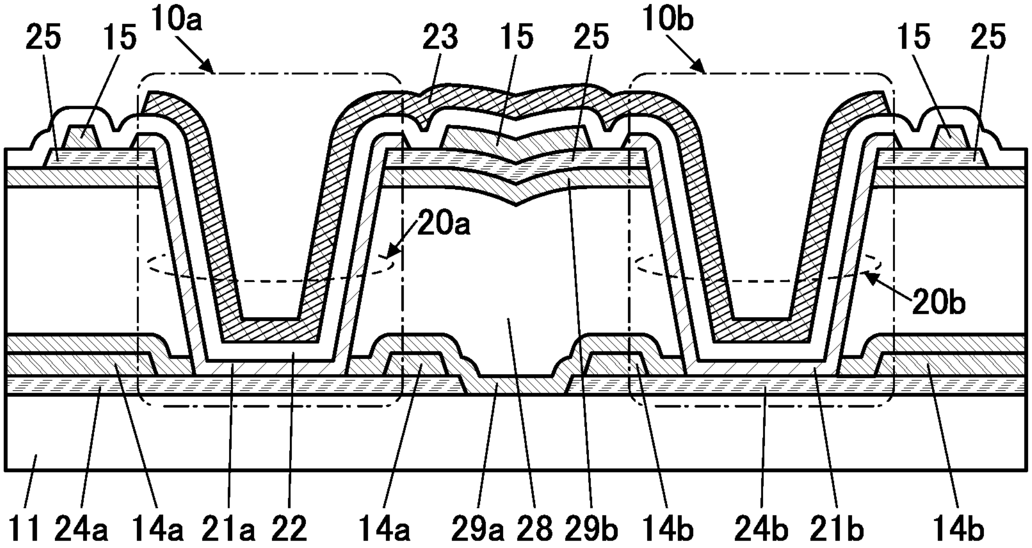
FIGS. 6A and 6B illustrate structure examples of a semiconductor device.

FIG. 6A illustrates an example where a conductive layer 14*a*, a conductive layer 14*b*, and a conductive layer 15 are added to the structure exemplified in FIG. 1B.

The conductive layers 14*a*, 14*b*, and 15 are provided in contact with the conductive layers 24*a*, 24*b*, and 25, respectively.

For the conductive layers 14*a*, 14*b*, and 15, a material having a lower electrical resistivity than at least the conductive layers 25 and 24*a* is preferably used. For example, a metal or an alloy is preferably used. Moreover, the conductive layers 14*a* and 14*b* are preferably thicker than the conductive layers 24*a* and 24*b*. The conductive layer 15 is preferably thicker than the conductive layer 25.

For the conductive layers 14*a*, 14*b*, and 15, a conductive material that can be used for the conductive layer 23 can be used.

Although the example is described here where the conductive layers 14*a* and 14*b* are in contact with the top surfaces of the conductive layers 24*a* and 24*b*, respectively, the conductive layers 14*a* and 14*b* may be in contact with bottom surfaces of the conductive layers 24*a* and 24*b*, respectively. Similarly, the conductive layer 15 may be provided in contact with a bottom surface of the conductive layer 25.

Figure 6B:
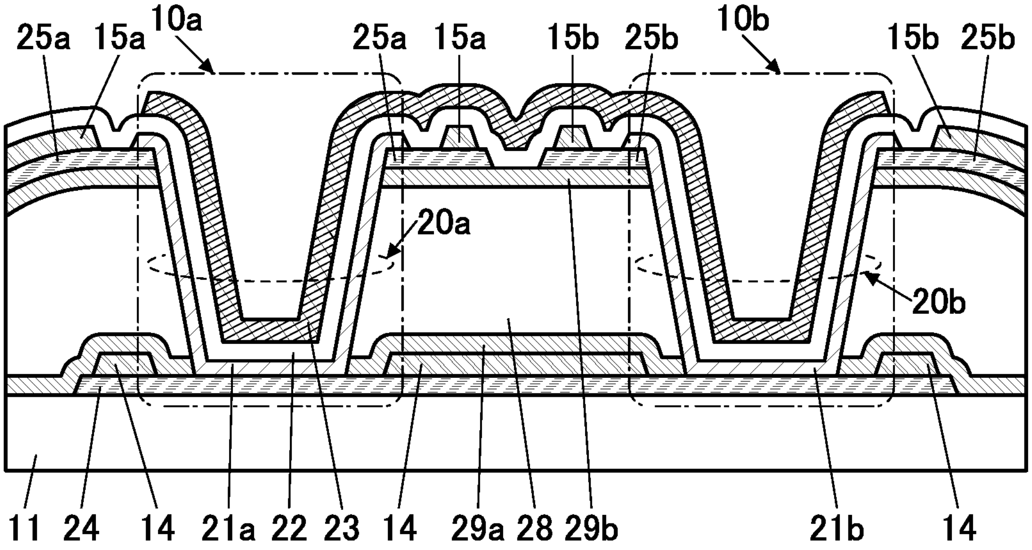

FIG. 6B shows an example where a conductive layer 14, a conductive layer 15*a*, and a conductive layer 15*b* are added to the structure exemplified in FIG. 4B. The conductive layers 14, 15*a*, and 15*b* are provided in contact with the conductive layers 24, 25*a*, and 25*b*, respectively.

The above is the description of Structure example 3.

Note that although the openings 20*a* and 20*b* have a circular shape in the above, there is no limitation and a variety of shapes can be employed. Besides the circular shape, for example, an elliptical shape or a quadrangular shape with rounded corners can be employed. Alternatively, a regular polygonal shape such as a regular triangular shape, a square shape, or a regular pentagonal shape or a polygonal shape other than the regular polygonal shape may be employed. By employing a depressed polygonal shape in which at least one interior angle is greater than 180°, such as a star polygonal shape, the channel width can be increased.

In a photolithography method, as a pattern to be formed by processing becomes finer, the influence of light diffraction becomes more difficult to ignore; therefore, the fidelity in transferring a photomask pattern by light exposure is degraded, and it becomes difficult to process a resist mask into a desired shape. Thus, a pattern with rounded corners is likely to be formed even with a rectangular photomask pattern. Consequently, a top surface of a light-emitting element may have a polygonal shape with rounded corners, an elliptical shape, a circular shape, or the like. In view of this, a technique of correcting a mask pattern in advance so that a transferred pattern agrees with a design pattern (an optical proximity correction (OPC) technique) may be used. Specifically, with the OPC technique, a pattern for correction is added to a corner portion or the like of a figure on a mask pattern.

The above is the description of the structure examples of the semiconductor device.

Manufacturing Method Example

An example of a method for manufacturing a transistor of one embodiment of the present invention will be described below. Here, description is made using the transistors 10*a* and 10*b* shown in Structure example 1 described above as an example.

Note that the thin films included in the semiconductor device (e.g., the insulating films, the semiconductor films, and the conductive films) can be formed by a sputtering method, a chemical vapor deposition (CVD) method, a vacuum evaporation method, a pulsed laser deposition (PLD) method, an ALD method, or the like. Examples of the CVD method include a PECVD method and a thermal CVD method. An example of a thermal CVD method is a metal organic CVD (MOCVD) method.

Alternatively, the thin films (e.g., the insulating films, the semiconductor films, and the conductive films) included in the semiconductor device can be formed by a method such as spin coating, dipping, spray coating, inkjet printing, dispensing, screen printing, or offset printing or with a doctor knife, a slit coater, a roll coater, a curtain coater, or a knife coater.

To process thin films included in the semiconductor device, a photolithography method or the like can be employed. Besides, a nanoimprinting method, a sandblasting method, a lift-off method, or the like may be employed to process thin films. Alternatively, island-shaped thin films may be directly formed by a deposition method using a shielding mask such as a metal mask.

There are two typical examples of photolithography methods. In one of the methods, a resist mask is formed over a thin film that is to be processed, the thin film is processed by etching or the like, and then the resist mask is removed. In the other method, a photosensitive thin film is formed and then processed into a desired shape by light exposure and development.

As light for exposure in a photolithography method, it is possible to use light with the i-line (wavelength: 365 nm), light with the g-line (wavelength: 436 nm), light with the h-line (wavelength: 405 nm), or light in which the i-line, the g-line, and the h-line are mixed. Alternatively, ultraviolet light, KrF laser light, ArF laser light, or the like can be used. Exposure may be performed by liquid immersion exposure technique. As the light for exposure, extreme ultraviolet (EUV) light or X-rays may also be used. Instead of the light for exposure, an electron beam can be used. It is preferable to use EUV, X-rays, or an electron beam because extremely minute processing can be performed. Note that a photomask is not needed when light exposure is performed by scanning with a beam such as an electron beam.

For etching of thin films, a dry etching method, a wet etching method, a sandblast method, or the like can be used.

FIGS. 7A to 7F are perspective views of steps in a manufacturing method of a semiconductor device described below.

[Preparation for Substrate 11]

First, the substrate 11 is prepared.

As the substrate, a substrate that has heat resistance high enough to withstand at least heat treatment performed later can be used. When an insulating substrate is used as the substrate, a glass substrate, a quartz substrate, a sapphire substrate, a ceramic substrate, an organic resin substrate, or the like can be used. Alternatively, it is possible to use a semiconductor substrate such as a single crystal semiconductor substrate or a polycrystalline semiconductor substrate of silicon, silicon carbide, or the like; a compound semiconductor substrate of silicon germanium, gallium nitride, or the like; or an SOI substrate.

[Formation of Conductive Layer 24*a* and Conductive Layer 24*b*]

Figure 7A:
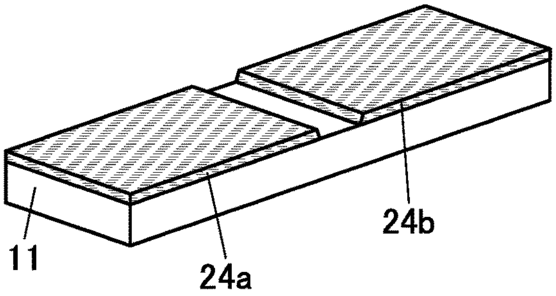
FIGS. 7A to 7F show an example of a method for manufacturing a semiconductor device.

Next, a conductive film is deposited over the substrate 11, a resist mask is formed over the conductive film, and an unnecessary portion of the conductive film is removed by etching, whereby the conductive layers 24*a* and 24*b* are formed (FIG. 7A).

The conductive film to be the conductive layers 24*a* and 24*b* can be deposited by a deposition method such as a sputtering method, a CVD method, or an ALD method.

[Formation of Insulating Layer 29*a*, Insulating Layer 28, and Insulating Layer 29*b*]

Next, the insulating layer 29*a*, the insulating layer 28, and the insulating layer 29*b* are formed in this order to cover the conductive layers 24*a* and 24*b*.

Insulating films used for the insulating layers 29*a* and 29*b* preferably have compositions or constituent elements different from that of an insulating film used for the insulating layer 28.

The insulating layer 28 is to be a film in contact with the channel formation region in the semiconductor layer 21 later and thus is preferably an oxide film containing a large amount of oxygen so that oxygen is released by heating and containing a small amount of hydrogen. The insulating layer 28 can be deposited by a deposition method such as a PECVD method, a sputtering method, or an ALD method, and is particularly preferably deposited by a sputtering method. In particular, when a gas containing not hydrogen but oxygen is used as a deposition gas, the insulating layer 28 containing an extremely small amount of hydrogen and an excess amount of oxygen can be deposited.

[Formation of Conductive Layer 25]

Figure 7B:
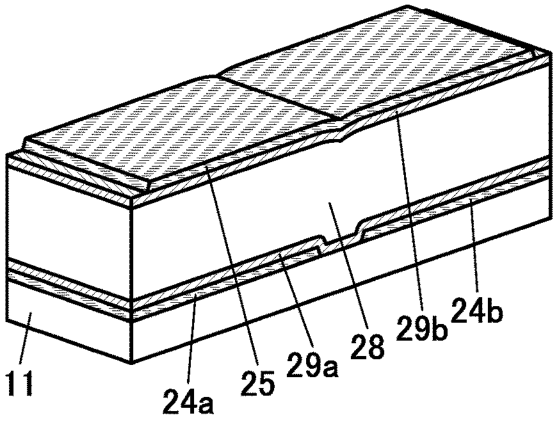

Next, a conductive film to be the conductive layer 25 is deposited over the insulating layer 29*b* and an unnecessary portion is removed by etching, whereby the conductive layer 25 is formed (FIG. 7B).

[Formation of Opening 20*a* and Opening 20*b*]

Figure 7C:
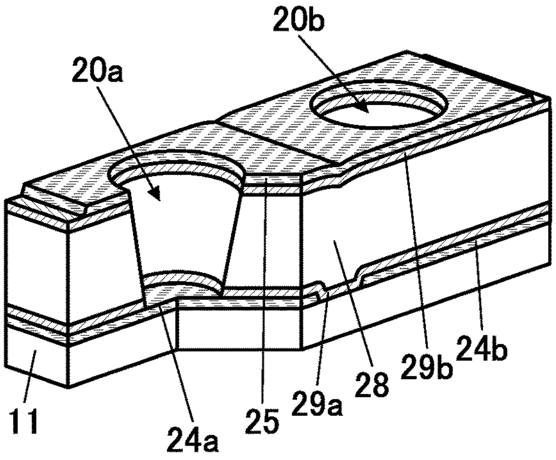

Subsequently, a resist mask is formed over the conductive layer 25 and the insulating layer 29*b* and then the conductive layer 25 and the insulating layers 29*b*, 28, and 29*a* are partly etched, whereby the openings 20*a* and 20*b* respectively reaching the conductive layers 24*a* and 24*b* are formed in the conductive layer 25 and the insulating layers 29*b*, 28, and 29*a* (FIG. 7C).

The conductive layer 25 and the insulating layers 29*b*, 28, and 29*a* are etched by dry etching, whereby the minute openings 20*a* and 20*b* can be formed. Without limitation to this, the layers may be processed by a wet etching method and/or a dry etching method.

[Formation of Semiconductor Layer 21*a* and Semiconductor Layer 21*b*]

Figure 7D:
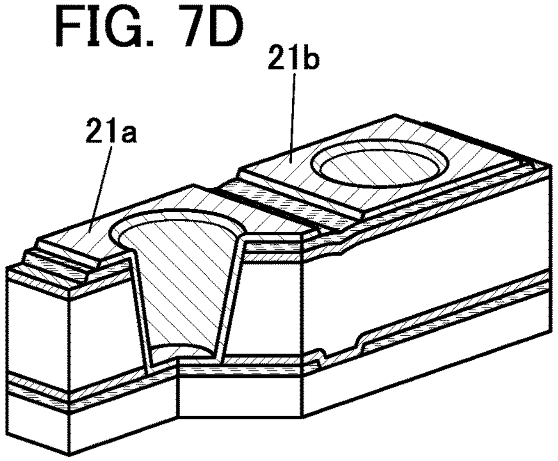

Next, a semiconductor film to be the semiconductor layers 21*a* and 21*b* is deposited and an unnecessary portion is removed by etching, whereby the island-shaped semiconductor layers 21*a* and 21*b* are formed (FIG. 7D).

The semiconductor layers 21*a* and 21*b* are each preferably formed to have a thickness as uniform as possible on the side surfaces of the insulating layers 28, 29*a*, and 29*b* and the conductive layer 25 in the openings 20*a* and 20*b*. A sputtering method or an ALD method can be employed for the deposition, for example.

The semiconductor film is preferably formed by a sputtering method using a metal oxide target, for example.

The semiconductor film is preferably a dense film with as few defects as possible. The semiconductor film is preferably a highly purified film in which impurities such as hydrogen and water are reduced as much as possible. It is particularly preferable to use a metal oxide film having crystallinity as the semiconductor film.

In depositing the metal oxide film, an oxygen gas and an inert gas (such as a helium gas, an argon gas, or a xenon gas) may be mixed. Note that the higher the proportion of the oxygen gas in the whole deposition gas (hereinafter also referred to as oxygen flow rate ratio) is in depositing the metal oxide film, the higher the crystallinity of the metal oxide film can be, achieving a highly reliable transistor. In contrast, the lower the oxygen flow rate ratio is, the lower the crystallinity of the metal oxide film is, offering a transistor with increased on-state current.

In depositing the metal oxide film, as the substrate temperature becomes higher, a denser metal oxide film having higher crystallinity can be formed. On the other hand, as the substrate temperature becomes lower, a metal oxide film having lower crystallinity and higher electrical conductivity can be formed.

The metal oxide film is deposited at a substrate temperature higher than or equal to room temperature and lower than or equal to 250° C., preferably higher than or equal to room temperature and lower than or equal to 200° C., further preferably higher than or equal to room temperature and lower than or equal to 140° C. For example, the substrate temperature is preferably set to be higher than or equal to room temperature and lower than 140° C. because the productivity is increased. When the metal oxide film is deposited at a substrate temperature set to room temperature or without intentional heating, the metal oxide film can have low crystallinity.

In the case of employing an ALD method, a deposition method such as a thermal ALD method or a plasma enhanced ALD (PEALD) method is preferably employed. The thermal ALD method is preferable because of its capability of depositing a film with extremely high step coverage. The PEALD method is preferable because of its capability of depositing a film at low temperatures, in addition to its capability of depositing a film with high step coverage.

For example, the semiconductor layer 21 including a metal oxide can be deposited by an ALD method using a precursor containing a constituent metal element and an oxidizer.

For example, In—Ga—Zn oxide can be deposited using a precursor containing indium, a precursor containing gallium, and a precursor containing zinc. Alternatively, a precursor containing indium and a precursor containing gallium and zinc may be used.

As the precursor containing indium, triethylindium, tris(2,2,6,6-tetramethyl-3,5-heptanedione acid)indium, cyclopentadienylindium, indium(III) chloride, (3-(dimethylamino)propyl)dimethylindium, or the like can be used.

As the precursor containing gallium, trimethylgallium, triethylgallium, gallium trichloride, tris(dimethylamide)gallium, gallium(III) acetylacetonate, tris(2,2,6,6-tetramethyl-3,5-heptanedione acid)gallium, dimethylchlorogallium, diethylchlorogallium, gallium(III) chloride, or the like can be used.

As the precursor containing zinc, dimethylzinc, diethylzinc, bis(2,2,6,6-tetramethyl-3,5-heptanedione acid)zinc, zinc chloride, or the like can be used.

Ozone, oxygen, water, or the like can be used as the oxidizer.

As a method for controlling the composition of a film to be deposited, adjusting the flow rate ratio, flowing time, flowing order, or the like of the source gases is given. By adjusting such conditions, a film in which composition changes continuously can be deposited. Furthermore, two or more films having different compositions can be deposited successively.

Heat treatment may be performed after the deposition of the semiconductor film. By the heat treatment, water and hydrogen contained in the semiconductor film can be reduced and oxygen can be supplied from the insulating layer 28. Note that the heat treatment may be performed after the semiconductor film is processed.

[Formation of Insulating Layer 22]

Figure 7E:
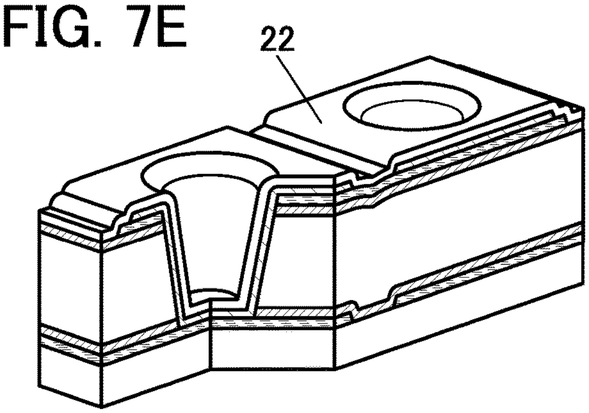

Next, the insulating layer 22 is formed to cover the conductive layer 25, the semiconductor layers 21*a* and 21*b*, and the insulating layer 29*b* (FIG. 7E).

The insulating layer 22 can be deposited by a deposition method such as a PECVD method, a sputtering method, or an ALD method. In the case where side walls of the openings 20*a* and 20*b* are substantially perpendicular to the substrate surface, a deposition method enabling high step coverage is preferably employed and an ALD method is preferably employed.

[Formation of Conductive Layer 23]

Figure 7F:
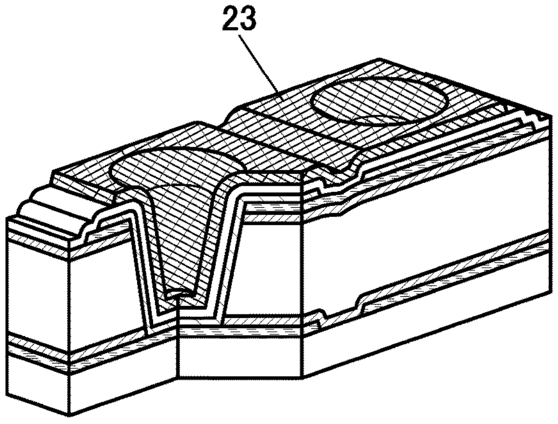

Next, a conductive film to be the conductive layer 23 is deposited to cover the insulating layer 22 and an unnecessary portion is removed by etching, whereby the conductive layer 23 is formed (FIG. 7F).

The conductive layer 23 can be deposited by a deposition method such as a PECVD method, a sputtering method, or an ALD method. In the case where side walls of the openings 20*a* and 20*b* are substantially perpendicular to the substrate surface, a deposition method enabling high step coverage is preferably employed and an ALD method is preferably employed.

Through the above process, the transistor 10*a* and the transistor 10*b* can be manufactured.

Application Example

Circuits to which the transistor exemplified in the above structure example can be applied will be described below.

As described above, one of the features of the transistor of one embodiment of the present invention is a small difference in electrical characteristics between before and after a source and a drain are interchanged with each other in driving. Thus, the transistor is suitably used for a variety of circuits in which a transistor operates so that a source and a drain are interchanged with each other. Furthermore, the other transistors in the circuit can be vertical transistors that can be formed over the same substrate through the same process as the transistor exemplified in the above structure example, so that the area occupied by the other transistors can be reduced.

Furthermore, in one embodiment of the present invention, the channel length can be determined by the number of transistors connected in series. As the channel length is longer, the amount of current flowing through the transistor can be reduced. Moreover, in a transistor having a longer channel length while having a fixed channel width, a change in drain current owing to change of the source-drain voltage for driving in a saturation region can be reduced (i.e., saturation characteristics can be improved). As a transistor requiring such characteristics, the transistor of one embodiment of the present invention is suitably used.

Application Example 1

Figure 8:
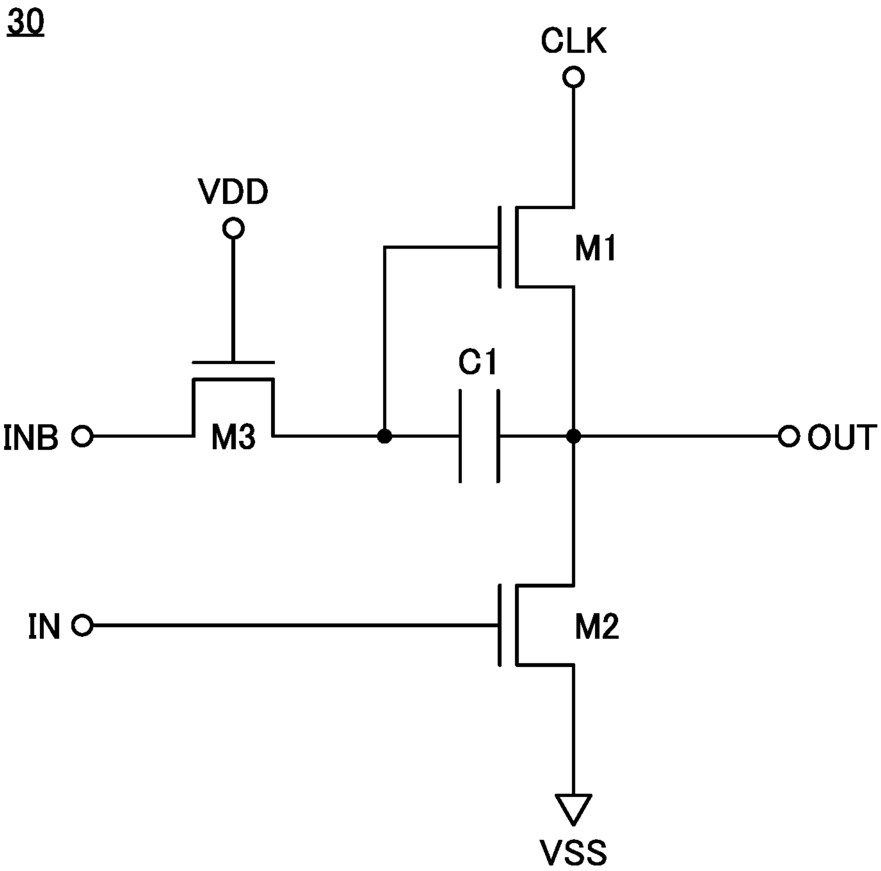
FIG. 8 is a circuit diagram of a semiconductor device.

FIG. 8 shows a configuration example of a circuit 30 functioning as an inverter circuit (also referred to as a "NOT circuit").

The circuit 30 illustrated in FIG. 8 includes a transistor M1, a transistor M2, a transistor M3, and a capacitor C1. The circuit 30 includes two wirings (a wiring IN and a wiring INB) and one output wiring (a wiring OUT).

The circuit 30 is a single-polarity inverter circuit composed of only n-channel transistors. Since the circuit 30 does not include a p-channel transistor, the manufacturing cost can be reduced.

One of a source and a drain of the transistor M1 is electrically connected to a wiring CLK; the other of the source and the drain of the transistor M1 is electrically connected to one of a source and a drain of the transistor M2, one electrode of the capacitor C1, and the wiring OUT; and a gate of the transistor M1 is electrically connected to the other electrode of the capacitor C1 and one of a source and a drain of the transistor M3. The other of the source and the drain of the transistor M2 is electrically connected to a wiring VSS and a gate of the transistor M2 is electrically connected to the wiring IN. The other of the source and the drain of the transistor M3 is electrically connected to the wiring INB and a gate of the transistor M3 is electrically connected to a wiring VDD.

To the wiring CLK, a first potential and a second potential higher than the first potential are alternately supplied. An input signal is supplied to the wiring IN and an inverted signal of the input signal is supplied to the wiring INB. A high power supply potential and a low power supply potential are supplied to the wiring VDD and the wiring VSS, respectively. The high power supply potential is higher than the first potential and the low power supply potential is lower than the second potential.

Next, the operation of the circuit 30 is described with reference to FIGS. 9A and 9B. The operation of the circuit 30 is roughly divided into the following two periods which are alternately repeated. In some cases, a period shown in FIG. 9A and a period shown in FIG. 9B are referred to as a charging period and a discharging period, respectively.

Figure 9A:
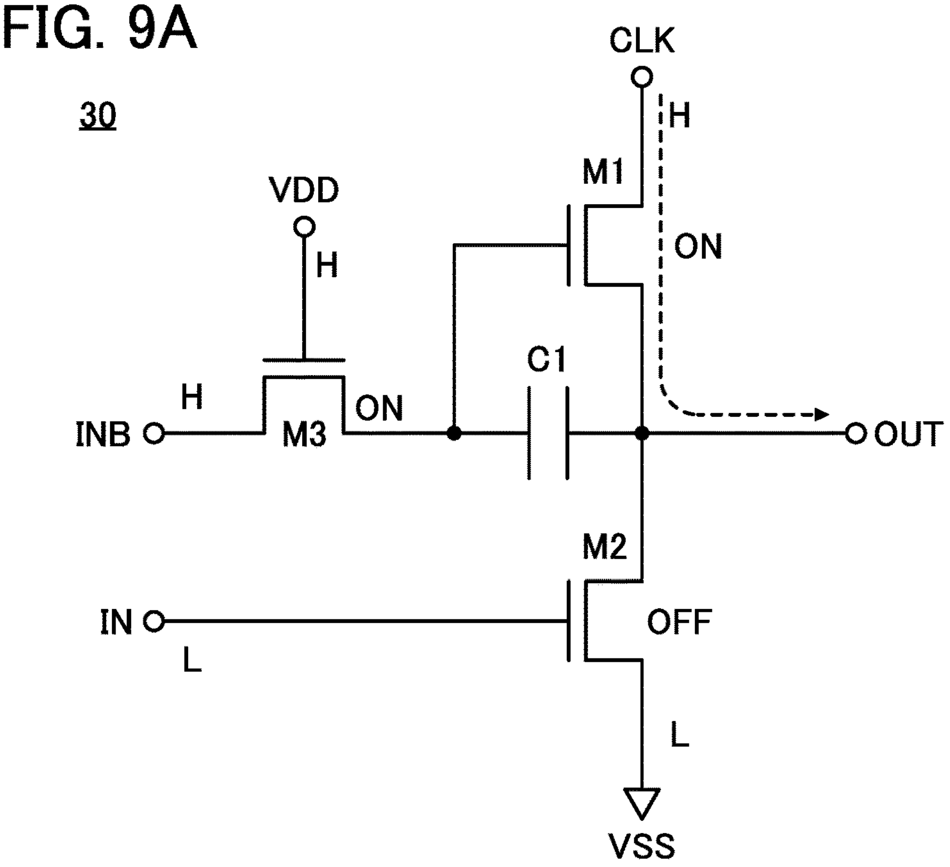
FIGS. 9A and 9B are circuit diagrams of a semiconductor device.
Figure 9B:
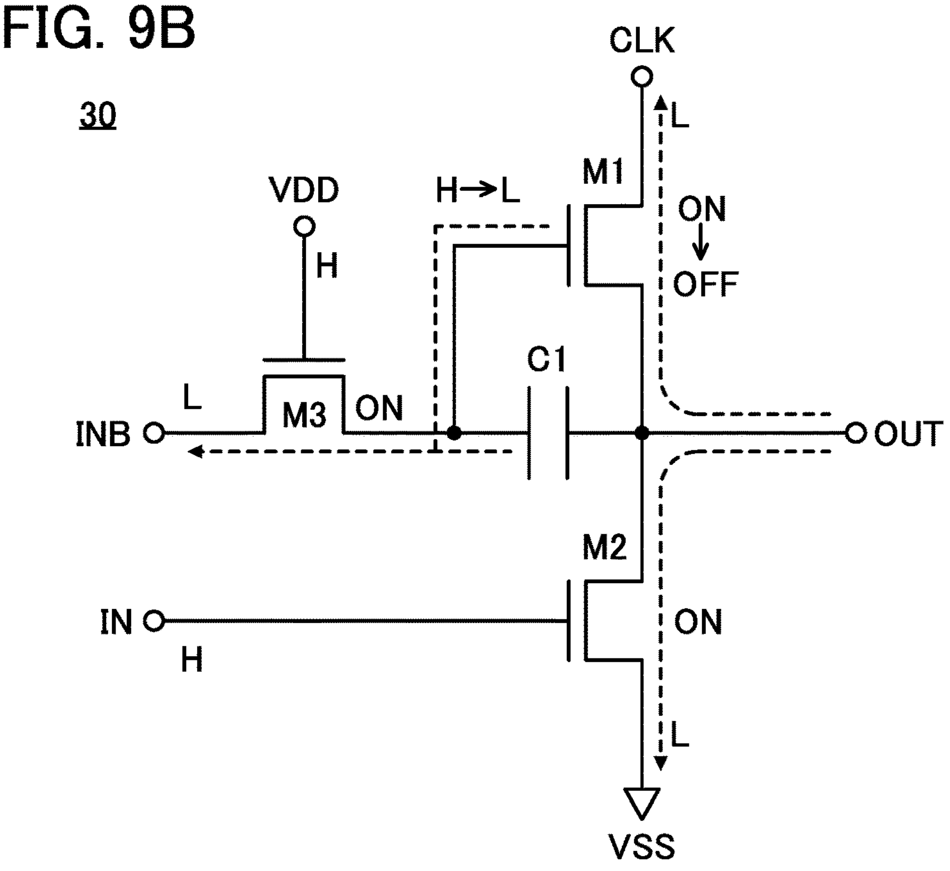

In the charging period in FIG. 9A, high-level potentials (denoted by H) are input to the wiring INB and the wiring CLK and a low-level potential (denoted by L) is input to the wiring IN. A high-level potential and a low-level potential are always supplied to the wiring VDD and the wiring VSS, respectively.

In this case, as shown in FIG. 9A, the transistors M1 and M3 are in an on state (denoted by ON) and the transistor M2 is in an off state (denoted by OFF) in the charging period. The high-level potential is supplied to the gate of the transistor M1 from the wiring INB through the transistor M3, whereby the transistor M1 is brought into an on state. As a result, current flows from the wiring CLK toward the wiring OUT and a load (e.g., a wiring or a capacitor) connected to the wiring OUT can be charged.

Here, when the potential of the wiring OUT increases, the potential of the gate of the transistor M1 increases to a potential higher than the high-level potential supplied to the wiring INB owing to a bootstrap effect by the capacitor C1. Therefore, the influence of the threshold voltage of the transistor M1 can be eliminated and a potential output to the wiring OUT can be closer to the potential of the wiring CLK.

Next, in the period in FIG. 9B, a high-level potential is input to the wiring IN and low-level potentials are input to the wirings INB and CLK.

The high-level potential is supplied to the wiring IN, whereby the transistor M2 is brought into an on state. Since the wiring OUT is charged in the period in FIG. 9A, current flows from the wiring OUT to the wiring VSS and the wiring OUT is discharged.

Immediately after the shift from the charging period to the discharging period, a voltage higher than the threshold voltage of the transistor M1 is stored in the capacitor C1; thus, a time lag until the transistor M1 is brought into an off state is caused. Accordingly, the transistor M1 is in an on state and the low-level potential is supplied to the wiring CLK, so that current flows from the wiring OUT toward the wiring CLK. After that, when the voltage stored in the capacitor C1 becomes lower than the threshold voltage of the transistor M1, the transistor M1 is brought into an off state.

As described above, by flowing current for discharge not only to the wiring VSS side but also to the wiring CLK side in the period in FIG. 9B where the wiring OUT is discharged, the wiring OUT can be rapidly discharged. Thus, even when a load connected to the wiring OUT is large, high-speed operation can be achieved.

As described above, the transistor M1 in the circuit 30 operates so that the direction of current changes between the charging period and the discharging period. In other words, the transistor M1 operates so that the source and the drain are interchanged with each other. Therefore, as the transistor M1 in the circuit 30, it is preferable to use an even number of transistors connected in series, which are exemplified in the above structure example. As the transistors M2 and M3, it is preferable to use vertical transistors formed over the same substrate through the same process as the transistor M1.

Next, a configuration example of a sequential circuit including the circuit 30 is described.

Figure 10A:
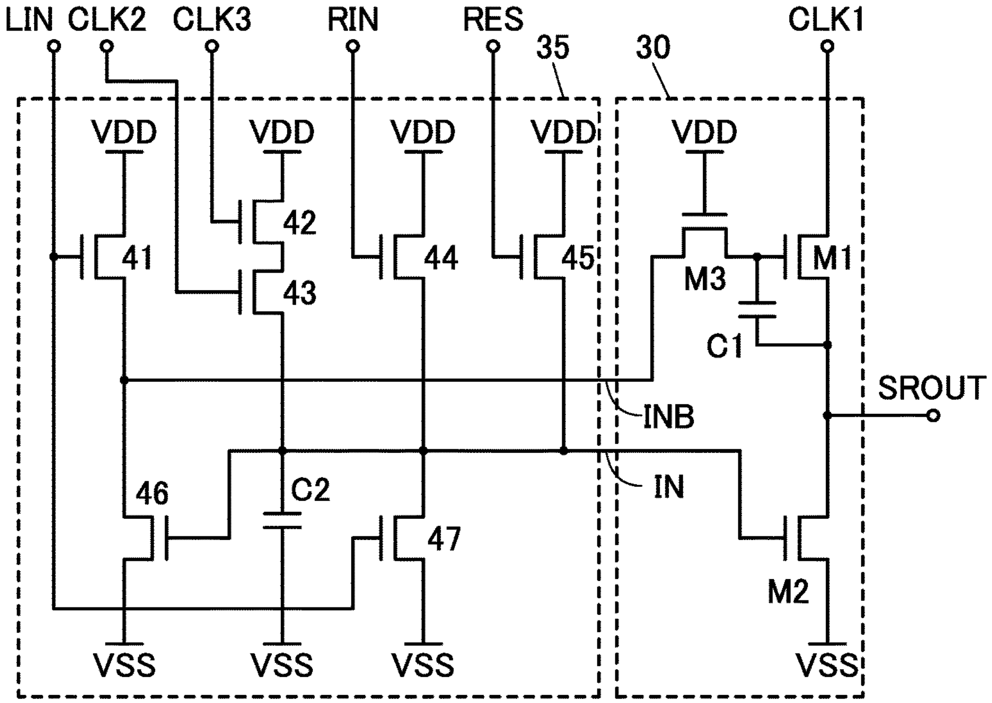
FIGS. 10A and 10B are circuit diagrams of a semiconductor device.

FIG. 10A illustrates a configuration example of a sequential circuit 40*a*. The sequential circuit 40*a* includes the circuit 30 and a circuit 35. The circuit 30 is connected to the circuit 35 through the wirings IN and INB. The above description can be referred to for the circuit 30.

The circuit 35 includes a transistor 41 to a transistor 47 and a capacitor C2. To the circuit 35, a wiring LIN, a wiring CLK2, a wiring CLK3, a wiring RIN, and a wiring RES are connected. The transistors 41 to 47 are preferably n-channel transistors.

The circuit 35 has a function of outputting a first signal and a second signal obtained by inverting the first signal respectively to the wiring IN and the wiring INB in accordance with a variety of signals input.

Control signals are input to the wiring LIN, a wiring CLK1, the wiring CLK2, the wiring RIN, and the wiring RES so that a period during which the potential of the wiring is high and a period during which the potential of the wiring is low are repeated at predetermined intervals. When a high-level potential is supplied to the wiring LIN, the potential of the wiring IN is low and the potential of the wiring INB is high. Meanwhile, when a low-level potential is supplied to the wiring LIN, the potential of the wiring IN is high and the potential of the wiring INB is low.

Specifically, a gate of the transistor 41 is electrically connected to the wiring LIN, one of a source and a drain of the transistor 41 is electrically connected to the wiring INB and one of a source and a drain of the transistor 46, and the other of the source and the drain of the transistor 41 is electrically connected to the wiring VDD. A gate of the transistor 42 is electrically connected to the wiring CLK3, one of a source and a drain of the transistor 42 is electrically connected to one of a source and a drain of the transistor 43, and the other of the source and the drain of the transistor 42 is electrically connected to the wiring VDD. A gate of the transistor 43 is electrically connected to the wiring CLK2 and the other of the source and the drain of the transistor 43 is electrically connected to the wiring IN, one electrode of the capacitor C2, and a gate of the transistor 46. A gate of the transistor 44 is electrically connected to the wiring RIN, one of a source and a drain of the transistor 44 is electrically connected to the wiring IN, and the other of the source and the drain of the transistor 44 is electrically connected to the wiring VDD. A gate of the transistor 45 is electrically connected to the wiring RES, one of a source and a drain of the transistor 45 is electrically connected to the wiring IN, and the other of the source and the drain of the transistor 45 is electrically connected to the wiring VDD. The other of the source and the drain of the transistor 46 is electrically connected to the wiring VSS. A gate of the transistor 47 is electrically connected to the wiring LIN, one of a source and a drain of the transistor 47 is electrically connected to the wiring IN, and the other of the source and the drain of the transistor 47 is electrically connected to the wiring VSS. The other electrode of the capacitor C2 is electrically connected to the wiring VSS.

Figure 10B:
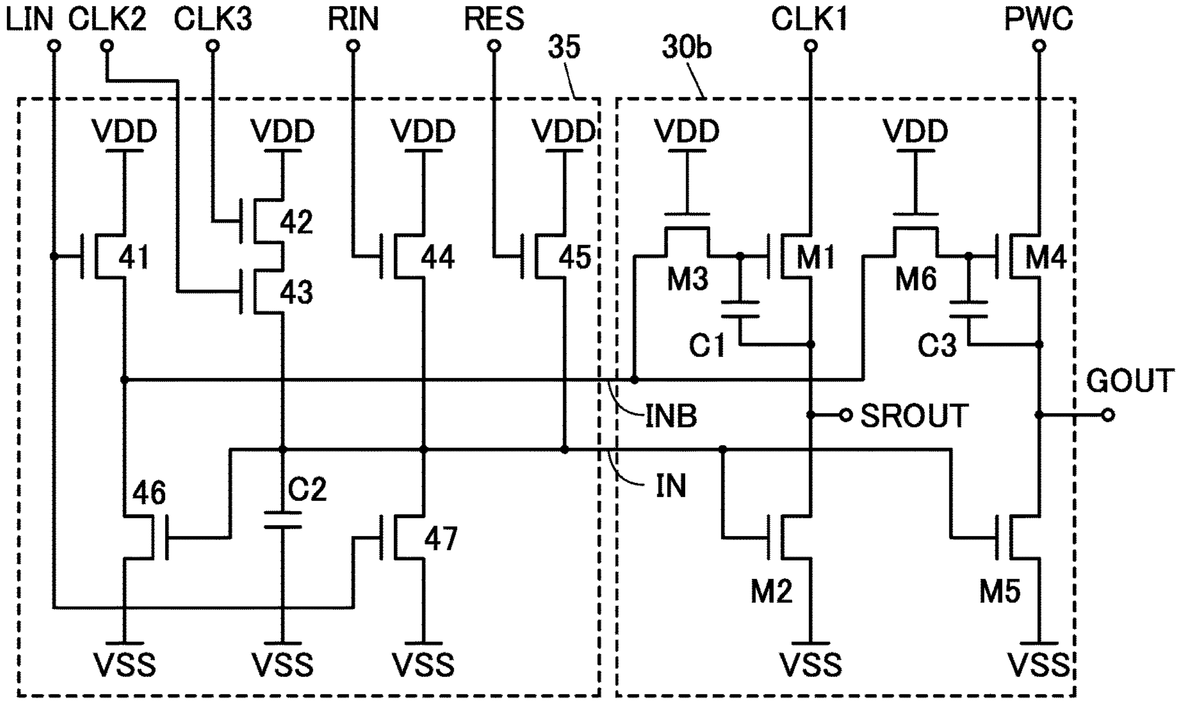

A sequential circuit 40*b* illustrated in FIG. 10B includes a circuit 30*b* instead of the circuit 30. In the circuit 30*b*, two structures similar to that of the circuit 30 are provided in parallel. That is, the circuit 30*b* includes the structure including the transistors M1, M2, and M3 and the capacitor C1 and the structure including transistors M4, M5, and M6 and a capacitor C3. A wiring SROUT is connected to the transistors M1 and M2 and a wiring GOUT is connected to the transistors M4 and M5. A wiring PWC is connected to the transistor M4. Synchronized signals are supplied to the wirings CLK1 and PWC.

As each of the transistors M1 and M4 in the circuit 30*b*, it is preferable to use an even number of transistors connected in series, which are exemplified in the above structure example.

The sequential circuits 40*a* and 40*b* are each suitably applied to a shift register circuit provided in a scan line driver circuit of a display device, for example. In this case, the potential of the wiring IN needs to be kept high in the operation period of the circuits. Therefore, a transistor whose off-state leakage current is as low as possible is preferably used as the transistor 47 functioning as a switch for controlling conduction and non-conduction between the wiring IN and the wiring VSS. Thus, the transistor with a long channel length exemplified in the above structure example is preferably used as the transistor 47.

Application Example 2

Figure 11A:
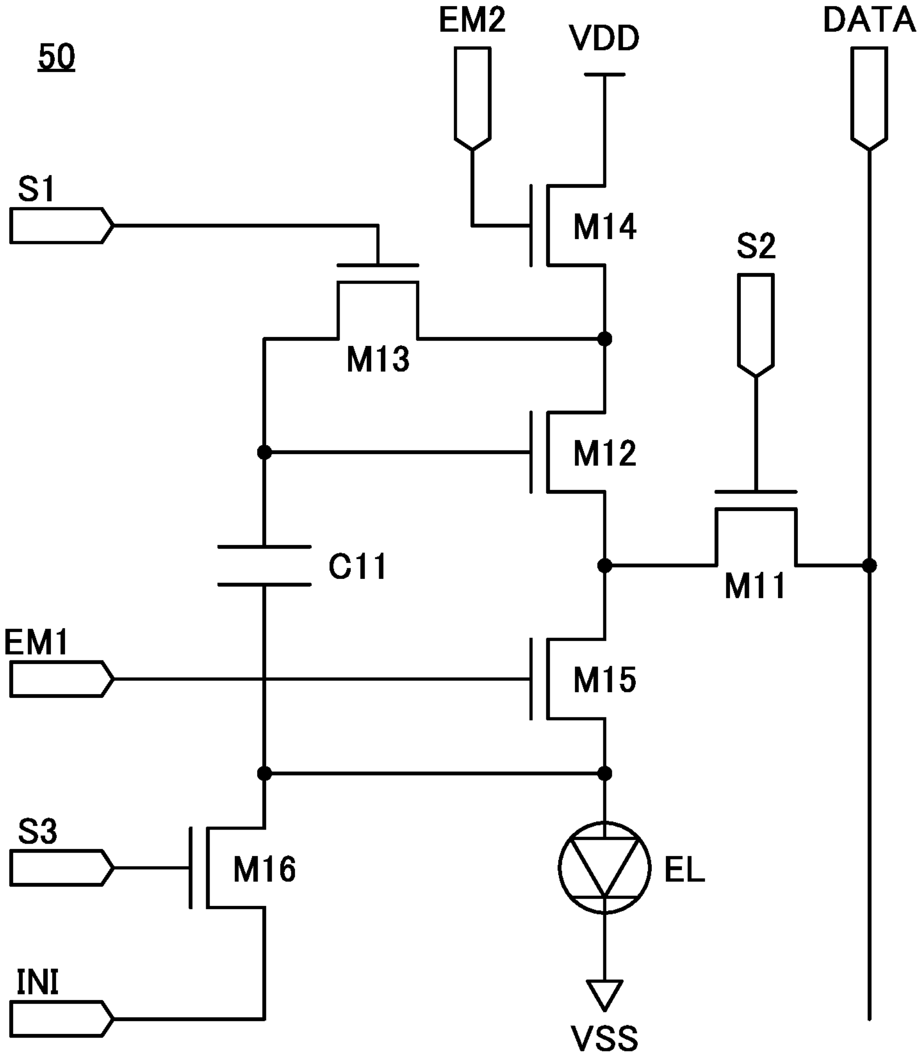
FIG. 11A is a circuit diagram of a semiconductor device and FIG. 11B is a timing chart.

A pixel circuit that can be used for a pixel of a display device is described below. FIG. 11A shows a circuit 50 described below as an example.

The circuit 50 includes transistors M11 to M16, a capacitor C11, and a light-emitting element EL. To the circuit 50, a wiring DATA, a wiring S1, a wiring S2, a wiring S3, a wiring EM1, a wiring EM2, the wiring INI, the wiring VDD, and the wiring VSS are connected. A high-level potential and a low-level potential are supplied to the wiring VDD and the wiring VSS, respectively. A given fixed potential (typically, a low-level potential) is supplied to the wiring INI. A data signal is supplied to the wiring DATA.

A gate of the transistor M11 is electrically connected to the wiring S2, one of a source and a drain of the transistor M11 is electrically connected to the wiring DATA, and the other of the source and the drain of the transistor M11 is electrically connected to one of a source and a drain of the transistor M12 and one of a source and a drain of the transistor M15. A gate of the transistor M12 is electrically connected to one of a source and a drain of the transistor M13 and one electrode of the capacitor C11 and the other of the source and the drain of the transistor M12 is electrically connected to the other of the source and the drain of the transistor M13 and one of a source and a drain of the transistor M14. A gate of the transistor M13 is electrically connected to the wiring S1. A gate of the transistor M14 is electrically connected to the wiring EM2 and the other of the source and the drain of the transistor M14 is electrically connected to the wiring VDD. A gate of the transistor M15 is electrically connected to the wiring EM1 and the other of the source and the drain of the transistor M15 is electrically connected to one electrode of the light-emitting element EL, one of a source and a drain of the transistor M16, and the other electrode of the capacitor C11. A gate of the transistor M16 is electrically connected to the wiring S3 and the other of the source and the drain of the transistor M16 is electrically connected to the wiring INI.

The transistors M11, M13, M14, M15, and M16 each function as a switch for controlling conduction and non-conduction of a wiring. In particular, the transistor M11 is electrically connected to the wiring DATA to which a data signal is supplied, and can be referred to as a selection transistor. Meanwhile, the transistor M12 has a function of controlling the amount of current flowing through the light-emitting element EL and can also be referred to as a driving transistor.

Figure 11B:
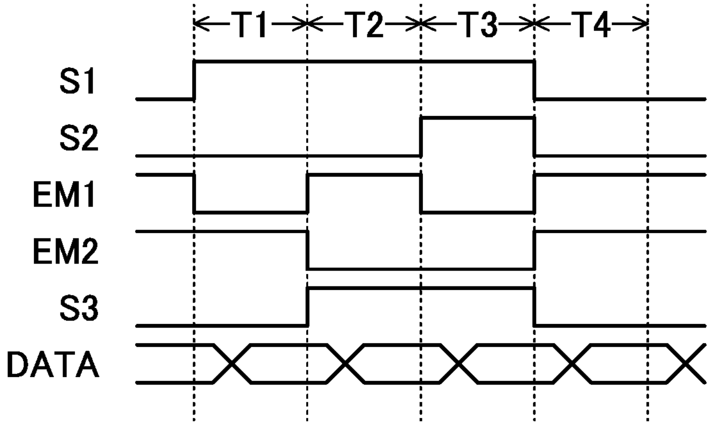

FIG. 11B illustrates an example of a timing chart in the case of driving the circuit 50. Potential changes over time in signals supplied to the wiring S1, the wiring S2, the wiring EM1, the wiring EM2, the wiring S3, and the wiring DATA are shown from the top of the timing chart in FIG. 11B. In the timing chart in FIG. 11B, a period is divided into a period T1 to a period T4. Although the periods T1 to T4 are illustrated to have the same length in FIG. 11B and the like, the periods may have different lengths.

Next, the operation example of the circuit 50 is described.

FIGS. 12A1 and 12B1 and FIGS. 13A1 and 13B1 are circuit diagrams for describing the operation of the circuit 50. FIGS. 12A2 and 12B2 and FIGS. 13A2 and 13B2 are timing charts each showing the period to be described.

Hereinafter, when the transistors other than the transistor M12 are in an on state, the transistors operate in a linear region while the gate is supplied with a potential sufficiently higher than that for the drain, and the source and the drain have the same potential.

In the period T1, as shown in FIGS. 12A1 and 12A2, the transistors M13 and M14 are brought into an on state and the transistors M11, M15, and M16 are brought into an off state. Here, to a node N1 connected to the gate of the transistor M12, a high-level potential is supplied from the wiring VDD through the transistors M13 and M14. The potential of the node N1 is $V_{dd}$ at this time.

Then, in the period T2, as shown in FIGS. 12B1 and 12B2, the transistors M13, M15, and M16 are brought into an on state and the transistors M11 and M14 are brought into an off state. Here, current flows from the node N1 toward the wiring INI through the transistors M13, M12, M15, and M16 and the potential of the node N1 decreases to such a level that the transistor M12 is brought into an off state. In the case where a potential supplied to the wiring INI and the threshold voltage of the transistor M12 are $V_{ini}$ and $V_{th}$, respectively, the potential of the node N1 is $V_{ini}+V_{th}$ after a state of equilibrium is achieved. The potential of the node N2 connected to the transistors M11, M12, and M15 is $V_{ini}$.

Then, in the period T3, as shown in FIGS. 13A1 and 13A2, the transistors M11, M13, and M16 are brought into an on state and the transistors M14 and M15 are brought into an off state. Here, current flows to the node N1 through the transistors M11, M12, and M13 in accordance with the potential of the wiring DATA, whereby the potential of the node N1 increases. When the potential supplied to the wiring DATA is $V_{data}$, $V_{data}$ is higher than $V_{ini}$ except for the case where light emission is not performed. Thus, the potential of the node N2 increases from $V_{ini}$ to $V_{data}$ and thus the amount of change is $V_{data}-V_{ini}$. Therefore, the potential of the node N1 also increases by $V_{data}-V_{ini}$ and the potential of the node N1 is $V_{data}+V_{th}$ after a state of equilibrium is achieved. That is, the gate of the transistor M12 is supplied with a potential obtained by adding the threshold voltage $V_{th}$ of the transistor M12 to the potential $V_{data}$ of the data signal. Thus, current flowing through the transistor M12 in the period T4 depends not on the value of the threshold voltage $V_{th}$ of the transistor M12 but only on a potential difference between $V_{data}$ and $V_{ini}$.

Finally, in the period T4, as shown in FIGS. 13B1 and 13B2, the transistors M14 and M15 are brought into an on state and the transistors M11, M13, and M16 are brought into an off state. Accordingly, current flows from the wiring VDD to the light-emitting element EL through the transistors M14, M12, and M15. The current flowing to the light-emitting element EL is controlled by the potential supplied to the gate of the transistor M12.

By using such a circuit and such a driving method, the influence of a variation in the threshold voltage of the transistor M12 functioning as a driving transistor can be eliminated in principle.

Here, focusing on the direction of current flowing through the transistor M12, the direction of the current in the period T2 is opposite to that in the period T3. This means that the transistor M12 is a transistor through which current flows in two directions. Therefore, as the transistor M12, it is preferable to use an even number of vertical transistors connected in series, which are exemplified in the above structure example.

Moreover, the vertical transistor is preferably used as the transistor other than the transistor M12. The vertical transistor of one embodiment of the present invention can have a short channel length and a large channel width and thus is suitable for flowing an extremely large amount of current. When the vertical transistor is used as the transistor M11 or the like functioning as a switch, the vertical transistor can be formed at the same time through the same manufacturing process as the transistor M12. Furthermore, the period required to charge and discharge a wiring or the like connected to the transistor can be shortened, so that time taken for a writing operation in a pixel can be shortened.

Here, in the timing chart in FIG. 11B or the like, a signal supplied to the wiring EM2 is an inverted signal of a signal supplied to the wiring S3, and vice versa. Therefore, one signal can be easily generated from the other signal with use of an inverter circuit. The transistor M16 is preferably a p-type transistor, in which case the wiring S3 and the wiring EM2 can be a common wiring and the number of wirings can be reduced.

In the case of providing both an n-channel transistor and a p-channel transistor, a transistor including polycrystalline silicon or single crystal silicon in a semiconductor where a channel is formed is preferably used as the p-channel transistor. In particular, a transistor including low-temperature polysilicon (LTPS) is preferably used. In this case, it is preferable that the vertical transistor exemplified above be used as the n-channel transistor so that the two kinds of transistors are provided over the same substrate.

Application Example 3

Figure 14:
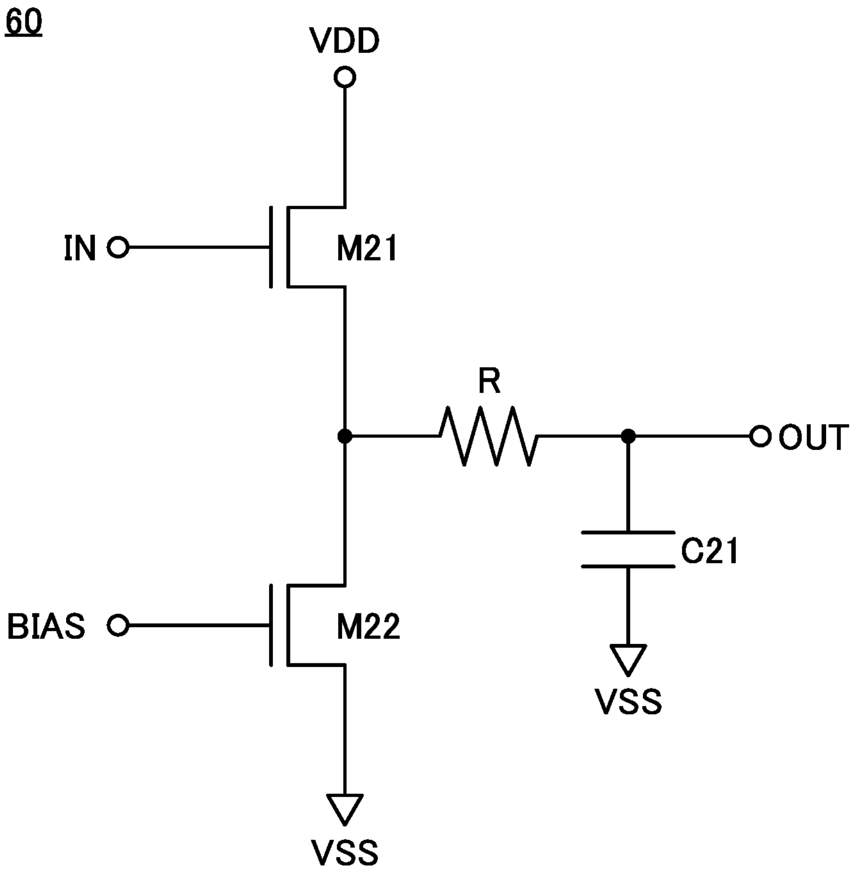
FIG. 14 is a circuit diagram of a semiconductor device.

A circuit 60 illustrated in FIG. 14 functions as a source follower circuit. The circuit 60 amplifies input voltage in a predetermined proportion and outputs amplified voltage.

The circuit 60 includes a transistor M21, a transistor M22, a resistor R, and a capacitor C21. The circuit 60 is connected to the wiring IN, a wiring BIAS, the wiring OUT, the wiring VDD, and the wiring VSS.

A gate of the transistor M21 is electrically connected to the wiring IN, one of a source and a drain of the transistor M21 is electrically connected to the wiring VDD, and the other of the source and the drain of the transistor M21 is electrically connected to one of a source and a drain of the transistor M22 and one terminal of the resistor R. A gate of the transistor M22 is electrically connected to the wiring BIAS and the other of the source and the drain of the transistor M22 is electrically connected to the wiring VSS. The other terminal of the resistor R is electrically connected to the wiring OUT and one electrode of the capacitor C21. The other electrode of the capacitor C21 is electrically connected to the wiring VSS.

The wiring IN and the wiring OUT respectively correspond to the input and the output of the circuit 60. A high power supply potential and a low power supply potential are respectively supplied to the wiring VDD and the wiring VSS. A constant potential is supplied to the wiring BIAS. For example, the wiring BIAS can be supplied with a potential higher than or equal to the potential supplied to the wiring VSS and lower than or equal to the potential supplied to the wiring VDD.

The transistors M21 and M22 operate in a saturation region. Here, in the transistor operating in a saturation region, as a change in source-drain current relative to a change in gate-source voltage is small (i.e., as the transistor has better saturation characteristics), the amplification factor of the circuit 60 can be increased. In the case where the transistors M21 and M22 are separately provided as one vertical transistor, saturation characteristics might be not sufficient. For this reason, as each of the transistors M21 and M22, a plurality of vertical transistors connected in series are preferably used.

Here, the amplification factors of the circuit illustrated in FIG. 14, which are estimated by simulation, are shown. The characteristics of the transistors M21 and M22 used in the simulation are based on measured values of vertical transistors each including an oxide semiconductor and having a channel length L of 0.5 μm and a channel width W of 2 πμm. Voltages supplied to the wirings VDD, VSS, and BIAS are respectively 12 V, −8 V, and −5.5 V, the resistance value of the resistor R is 1.7 kΩ, and the capacitance value of the capacitor C21 is 7.5 pF.

Table 1 lists the numbers of transistors connected in series that are used as each of the transistors M21 and M22 and the simulation results of the amplification factors of the circuit 60. As the number of the transistors connected in series increases, the amplification factor is closer to 1.

TABLE 1

| Number of transistors connected in series | 1 | 2 | 3 | 4 | 5 | 6 |
|---|---|---|---|---|---|---|
| Amplification factor | 0.65 | 0.86 | 0.92 | 0.95 | 0.96 | 0.97 |

The above is the description of the application examples.

At least part of this embodiment can be implemented in combination with any of the other embodiments described in this specification, as appropriate.

Embodiment 2

In this embodiment, a display device using the semiconductor device of one embodiment of the present invention will be described.

The display device in this embodiment can be a high-resolution display device or large-sized display device. Accordingly, the display device in this embodiment can be used for display portions of electronic devices such as a digital camera, a digital video camera, a digital photo frame, a mobile phone, a portable game console, a portable information terminal, and an audio reproducing device, in addition to display portions of electronic devices with a relatively large screen, such as a television device, a desktop or laptop personal computer, a monitor of a computer or the like, digital signage, and a large game machine such as a pachinko machine.

The display device in this embodiment can be a high-resolution display device. Accordingly, the display device in this embodiment can be used for display portions of information terminals (wearable devices) such as watch-type and bracelet-type information terminals and display portions of wearable devices capable of being worn on the head, such as a VR device like a head-mounted display (HMD) and a glasses-type AR device.

The semiconductor device of one embodiment of the present invention can be used for a display device or a module including the display device. Examples of the module including the display device are a module in which a connector such as a flexible printed circuit board (hereinafter referred to as an FPC) or a tape carrier package (TCP) is attached to the display device, a module which is mounted with an integrated circuit (IC) by a chip on glass (COG) method, a chip on film (COF) method, or the like, and the like.

[Display Device 50A]

Figure 15:
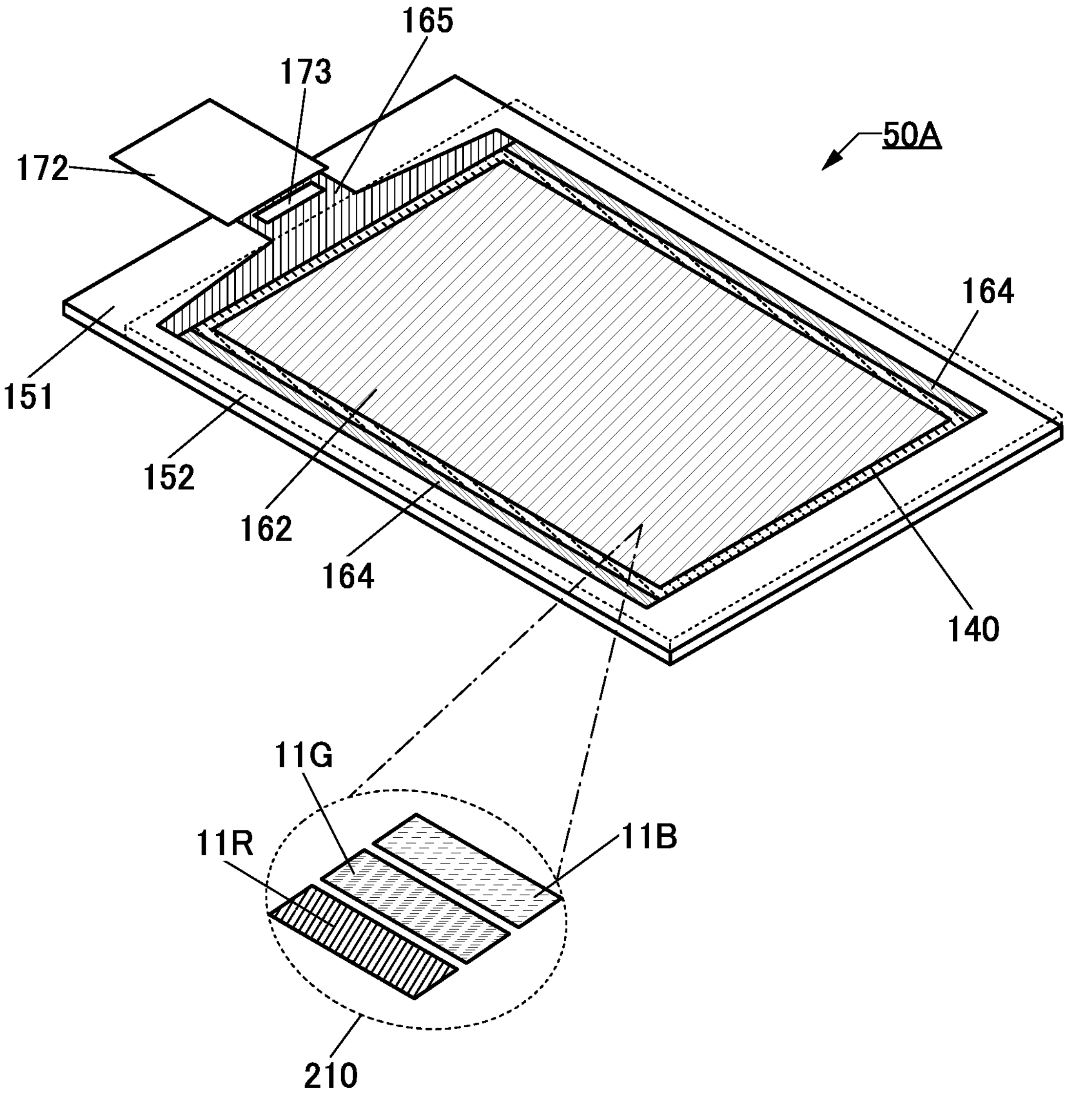
FIG. 15 illustrates a structure example of a display device.

FIG. 15 is a perspective view of a display device 50A.

In the display device 50A, a substrate 152 and a substrate 151 are bonded to each other. In FIG. 15, the substrate 152 is indicated by a dashed line.

The display device 50A includes a display portion 162, a connection portion 140, a circuit portion 164, a wiring 165, and the like. FIG. 15 illustrates an example where an IC 173 and an FPC 172 are implemented onto the display device 50A. Thus, the structure illustrated in FIG. 15 can be regarded as a display module including the display device 50A, the IC, and the FPC.

The connection portion 140 is provided outside the display portion 162. The connection portion 140 can be provided along one or more sides of the display portion 162. The number of connection portions 140 may be one or more. FIG. 15 illustrates an example where the connection portion 140 is provided to surround the four sides of the display portion. In the connection portion 140, a common electrode of a display element is electrically connected to a conductive layer so that a potential can be supplied to the common electrode.

The circuit portion 164 includes a scan line driver circuit (also referred to as a gate driver), for example. The circuit portion 164 may include both a scan line driver circuit and a signal line driver circuit (also referred to as a source driver).

The wiring 165 has a function of supplying a signal and power to the display portion 162 and the circuit portion 164. The signal and power are input to the wiring from the outside through the FPC 172 or from the IC 173.

FIG. 15 illustrates an example where the IC 173 is provided on the substrate by a COG method, a COF method, or the like. An IC including one or both of a scan line driver circuit and a signal line driver circuit can be used as the IC 173, for example. Note that the display device 50A and the display module are not necessarily provided with an IC. The IC may be mounted on the FPC by a COF method or the like.

The semiconductor device of one embodiment of the present invention can be used for one or both of the display portion 162 and the circuit portion 164 of the display device 50A, for example. The semiconductor device of one embodiment of the present invention can also be used for the IC 173.

When the semiconductor device of one embodiment of the present invention is used for a pixel circuit of the display device, the area occupied by the pixel circuit can be reduced and the display device can have high resolution, for example. When the semiconductor device of one embodiment of the present invention is used for a driver circuit (e.g., one or both of a gate line driver circuit and a source line driver circuit) of the display device, the area occupied by the driver circuit can be reduced and the display device can have a narrow bezel, for example. Since the semiconductor device of one embodiment of the present invention has favorable electrical characteristics, a display device can have increased reliability by using the semiconductor device.

Among the transistors provided in the display device 50A, in particular, the transistor through which current flows in two directions preferably employs the structure exemplified in Embodiment 1 in which an even number of vertical transistors are connected in series.

The display portion 162 is a region where an image is displayed and a plurality of pixels 210 are periodically arranged in the display device 50A. FIG. 15 shows an enlarged view of one pixel 210.

There is no particular limitation on the arrangement of pixels in the display device of one embodiment of the present invention, and a variety of arrangements can be employed. Examples of the arrangement of pixels include stripe arrangement, S-stripe arrangement, matrix arrangement, delta arrangement, Bayer arrangement, and PenTile arrangement.

The pixel 210 illustrated in FIG. 15 includes a subpixel 11R that emits red light, a subpixel 11G that emits green light, and a subpixel 11B that emits blue light.

The subpixels 11R, 11G, and 11B each include a display element and a circuit for controlling the driving of the display element.

Any of a variety of elements can be used as the display element, and a liquid crystal element or a light-emitting element can be used, for example. Alternatively, a micro electro mechanical systems (MEMS) shutter element, an optical interference type MEMS element, or a display element using a microcapsule method, an electrophoretic method, an electrowetting method, an Electronic Liquid Powder (registered trademark) method, or the like can be used. Alternatively, a quantum-dot LED (QLED) employing a light source and color conversion technology using quantum dot materials may be used.

As the liquid crystal element, a transmissive liquid crystal element, a reflective liquid crystal element, a transflective liquid crystal element, or the like can be used.

As the light-emitting element, a self-luminous light-emitting element such as an LED, an organic LED (OLED), or a semiconductor laser can be used. Examples of the LED include a mini LED and a micro LED.

Examples of a light-emitting substance contained in the light-emitting element include a substance exhibiting fluorescence (a fluorescent material), a substance exhibiting phosphorescence (a phosphorescent material), a substance exhibiting thermally activated delayed fluorescence (a thermally activated delayed fluorescent (TADF) material), and an inorganic compound (e.g., a quantum dot material).

The light-emitting element can emit infrared, red, green, blue, cyan, magenta, yellow, or white light, for example. When the light-emitting element has a microcavity structure, the color purity can be increased.

One of the pair of electrodes of the light-emitting element functions as an anode, and the other electrode functions as a cathode.

In this embodiment, the case where a light-emitting element is used as the display element is mainly described as an example.

The display device of one embodiment of the present invention can have any of the following structures: a top-emission structure in which light is emitted in a direction opposite to the substrate where the light-emitting element is formed, a bottom-emission structure in which light is emitted toward the substrate where the light-emitting element is formed, and a dual-emission structure in which light is emitted toward both surfaces.

Figure 16:
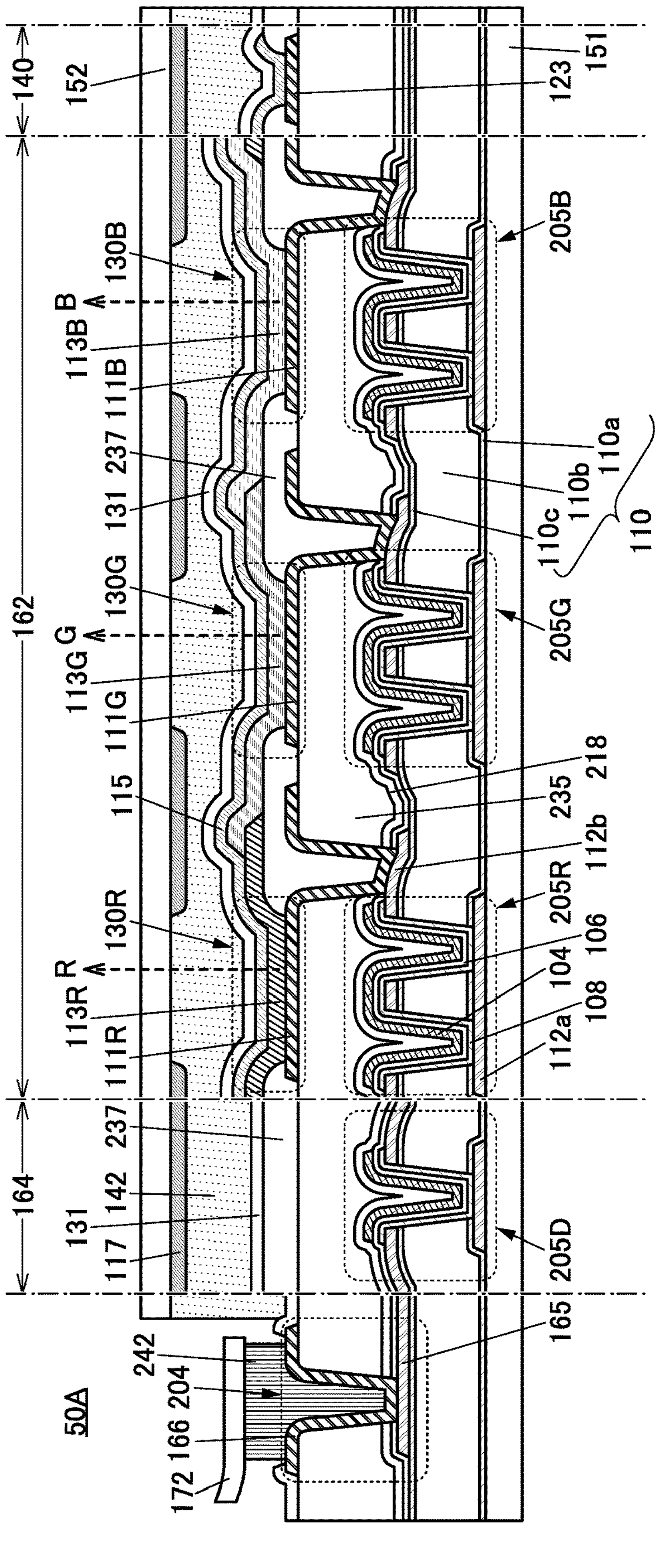
FIG. 16 illustrates a structure example of a display device.

FIG. 16 illustrates an example of cross sections of part of a region including the FPC 172, part of the circuit portion 164, part of the display portion 162, part of the connection portion 140, and part of a region including an end portion of the display device 50A.

The display device 50A illustrated in FIG. 16 includes transistors 205D, 205R, 205G, and 205B, light-emitting elements 130R, 130G, and 130B, and the like between the substrates 151 and 152. The light-emitting elements 130R, 130G, and 130B are display elements included in the subpixel 11R that emits red light, the subpixel 11G that emits green light, and the subpixel 11B that emits blue light, respectively.

The display device 50A employs a side-by-side (SBS) structure. The SBS structure can optimize materials and structures of light-emitting elements and thus can extend freedom of choice of materials and structures, whereby the luminance and the reliability can be easily improved.

The display device 50A has a top-emission structure. The aperture ratio of pixels in a top-emission structure can be higher than that of pixels in a bottom-emission structure because a transistor and the like can be provided so as to overlap with a light-emitting region of a light-emitting element in the top-emission structure.

All of the transistors 205D, 205R, 205G, and 205B are formed over the substrate 151. These transistors can be fabricated using the same material through the same process.

This embodiment describes an example where OS transistors are used as the transistors 205D, 205R, 205G, and 205B. The transistors of embodiments of the present invention can be used as the transistors 205D, 205R, 205G, and 205B. Here, an example is shown where the transistors 205R, 205G, and 205B each employ the structure in which two vertical transistors are connected in series. The transistors 205R, 205G, and 205B function as, for example, driving transistors for controlling current flowing through the light-emitting elements. In this example, a single vertical transistor is used as the transistor 205D. The transistor 205D constitutes part of the driver circuit.

As described above, the display device 50A includes the transistors of embodiments of the present invention in both the display portion 162 and the circuit portion 164. When the display portion 162 includes the transistor of one embodiment of the present invention, the pixel size can be reduced and high resolution can be achieved. When the circuit portion 164 includes the transistor of one embodiment of the present invention, the area occupied by the circuit portion 164 can be reduced and a narrower bezel can be achieved. The description in the above embodiment can be referred to for the transistor of one embodiment of the present invention.

Specifically, the transistors 205D, 205R, 205G, and 205B each include a conductive layer 104 functioning as a gate, an insulating layer 106 functioning as a gate insulating layer, a conductive layer 112*a* and a conductive layer 112*b* functioning as a source and a drain, a semiconductor layer 108 including a metal oxide, and an insulating layer 110 (insulating layers 110*a*, 110*b*, and 110*c*). Here, a plurality of layers obtained by processing the same conductive film are shown with the same hatching pattern. The insulating layer 110 is positioned between the conductive layer 112*a* and the semiconductor layer 108. The insulating layer 106 is positioned between the conductive layer 104 and the semiconductor layer 108.

Note that the transistor included in the display device of this embodiment is not limited to the transistor of one embodiment of the present invention. For example, the display device of this embodiment may include the transistor of one embodiment of the present invention and a transistor having another structure in combination.

The display device of this embodiment may include one or more of a planar transistor, a staggered transistor, and an inverted staggered transistor. A transistor included in the display device of this embodiment may have a top-gate structure or a bottom-gate structure. Gates may be provided above and below a semiconductor layer where a channel is formed.

Alternatively, a transistor using silicon in its channel formation region (a Si transistor) may be included in the display device of this embodiment.

Examples of silicon include single crystal silicon, polycrystalline silicon, and amorphous silicon. In particular, a transistor including LTPS in a semiconductor layer (hereinafter also referred to as an LTPS transistor) can be used. The LTPS transistor has high field-effect mobility and excellent frequency characteristics.

To increase the emission luminance of the light-emitting element included in the pixel circuit of the display device, it is necessary to increase the amount of current flowing through the light-emitting element. For this, it is necessary to increase the source-drain voltage of a driving transistor included in the pixel circuit. Since an OS transistor has a higher withstand voltage between the source and the drain than a Si transistor, a high voltage can be applied between the source and the drain of the OS transistor. Thus, with the use of an OS transistor as a driving transistor included in the pixel circuit, the amount of current flowing through the light-emitting element can be increased, resulting in an increase in emission luminance of the light-emitting element.

When transistors operate in a saturation region, a change in source-drain current relative to a change in gate-source voltage can be smaller in an OS transistor than in a Si transistor. Accordingly, when an OS transistor is used as the driving transistor included in the pixel circuit, current flowing between the source and the drain can be set minutely by a change in gate-source voltage; hence, the amount of current flowing through the light-emitting element can be controlled. Therefore, the number of gray levels in the pixel circuit can be increased.

As saturation characteristics of current flowing when the transistor operates in a saturation region, the OS transistor can make current (saturation current) flow more stably than the Si transistor even when the source-drain voltage gradually increases. Thus, with the use of an OS transistor as a driving transistor, current can be made to flow stably through the light-emitting element, for example, even when a variation in current-voltage characteristics of the EL element occurs. In other words, when the OS transistor operates in the saturation region, the source-drain current hardly changes with a change in the source-drain voltage; hence, the emission luminance of the light-emitting element can be stable.

The transistor included in the circuit portion 164 and the transistor included in the display portion 162 may have the same structure or different structures. One structure or two or more kinds of structures may be employed for a plurality of transistors included in the circuit portion 164. Similarly, one structure or two or more kinds of structures may be employed for a plurality of transistors included in the display portion 162.

All of the transistors included in the display portion 162 may be OS transistors or Si transistors. Alternatively, some of the transistors included in the display portion may be OS transistors and the others may be Si transistors.

For example, when both an LTPS transistor and an OS transistor are used in the display portion 162, the display device can have low power consumption and high drive capability. Note that a structure in which an LTPS transistor and an OS transistor are used in combination is referred to as LTPO in some cases. As a favorable example, a structure is given in which the OS transistor is used as a transistor functioning as a switch for controlling electrical continuity and discontinuity between wirings and the LTPS transistor is used as a transistor for controlling current.

For example, one transistor included in the display portion 162 functions as a transistor for controlling current flowing through the light-emitting element and can also be referred to as a driving transistor. One of a source and a drain of the driving transistor is electrically connected to the pixel electrode of the light-emitting element. An LTPS transistor is preferably used as the driving transistor. In that case, the amount of current flowing through the light-emitting element can be increased in the pixel circuit.

By contrast, another transistor included in the display portion 162 functions as a switch for controlling selection or non-selection of a pixel and can also be referred to as a selection transistor. A gate of the selection transistor is electrically connected to a gate line, and one of a source and a drain thereof is electrically connected to a source line (signal line). An OS transistor is preferably used as the selection transistor. Accordingly, the gray level of the pixel can be maintained even with an extremely low frame frequency (e.g., 1 fps or less); thus, power consumption can be reduced by stopping the driver in displaying a still image.

An insulating layer 218 is provided to cover the transistors 205D, 205R, 205G, and 205B and an insulating layer 235 is provided over the insulating layer 218.

The insulating layer 218 preferably functions as a protective layer of the transistors. A material through which impurities such as water and hydrogen are less likely to be diffused is preferably used for the insulating layer 218. This is because the insulating layer 218 can function as a barrier layer. Such a structure can effectively inhibit diffusion of impurities into the transistors from the outside and increase the reliability of the display device.

The insulating layer 218 preferably includes one or more inorganic insulating films. Examples of the inorganic insulating film include an oxide insulating film, a nitride insulating film, an oxynitride insulating film, and a nitride oxide insulating film. Specific examples of these inorganic insulating films are as described above.

The insulating layer 235 preferably has a function of a planarization layer, and an organic insulating film is suitably used. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins. Alternatively, the insulating layer may have a stacked-layer structure of an organic insulating film and an inorganic insulating film. The outermost layer of the insulating layer 235 preferably functions as an etching protective layer. Thus, the formation of a depression in the insulating layer can be inhibited in processing pixel electrodes 111R, 111G, and 111B, for example. Alternatively, a depression may be formed in the insulating layer 235 in processing the pixel electrodes 111R, 111G, and 111B, for example.

The light-emitting elements 130R, 130G, and 130B are provided over the insulating layer 235.

The light-emitting element 130R includes the pixel electrode 111R over the insulating layer 235, an EL layer 113R over the pixel electrode 111R, and a common electrode 115 over the EL layer 113R. The light-emitting element 130R illustrated in FIG. 16 emits red light (R). The EL layer 113R includes a light-emitting layer that emits red light.

In a similar manner, the light-emitting element 130G includes the pixel electrode 111G, an EL layer 113G, and the common electrode 115. The light-emitting element 130G emits green light (G) and the EL layer 113G includes a light-emitting layer that emits green light.

In a similar manner, the light-emitting element 130B includes the pixel electrode 111B, an EL layer 113B, and the common electrode 115. The light-emitting element 130B emits blue light (B) and the EL layer 113B includes a light-emitting layer that emits blue light.

Although the EL layers 113R, 113G, and 113B have the same thickness in FIG. 16, the present invention is not limited thereto. The EL layers 113R, 113G, and 113B may have different thicknesses. For example, the thickness is preferably set in accordance with an optical path length for intensifying light emitted from the EL layers 113R, 113G, and 113B. Thus, a microcavity structure is achieved, and the color purity of light emitted from each light-emitting element can be improved.

The pixel electrode 111R is electrically connected to the conductive layer 112*b* included in the transistor 205R through an opening provided in the insulating layers 106, 218, and 235. In a similar manner, the pixel electrode 111G is electrically connected to the conductive layer 112*b* included in the transistor 205G and the pixel electrode 111B is electrically connected to the conductive layer 112*b* included in the transistor 205B.

End portions of the pixel electrodes 111R, 111G, and 111B are covered with an insulating layer 237. The insulating layer 237 functions as a partition (also referred to as a bank or a spacer). The insulating layer 237 can have a single-layer structure or a stacked-layer structure including one or both of an inorganic insulating material and an organic insulating material. A material that can be used for the insulating layer 218 and a material that can be used for the insulating layer 235 can be used for the insulating layer 237, for example. The insulating layer 237 can electrically isolate the pixel electrode and the common electrode. Furthermore, the insulating layer 237 can electrically isolate light-emitting elements adjacent to each other.

The common electrode 115 is one continuous film shared by the light-emitting elements 130R, 130G, and 130B. The common electrode 115 shared by the plurality of light-emitting elements is electrically connected to a conductive layer 123 provided in the connection portion 140. The conductive layer 123 is preferably formed using a conductive layer formed using the same material through the same process as the pixel electrodes 111R, 111G, and 111B.

In the display device of one embodiment of the present invention, a conductive film that transmits visible light is used for the electrode through which light is extracted, which is either the pixel electrode or the common electrode. A conductive film reflecting visible light is preferably used for the electrode through which light is not extracted.

A conductive film that transmits visible light may be used also for the electrode through which light is not extracted. In that case, this electrode is preferably provided between the reflective layer and the EL layer. In other words, light emitted by the EL layer may be reflected by the reflective layer to be extracted from the display device.

As the material of the pair of electrodes of the light-emitting element, a metal, an alloy, an electrically conductive compound, a mixture thereof, and the like can be used as appropriate. Specific examples of the material include metals such as aluminum, magnesium, titanium, chromium, manganese, iron, cobalt, nickel, copper, gallium, zinc, indium, tin, molybdenum, tantalum, tungsten, palladium, gold, platinum, silver, yttrium, and neodymium, and an alloy containing any of these metals in appropriate combination. Other examples of the material include indium tin oxide (In—Sn oxide, also referred to as ITO), In—Si—Sn oxide (also referred to as ITSO), indium zinc oxide (In—Zn oxide), and In—W—Zn oxide. Other examples of the material include an alloy containing aluminum (aluminum alloy), such as an alloy of aluminum, nickel, and lanthanum (Al—Ni—La), and an alloy containing silver, such as an alloy of silver and magnesium and an alloy of silver, palladium, and copper (Ag—Pd—Cu, also referred to as APC). Other examples of the material include an element belonging to Group 1 or Group 2 of the periodic table that is not described above (e.g., lithium, cesium, calcium, or strontium), a rare earth metal such as europium or ytterbium, an alloy containing an appropriate combination of any of these elements, and graphene.

The light-emitting element preferably employs a microcavity structure. Therefore, one of the pair of electrodes of the light-emitting element is preferably an electrode having properties of transmitting and reflecting visible light (a transflective electrode), and the other is preferably an electrode having a property of reflecting visible light (a reflective electrode). When the light-emitting element has a microcavity structure, light obtained from the light-emitting layer can be resonated between the electrodes, whereby light emitted from the light-emitting element can be intensified.

The transparent electrode has a light transmittance higher than or equal to 40%. For example, an electrode having a visible light (light with wavelengths greater than or equal to 400 nm and less than 750 nm) transmittance higher than or equal to 40% is preferably used as the transparent electrode of the light-emitting element. The transflective electrode has a visible light reflectance higher than or equal to 10% and lower than or equal to 95%, preferably higher than or equal to 30% and lower than or equal to 80%. The reflective electrode has a visible light reflectance higher than or equal to 40% and lower than or equal to 100%, preferably higher than or equal to 70% and lower than or equal to 100%. These electrodes preferably have a resistivity lower than or equal to $1\times10^{-2}$ Ωcm.

The EL layers 113R, 113G, and 113B are each provided into an island shape. In FIG. 16, end portions of the EL layers 113R and 113G adjacent to each other overlap with each other, end portions of the EL layers 113G and 113B adjacent to each other overlap with each other, and end portions of the EL layers 113R and 113B adjacent to each other overlap with each other. When island-shaped EL layers are deposited using a fine metal mask, end portions of the EL layers adjacent to each other may overlap with each other as illustrated in FIG. 16; however, the present invention is not limited thereto. That is, it is also possible that the EL layers adjacent to each other do not overlap with each other and are apart from each other. It is also possible that the display device includes both a portion where the EL layers adjacent to each other overlap with each other and a portion where the EL layers adjacent to each other do not overlap with each other and are apart from each other.

Each of the EL layers 113R, 113G, and 113B includes at least a light-emitting layer. The light-emitting layer contains one or more kinds of light-emitting substances. As the light-emitting substance, a substance whose emission color is blue, violet, bluish violet, green, yellowish green, yellow, orange, red, or the like is appropriately used. Alternatively, as the light-emitting substance, a substance that emits near-infrared light can be used.

Examples of the light-emitting substance include a fluorescent material, a phosphorescent material, a TADF material, and a quantum dot material.

The light-emitting layer may contain one or more kinds of organic compounds (e.g., a host material or an assist material) in addition to the light-emitting substance (a guest material). As one or more kinds of organic compounds, one or both of a substance with a high hole-transport property (a hole-transport material) and a substance with a high electron-transport property (an electron-transport material) can be used. As the one or more kinds of organic compounds, a substance with a bipolar property (a substance with a high electron-transport property and a high hole-transport property) or a TADF material may be used.

The light-emitting layer preferably includes a phosphorescent material and a combination of a hole-transport material and an electron-transport material that easily forms an exciplex, for example. With such a structure, light emission can be efficiently obtained by exciplex-triplet energy transfer (ExTET), which is energy transfer from the exciplex to the light-emitting substance (the phosphorescent material). When a combination of materials is selected so as to form an exciplex that emits light whose wavelength overlaps with the wavelength of a lowest-energy-side absorption band of the light-emitting substance, energy can be transferred smoothly and light emission can be obtained efficiently. With this structure, high efficiency, low-voltage driving, and a long lifetime of the light-emitting element can be achieved at the same time.

In addition to the light-emitting layer, the EL layer can include one or more of a layer containing a substance having a high hole-injection property (a hole-injection layer), a layer containing a hole-transport material (a hole-transport layer), a layer containing a substance having a high electron-blocking property (an electron-blocking layer), a layer containing a substance having a high electron-injection property (an electron-injection layer), a layer containing an electron-transport material (an electron-transport layer), and a layer containing a substance having a high hole-blocking property (a hole-blocking layer). The EL layer may further include one or both of a bipolar material and a TADF material.

Either a low molecular compound or a high molecular compound can be used in the light-emitting element, and an inorganic compound may also be included. Each layer included in the light-emitting element can be formed by any of the following methods: an evaporation method (including a vacuum evaporation method), a transfer method, a printing method, an inkjet method, a coating method, and the like.

The light-emitting element may employ a single structure (a structure including only one light-emitting unit) or a tandem structure (a structure including a plurality of light-emitting units). The light-emitting unit includes at least one light-emitting layer. The tandem structure is a structure in which a plurality of light-emitting units are connected in series with a charge-generation layer therebetween. The charge-generation layer has a function of injecting electrons into one of the two light-emitting units and injecting holes to the other when voltage is applied between the pair of electrodes. A tandem structure enables a light-emitting element capable of emitting light with high luminance. Furthermore, the tandem structure allows the amount of current needed for obtaining the same luminance to be reduced as compared to the case of using a single structure, and thus can improve the reliability. The tandem structure may be referred to as a stack structure.

In the case of using a tandem light-emitting element in FIG. 16, for example, the EL layer 113R preferably includes a plurality of light-emitting units that emit red light, the EL layer 113G preferably includes a plurality of light-emitting units that emit green light, and the EL layer 113B preferably includes a plurality of light-emitting units that emit blue light.

A protective layer 131 is provided over the light-emitting elements 130R, 130G, and 130B. The protective layer 131 and the substrate 152 are bonded to each other with an adhesive layer 142. The substrate 152 is provided with a light-blocking layer 117. A solid sealing structure, a hollow sealing structure, or the like can be employed to seal the light-emitting elements. In FIG. 16, a solid sealing structure is employed, in which a space between the substrate 152 and the substrate 151 is filled with the adhesive layer 142. Alternatively, a hollow sealing structure may be employed, in which the space is filled with an inert gas (e.g., nitrogen or argon). In that case, the adhesive layer 142 may be provided not to overlap with the light-emitting element. Alternatively, the space may be filled with a resin other than the frame-like adhesive layer 142.

The protective layer 131 is provided at least in the display portion 162, and preferably provided to cover the entire display portion 162. The protective layer 131 is preferably provided to cover not only the display portion 162 but also the connection portion 140 and the circuit portion 164. It is further preferable that the protective layer be provided to extend to the end portion of the display device 50A. Meanwhile, a connection portion 204 has a portion not provided with the protective layer 131 so that the FPC 172 and the conductive layer 166 are electrically connected to each other.

By providing the protective layer 131 over the light-emitting elements 130R, 130G, and 130B, the reliability of the light-emitting element can be increased.

The protective layer 131 may have a single-layer structure or a stacked-layer structure including two or more layers. There is no limitation on the conductivity of the protective layer 131. As the protective layer 131, at least one type of insulating films, semiconductor films, and conductive films can be used.

The protective layer 131 including an inorganic film can inhibit deterioration of the light-emitting elements by preventing oxidation of the common electrode 115 and inhibiting entry of impurities (e.g., moisture and oxygen) into the light-emitting elements, for example; thus, the reliability of the display device can be improved.

For the protective layer 131, an inorganic insulating film such as an oxide insulating film, a nitride insulating film, an oxynitride insulating film, or a nitride oxide insulating film can be used, for example. Specific examples of these inorganic insulating films are as described above. In particular, the protective layer 131 preferably includes a nitride insulating film or a nitride oxide insulating film, and further preferably includes a nitride insulating film.

An inorganic film containing ITO, In—Zn oxide, Ga—Zn oxide, Al—Zn oxide, IGZO, or the like can be used for the protective layer 131. The inorganic film preferably has high resistance, specifically, higher resistance than the common electrode 115. The inorganic film may further contain nitrogen.

When light emitted from the light-emitting element is extracted through the protective layer 131, the protective layer 131 preferably has a high visible-light-transmitting property. For example, ITO, IGZO, and aluminum oxide are preferable because they are inorganic materials having a high visible-light-transmitting property.

The protective layer 131 can be, for example, a stack of an aluminum oxide film and a silicon nitride film over the aluminum oxide film, or a stack of an aluminum oxide film and an IGZO film over the aluminum oxide film. Such a stacked-layer structure can inhibit entry of impurities (e.g., water and oxygen) into the EL layer.

Furthermore, the protective layer 131 may include an organic film. For example, the protective layer 131 may include both an organic film and an inorganic film. Examples of an organic film that can be used for the protective layer 131 include organic insulating films that can be used for the insulating layer 235.

The connection portion 204 is provided in a region of the substrate 151 not overlapping with the substrate 152. In the connection portion 204, the wiring 165 is electrically connected to the FPC 172 through the conductive layer 166 and a connection layer 242. In this example, the wiring 165 is a single conductive layer obtained by processing the same conductive film as the conductive layer 112*b*. In this example, the conductive layer 166 is a single conductive layer obtained by processing the same conductive film as the pixel electrodes 111R, 111G, and 111B. On the top surface of the connection portion 204, the conductive layer 166 is exposed. Thus, the connection portion 204 and the FPC 172 can be electrically connected to each other through the connection layer 242.

The display device 50A has a top-emission structure. Light from the light-emitting element is emitted toward the substrate 152. For the substrate 152, a material having a high visible-light-transmitting property is preferably used. The pixel electrodes 111R, 111G, and 111B contain a material that reflects visible light, and the counter electrode (the common electrode 115) contains a material that transmits visible light.

The light-blocking layer 117 is preferably provided on the surface of the substrate 152 on the substrate 151 side. The light-blocking layer 117 can be provided over a region between adjacent light-emitting elements, in the connection portion 140, in the circuit portion 164, and the like.

A coloring layer such as a color filter may be provided on the surface of the substrate 152 on the substrate 151 side or over the protective layer 131. By providing the color filter so as to overlap with the light-emitting element, the color purity of light emitted from a pixel can be increased.

Moreover, a variety of optical members can be provided on the outside of the substrate 152 (the surface opposite to the substrate 151). Examples of the optical members include a polarizing plate, a retardation plate, a light diffusion layer (e.g., a diffusion film), an anti-reflective layer, and a light-condensing film. Furthermore, an antistatic film inhibiting the attachment of dust, a water repellent film inhibiting the attachment of stain, a hard coat film inhibiting generation of a scratch caused by the use, an impact-absorbing layer, or the like may be provided as a surface protective layer on the outer surface of the substrate 152. For example, it is preferable to provide, as the surface protective layer, a glass layer or a silica layer ($SiO_x$ layer) because the surface contamination or damage can be prevented. The surface protective layer may be formed using diamond like carbon (DLC), aluminum oxide ($AlO_x$), a polyester-based material, a polycarbonate-based material, or the like. For the surface protective layer, a material having a high transmitting property with respect to visible light is preferably used. The surface protective layer is preferably formed using a material with high hardness.

For each of the substrates 151 and 152, glass, quartz, ceramic, sapphire, a resin, a metal, an alloy, a semiconductor, or the like can be used. The substrate on the side from which light from the light-emitting element is extracted is formed using a material that transmits the light. When a flexible material is used for the substrates 151 and 152, the display device can have increased flexibility and a flexible display can be obtained. Furthermore, a polarizing plate may be used as at least one of the substrates 151 and 152.

For each of the substrates 151 and 152, any of the following can be used, for example: polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (e.g., nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber. Glass that is thin enough to have flexibility may be used as at least one of the substrates 151 and 152.

In the case where a circularly polarizing plate overlaps with the display device, a highly optically isotropic substrate is preferably used as the substrate included in the display device. A highly optically isotropic substrate has a low birefringence (in other words, a small amount of birefringence). Examples of the film having high optical isotropy include a triacetyl cellulose (TAC, also referred to as cellulose triacetate) film, a cycloolefin polymer (COP) film, a cycloolefin copolymer (COC) film, and an acrylic film.

For the adhesive layer 142, any of a variety of curable adhesives such as a reactive curable adhesive, a thermosetting curable adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. A two-component-mixture-type resin may be used. An adhesive sheet or the like may be used.

As the connection layer 242, an anisotropic conductive film (ACF), an anisotropic conductive paste (ACP), or the like can be used.

[Display Device 50B]

Figure 17:
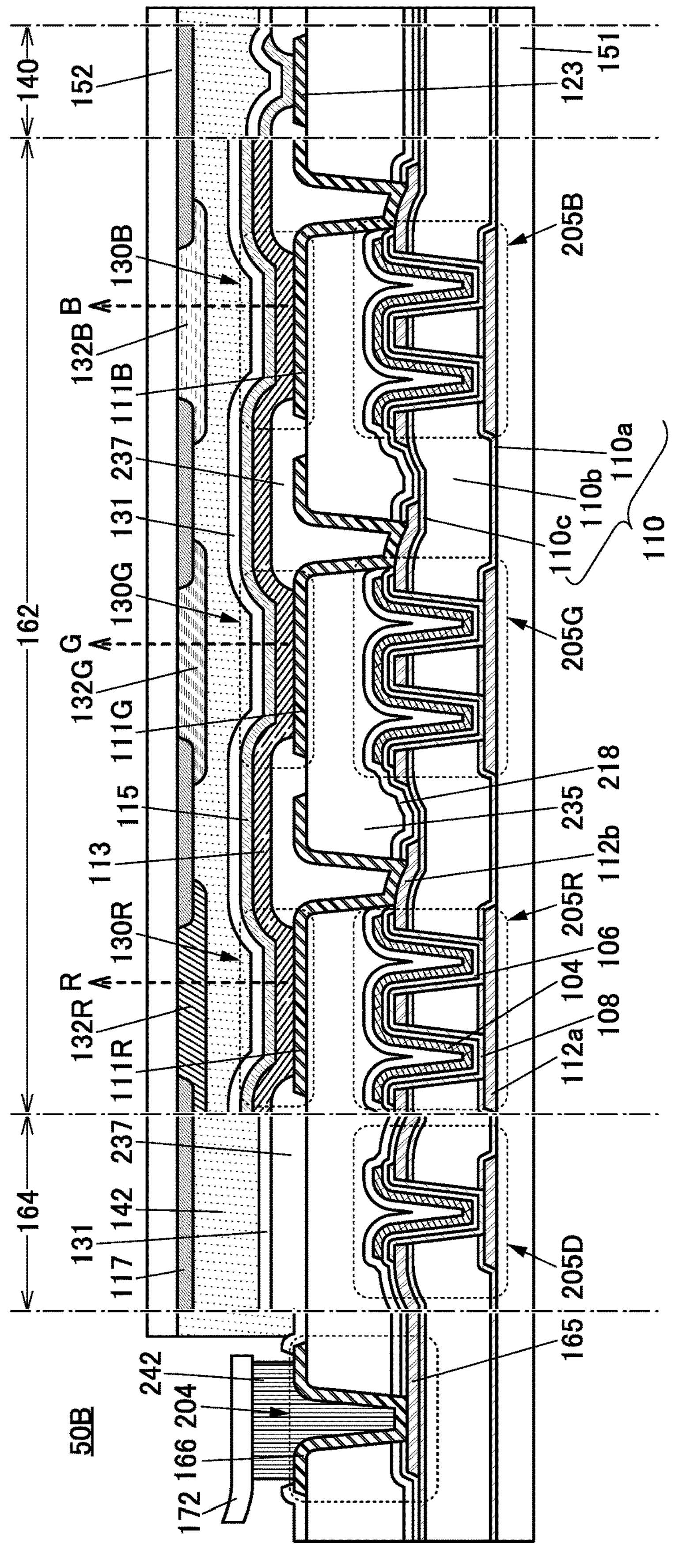
FIG. 17 illustrates a structure example of a display device.

A display device 50B illustrated in FIG. 17 is different from the display device 50A mainly in that the subpixels of different colors include respective coloring layers (color filters or the like) and an EL layer 113 shared between the light-emitting elements. Note that in the following description of display devices, the description of portions similar to those of the above-described display devices may be omitted.

In the display device 50B illustrated in FIG. 17, the transistors 205D, 205R, 205G, and 205B, the light-emitting elements 130R, 130G, and 130B, a coloring layer 132R transmitting red light, a coloring layer 132G transmitting green light, a coloring layer 132B transmitting blue light, and the like are provided between the substrates 151 and 152.

The light-emitting element 130R includes the pixel electrode 111R, the EL layer over the pixel electrode 111R, and the common electrode 115 over the EL layer 113. Light emitted from the light-emitting element 130R is extracted as red light to the outside of the display device 50B through the coloring layer 132R.

The light-emitting element 130G includes the pixel electrode 111G, the EL layer 113 over the pixel electrode 111G, and the common electrode 115 over the EL layer 113. Light emitted from the light-emitting element 130G is extracted as green light to the outside of the display device 50B through the coloring layer 132G.

The light-emitting element 130B includes the pixel electrode 111B, the EL layer over the pixel electrode 111B, and the common electrode 115 over the EL layer 113. Light emitted from the light-emitting element 130B is extracted as blue light to the outside of the display device 50B through the coloring layer 132B.

The EL layer 113 and the common electrode 115 are shared between the light-emitting elements 130R, 130G, and 130B. The number of manufacturing steps can be smaller in the case where the EL layer 113 is shared between the subpixels of different colors than the case where the subpixels of different colors include different EL layers.

The light-emitting elements 130R, 130G, and 130B illustrated in FIG. 17 emit white light, for example. When white light emitted from the light-emitting elements 130R, 130G, and 130B passes through the respective coloring layers 132R, 132G, and 132B, light of a desired color can be obtained.

In the case of employing a microcavity structure, the light-emitting elements 130R, 130G, and 130B each emit light with a specific wavelength, which is intensified, in white light emitted from the EL layer 113. Here, even with such a microcavity structure, a light-emitting element including an EL layer that emits white light is referred to as a white-light-emitting element.

In the light-emitting element that emits white light, two or more light-emitting layers are preferably included. When two light-emitting layers are used to obtain white light, two light-emitting layers that emit light of complementary colors are selected. For example, when the emission colors of the first light-emitting layer and the second light-emitting layer are made complementary, the light-emitting element can be configured to emit white light as a whole. In the case where three or more light-emitting layers are used to obtain white light, the light-emitting element is configured to emit white light as a whole by combining emission colors of the three or more light-emitting layers.

For example, the EL layer 113 preferably includes a light-emitting layer containing a light-emitting substance that emits blue light and a light-emitting layer containing a light-emitting substance that emits visible light having a longer wavelength than blue light. The EL layer 113 preferably includes a light-emitting layer that emits yellow light (Y) and a light-emitting layer that emits blue light, for example. Alternatively, the EL layer 113 preferably includes a light-emitting layer that emits red light, a light-emitting layer that emits green light, and a light-emitting layer that emits blue light, for example.

A light-emitting element that emits white light preferably has a tandem structure. Specific examples include a two-unit tandem structure including a light-emitting unit that emits yellow light and a light-emitting unit that emits blue light; a two-unit tandem structure including a light-emitting unit that emits red and green light and a light-emitting unit that emits blue light; a three-unit tandem structure including a light-emitting unit that emits blue light, a light-emitting unit that emits yellow, yellow-green, or green light, and a light-emitting unit that emits blue light in this order; and a three-unit tandem structure including a light-emitting unit that emits blue light, a light-emitting unit that emits yellow, yellow-green, or green light and red light, and a light-emitting unit that emits blue light in this order. Examples of the stacked structure of light-emitting units include, from an anode side, a two-unit structure of B and Y; a two-unit structure of B and a light-emitting unit X; a three-unit structure of B, Y, and B; and a three-unit structure of B, X, and B. Examples of the stacked structure of light-emitting layers in the light-emitting unit X include, from an anode side, a two-layer structure of R and Y; a two-layer structure of R and G; a two-layer structure of G and R; a three-layer structure of G, R, and G; and a three-layer structure of R, G, and R. Another layer may be provided between two light-emitting layers.

Alternatively, the light-emitting elements 130R, 130G, and 130B illustrated in FIG. 17 emit blue light, for example. In this case, the EL layer 113 includes one or more light-emitting layers that emit blue light. In the subpixel 11B that emits blue light, blue light emitted from the light-emitting element 130B can be extracted. In each of the subpixel 11R that emits red light and the subpixel 11G that emits green light, a color conversion layer is provided between the light-emitting element 130R or 130G and the substrate 152 so that blue light emitted from the light-emitting element 130R or 130G is converted into light with a longer wavelength, whereby red light or green light can be extracted. Furthermore, it is preferable that over the light-emitting element 130R, the coloring layer 132R be provided between the color conversion layer and the substrate 152 and over the light-emitting element 130G, the coloring layer 132G be provided between the color conversion layer and the substrate 152. In some cases, part of light emitted from the light-emitting element is transmitted through the color conversion layer without being converted. When light transmitted through the color conversion layer is extracted through the coloring layer, light other than light of the intended color can be absorbed by the coloring layer, and color purity of light exhibited by a subpixel can be improved.

[Display Device 50C]

Figure 18:
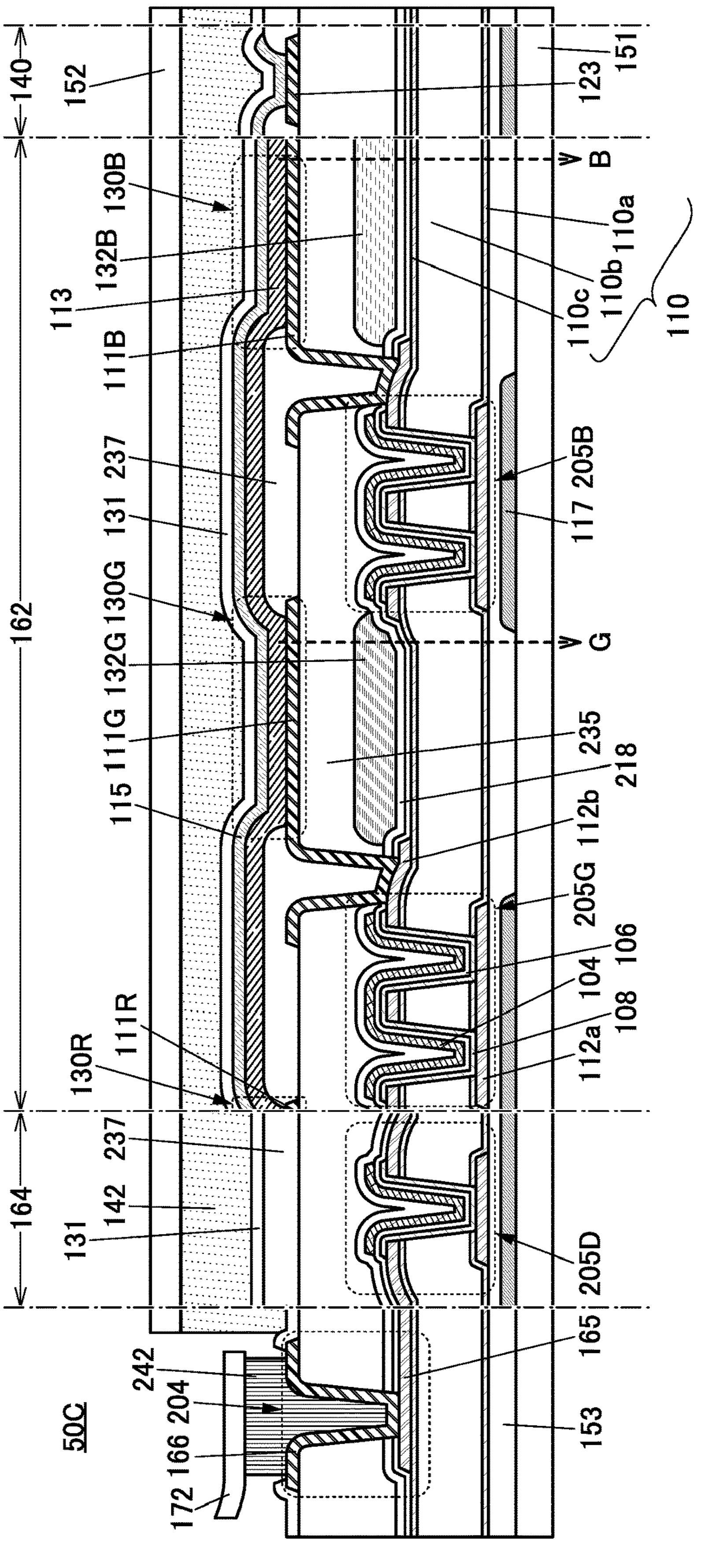
FIG. 18 illustrates a structure example of a display device.

A display device 50C illustrated in FIG. 18 is different from the display device 50B mainly in having a bottom-emission structure.

Light from the light-emitting element is emitted toward the substrate 151. For the substrate 151, a material having a high visible-light-transmitting property is preferably used. By contrast, there is no limitation on the light-transmitting property of a material used for the substrate 152.

The light-blocking layer 117 is preferably formed between the substrate 151 and the transistor. FIG. 18 illustrates an example where the light-blocking layers 117 are provided over the substrate 151, an insulating layer 153 is provided over the light-blocking layers 117, and the transistors 205D, 205R (not illustrated), 205G, and 205B and the like are provided over the insulating layer 153. In addition, the coloring layers 132R (not illustrated), 132G, and 132B are provided over the insulating layer 218 and the insulating layer 235 is provided over the coloring layers 132R (not illustrated), 132G, and 132B.

The light-emitting element 130R overlapping with the coloring layer 132R (not illustrated) includes the pixel electrode 111R, the EL layer 113, and the common electrode 115.

The light-emitting element 130G overlapping with the coloring layer 132G includes the pixel electrode 111G, the EL layer 113, and the common electrode 115.

The light-emitting element 130B overlapping with the coloring layer 132B includes the pixel electrode 111B, the EL layer 113, and the common electrode 115.

A material having a good property of transmitting visible light is used for each of the pixel electrodes 111R, 111G, and 111B. A material that reflects visible light is preferably used for the common electrode 115. In the display device having a bottom-emission structure, a metal or the like having low resistivity can be used for the common electrode 115; thus, a voltage drop due to the resistance of the common electrode 115 can be suppressed and the display quality can be improved.

The transistor of one embodiment of the present invention can be miniaturized and the area occupied by the transistor can be reduced, so that the aperture ratio of the pixel can be increased or the pixel size can be reduced in the display device having a bottom-emission structure.

[Display Device 50D]

Figure 19A:
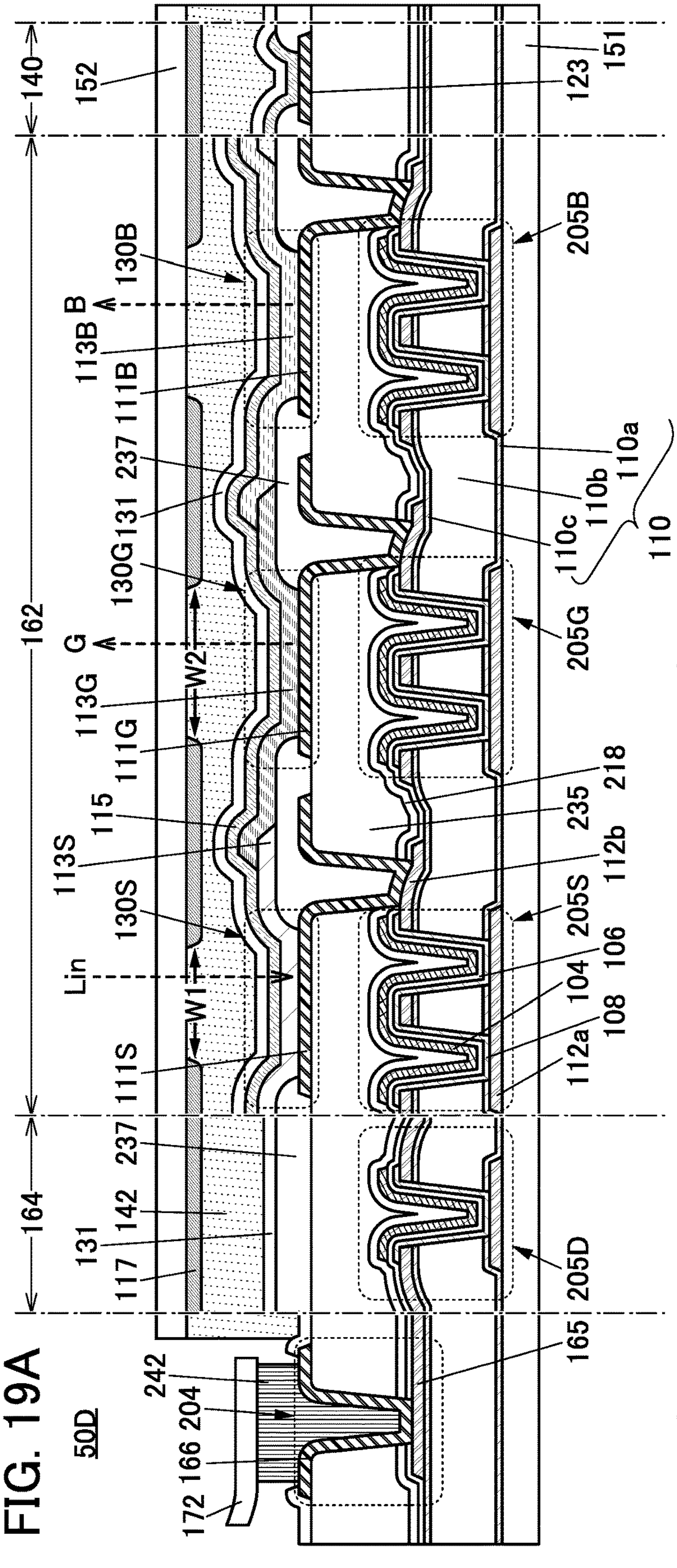
FIGS. 19A to 19C illustrate structure examples of a display device.

A display device 50D illustrated in FIG. 19A is different from the display device 50A mainly in including a light-receiving element 130S.

The display device 50D includes light-emitting elements and a light-receiving element in a pixel. In the display device 50D, organic EL elements are preferably used as the light-emitting elements and an organic photodiode is preferably used as the light-receiving element. The organic EL elements and the organic photodiodes can be formed over the same substrate. Thus, the organic photodiodes can be incorporated in a display device including the organic EL elements.

The display device 50D can detect the touch or approach of an object while displaying an image because the pixel includes the light-emitting element and the light-receiving element and thus has a light-receiving function. Accordingly, the display portion 162 has one or both of an image capturing function and a sensing function in addition to a function of displaying an image. For example, an image can be displayed by using all the subpixels included in the display device 50D; or light can be emitted by some of the subpixels as a light source, light can be detected by some other subpixels, and an image can be displayed by using the remaining subpixels.

Accordingly, a light-receiving portion and a light source do not need to be provided separately from the display device 50D; hence, the number of components of an electronic device can be reduced. For example, a biometric authentication device provided in the electronic device or a capacitive touch panel for scroll operation or the like is not necessarily provided separately. Thus, with the use of the display device 50D, the electronic device can be provided at lower manufacturing costs.

When the light-receiving elements are used as an image sensor, the display device 50D can capture an image using the light-receiving elements. For example, image capturing for personal authentication with the use of a fingerprint, a palm print, the iris, the shape of a blood vessel (including the shape of a vein and the shape of an artery), a face, or the like is possible by using the image sensor.

Moreover, the light-receiving element can be used in a touch sensor (also referred to as a direct touch sensor), a contactless sensor (also referred to as a hover sensor, a hover touch sensor, or a touchless sensor), or the like. The touch sensor can detect an object (e.g., a finger, a hand, or a pen) when the display device and the object come in direct contact with each other. Furthermore, the contactless sensor can detect the object even when the object is not in contact with the display device.

The light-receiving element 130S includes a pixel electrode 111S over the insulating layer 235, a functional layer 113S over the pixel electrode 111S, and the common electrode 115 over the functional layer 113S. The functional layer 113S is irradiated with light Lin coming from the outside of the display device 50D.

The pixel electrode 111S is electrically connected to the conductive layer 112*b* included in a transistor 205S through an opening provided in the insulating layers 106, 218, and 235.

An end portion of the pixel electrode 111S is covered with the insulating layer 237.

The common electrode 115 is one continuous film shared by the light-receiving element 130S and the light-emitting elements 130R (not illustrated), 130G, and 130B. The common electrode 115 shared by the light-emitting elements and the light-receiving element is electrically connected to the conductive layer 123 provided in the connection portion 140.

The functional layer 113S includes at least an active layer (also referred to as a photoelectric conversion layer). The active layer includes a semiconductor. Examples of the semiconductor include an inorganic semiconductor such as silicon and an organic semiconductor including an organic compound. This embodiment illustrates an example where an organic semiconductor is used as the semiconductor included in the active layer. The use of an organic semiconductor is preferable because the light-emitting layer and the active layer can be formed by the same method (e.g., a vacuum evaporation method) and thus the same manufacturing apparatus can be used.

In addition to the active layer, the functional layer 113S may further include a layer containing a substance having a high hole-transport property, a substance having a high electron-transport property, a substance having a bipolar property (a substance having a high electron- and hole-transport property), or the like. Without limitation to the above, the functional layer 113S may further include a substance having a high hole-injection property, a hole-blocking material, a substance having a high electron-injection property, an electron-blocking material, or the like. Layers other than the active layer in the light-receiving element can be formed using a material that can be used for the light-emitting element.

Either a low molecular compound or a high molecular compound can be used in the light-receiving element, and an inorganic compound may also be included. Each layer included in the light-receiving element can be formed by any of the following methods: an evaporation method (including a vacuum evaporation method), a transfer method, a printing method, an inkjet method, a coating method, and the like.

The display device including the light-receiving element 130S can be used as a display device with a touch sensor or a display device with a contactless sensor.

Figure 19B:
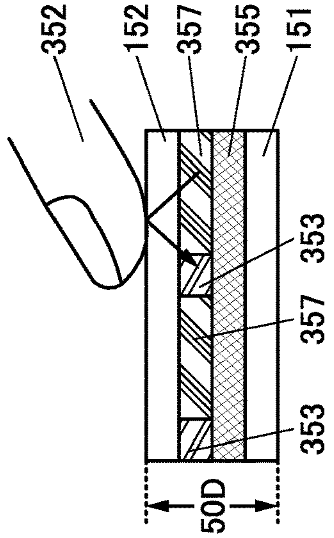
Figure 19C:
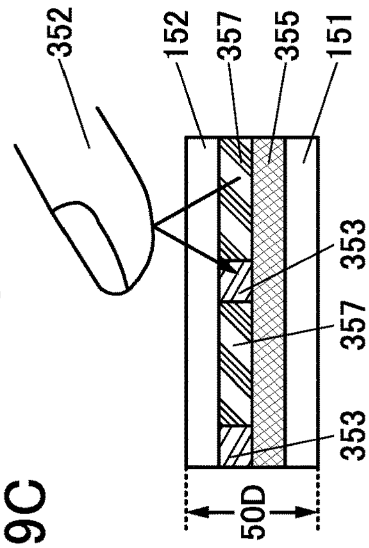

In the display device 50D illustrated in FIGS. 19B and 19C, a layer 353 including a light-receiving element, a circuit layer 355, and a layer 357 including a light-emitting element are provided between the substrates 151 and 152.

The layer 353 includes the light-receiving element 130S, for example. The layer 357 includes the light-emitting elements 130R, 130G, and 130B, for example.

The circuit layer 355 includes a circuit for driving a light-receiving element and a circuit for driving a light-emitting element. The circuit layer 355 includes the transistors 205R, 205G, and 205B, for example. The circuit layer 355 can further include one or more of a switch, a capacitor, a resistor, a wiring, a terminal, and the like.

FIG. 19B illustrates an example where the light-receiving element 130S is used as a touch sensor. Light emitted from the light-emitting element in the layer 357 is reflected by a finger 352 that touches the display device 50D as illustrated in FIG. 19B; then, the light-receiving element in the layer 353 senses the reflected light. Thus, the touch of the finger 352 on the display device 50D can be detected.

FIG. 19C illustrates an example where the light-receiving element 130S is used as a contactless sensor. Light emitted from the light-emitting element in the layer 357 is reflected by the finger 352 that is approaching (but is not touching) the display device 50D as illustrated in FIG. 19C; then, the light-receiving element in the layer 353 senses the reflected light.

[Display Device 50E]

Figure 20:
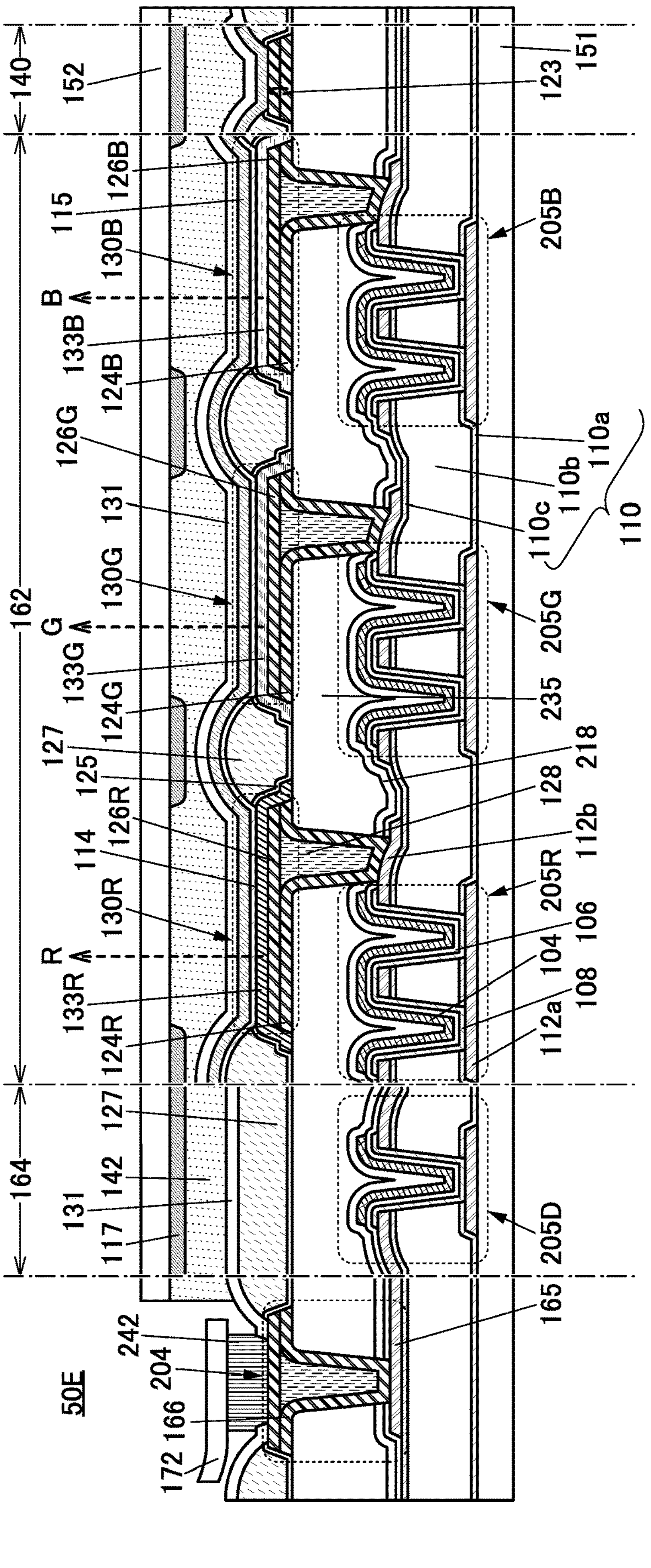
FIG. 20 illustrates a structure example of a display device.

A display device 50E illustrated in FIG. 20 is an example of a display device having a metal maskless (MML) structure. In other words, the display device 50E includes a light-emitting element that is formed without using a fine metal mask. The stacked-layer structure from the substrate 151 to the insulating layer 235 and the stacked-layer structure from the protective layer 131 to the substrate 152 are similar to those in the display device 50A; therefore, detailed description thereof is omitted.

In FIG. 20, the light-emitting elements 130R, 130G, and 130B are provided over the insulating layer 235.

The light-emitting element 130R includes a conductive layer 124R over the insulating layer 235, a conductive layer 126R over the conductive layer 124R, a layer 133R over the conductive layer 126R, a common layer 114 over the layer 133R, and the common electrode 115 over the common layer 114. The light-emitting element 130R illustrated in FIG. 20 emits red light (R). The layer 133R includes a light-emitting layer that emits red light. In the light-emitting element 130R, the layer 133R and the common layer 114 can be collectively referred to as an EL layer. One or both of the conductive layer 124R and the conductive layer 126R can be referred to as a pixel electrode.

The light-emitting element 130G includes a conductive layer 124G over the insulating layer 235, a conductive layer 126G over the conductive layer 124G, a layer 133G over the conductive layer 126G, the common layer 114 over the layer 133G, and the common electrode 115 over the common layer 114. The light-emitting element 130G illustrated in FIG. 20 emits green light (G). The layer 133G includes a light-emitting layer that emits green light. In the light-emitting element 130G, the layer 133G and the common layer 114 can be collectively referred to as an EL layer. One or both of the conductive layer 124G and the conductive layer 126G can be referred to as a pixel electrode.

The light-emitting element 130B includes a conductive layer 124B over the insulating layer 235, a conductive layer 126B over the conductive layer 124B, a layer 133B over the conductive layer 126B, the common layer 114 over the layer 133B, and the common electrode 115 over the common layer 114. The light-emitting element 130B illustrated in FIG. 20 emits blue light (B). The layer 133B includes a light-emitting layer that emits blue light. In the light-emitting element 130B, the layer 133B and the common layer 114 can be collectively referred to as an EL layer. One or both of the conductive layer 124B and the conductive layer 126B can be referred to as a pixel electrode.

In this specification and the like, in the EL layers included in the light-emitting elements, the island-shaped layer provided in each light-emitting element is referred to as the layer 133B, the layer 133G, or the layer 133R, and the layer shared by the plurality of light-emitting elements is referred to as the common layer 114. Note that in this specification and the like, only the layers 133R, 133G, and 133B are sometimes referred to as island-shaped EL layers, EL layers formed in an island shape, or the like, in which case the common layer 114 is not included in the EL layer.

The layers 133R, 133G, and 133B are isolated from each other. When the EL layer is provided in an island shape for each light-emitting element, leakage current between adjacent light-emitting elements can be inhibited. This can prevent crosstalk due to unintended light emission, so that a display device with extremely high contrast can be obtained.

Although the layers 133R, 133G, and 133B have the same thickness in FIG. 20, the present invention is not limited thereto. The layers 133R, 133G, and 133B may have different thicknesses.

The conductive layer 124R is electrically connected to the conductive layer 112*b* included in the transistor 205R through an opening provided in the insulating layers 106, 218, and 235. In a similar manner, the conductive layer 124G is electrically connected to the conductive layer 112*b* included in the transistor 205G and the conductive layer 124B is electrically connected to the conductive layer 112*b* included in the transistor 205B.

The conductive layers 124R, 124G, and 124B are formed to cover the openings provided in the insulating layer 235. A layer 128 is embedded in the depression of the conductive layers 124R, 124G, and 124B.

The layer 128 has a function of filling the depressions formed by the conductive layers 124R, 124G, and 124B. The conductive layers 126R, 126G, and 126B electrically connected to the conductive layers 124R, 124G, and 124B, respectively, are provided over the conductive layers 124R, 124G, and 124B and the layer 128. Thus, regions overlapping with the depressions of the conductive layers 124R, 124G, and 124B can also be used as the light-emitting regions, increasing the aperture ratio of the pixels. The conductive layer 124R and the conductive layer 126R each preferably include a conductive layer functioning as a reflective electrode.

The layer 128 may be an insulating layer or a conductive layer. Any of a variety of inorganic insulating materials, organic insulating materials, and conductive materials can be used for the layer 128 as appropriate. Specifically, the layer 128 is preferably formed using an insulating material and is particularly preferably formed using an organic insulating material. For the layer 128, an organic insulating material that can be used for the insulating layer 237 can be used, for example.

Although FIG. 20 illustrates an example where a top surface of the layer 128 includes a flat portion, the shape of the layer 128 is not particularly limited. The top surface of the insulating layer 128 may include at least one of a convex surface, a concave surface, and a flat surface.

The level of the top surface of the layer 128 and the level of the top surface of the conductive layer 124R may be the same or substantially the same, or may be different from each other. For example, the level of the top surface of the layer 128 may be either lower or higher than the level of the top surface of the conductive layer 124R.

An end portion of the conductive layer 126R may be aligned with an end portion of the conductive layer 124R or may cover a side surface of the end portion of the conductive layer 124R. The end portions of the conductive layers 124R and 126R each preferably have a tapered shape. Specifically, the end portions of the conductive layers 124R and 126R each preferably have a tapered shape with a taper angle less than 90°. In the case where the end portions of the pixel electrodes have a tapered shape, the layer 133R provided along side surfaces of the pixel electrodes has an inclined portion. When the side surface of the pixel electrode has a tapered shape, coverage with an EL layer provided along the side surface of the pixel electrode can be improved.

Since the conductive layers 124G and 126G and the conductive layers 124B and 126B are similar to the conductive layers 124R and 126R, the detailed description thereof is omitted.

The top and side surfaces of the conductive layer 126R are covered with the layer 133R. Similarly, the top and side surfaces of the conductive layers 126G are covered with the layer 133G, and the top and side surfaces of the conductive layers 126B are covered with the layer 133B. Accordingly, regions provided with the conductive layers 126R, 126G, and 126B can be entirely used as the light-emitting regions of the light-emitting elements 130R, 130G, and 130B, thereby increasing the aperture ratio of the pixels.

The side surface and part of the top surface of each of the layers 133R, 133G, and 133B are covered with the insulating layers 125 and 127. The common layer 114 is provided over the layers 133R, 133G, and 133B and the insulating layers 125 and 127, and the common electrode 115 is provided over the common layer 114. The common layer 114 and the common electrode 115 are each one continuous film shared by a plurality of light-emitting elements.

In FIG. 20, the insulating layer 237 illustrated in FIG. 16 or the like is not provided between the conductive layer 126R and the layer 133R. That is, an insulating layer (also referred to as a partition wall, a bank, a spacer, or the like) covering and in contact with a top end portion of the pixel electrode is not provided in the display device 50E. Thus, the interval between adjacent light-emitting elements can be extremely shortened. Accordingly, the display device can have high resolution or high definition. In addition, a mask for forming the insulating layer is not needed, which leads to a reduction in manufacturing cost of the display device.

As described above, the layers 133R, 133G, and 133B each include the light-emitting layer. The layers 133R, 133G, and 133B each preferably include the light-emitting layer and a carrier-transport layer (an electron-transport layer or a hole-transport layer) over the light-emitting layer. Alternatively, the layers 133R, 133G, and 133B each preferably include a light-emitting layer and a carrier-blocking layer (a hole-blocking layer or an electron-blocking layer) over the light-emitting layer. Alternatively, the layers 133R, 133G, and 133B each preferably include a light-emitting layer, a carrier-blocking layer over the light-emitting layer, and a carrier-transport layer over the carrier-blocking layer. Since the surfaces of the layers 133R, 133G, and 133B are exposed in the manufacturing process of the display device, providing one or both of the carrier-transport layer and the carrier-blocking layer over the light-emitting layer inhibits the light-emitting layer from being exposed on the outermost surface, so that damage to the light-emitting layer can be reduced. Thus, the reliability of the light-emitting element can be increased.

The common layer 114 includes, for example, an electron-injection layer or a hole-injection layer. Alternatively, the common layer 114 may be a stack of an electron-transport layer and an electron-injection layer, or may be a stack of a hole-transport layer and a hole-injection layer. The common layer 114 is shared by the light-emitting elements 130R, 130G, and 130B.

Side surfaces of the layers 133R, 133G, and 133B are each covered with the insulating layer 125. The insulating layer 127 covers the side surfaces of the layers 133R, 133G, and 133B with the insulating layer 125 therebetween.

The side surfaces (and part of the top surfaces) of the layers 133R, 133G, and 133B are covered with at least one of the insulating layer 125 and the insulating layer 127, so that the common layer 114 (or the common electrode 115) can be inhibited from being in contact with the side surfaces of the pixel electrodes and the layers 133R, 133G, and 133B, leading to inhibition of a short circuit of the light-emitting elements. Thus, the reliability of the light-emitting element can be increased.

The insulating layer 125 is preferably in contact with the side surfaces of the layers 133R, 133G, and 133B. The insulating layer 125 in contact with the layers 133R, 133G, and 133B can prevent film separation of the layers 133R, 133G, and 133B, whereby the reliability of the light-emitting element can be increased.

The insulating layer 127 is provided over the insulating layer 125 to fill a depression formed by the insulating layer 125. The insulating layer 127 preferably covers at least part of the side surface of the insulating layer 125.

The insulating layers 125 and 127 can fill a gap between adjacent island-shaped layers; hence, extreme unevenness of the formation surface of the layers (e.g., the carrier-injection layer and the common electrode) provided over the island-shaped layers can be reduced, and the formation surface can be made flatter. Consequently, coverage with the carrier-injection layer, the common electrode, and the like can be improved.

The common layer 114 and the common electrode 115 are provided over the layer 133R, the layer 133G, the layer 133B, the insulating layer 125, and the insulating layer 127. Before the insulating layer 125 and the insulating layer 127 are provided, a step is generated due to a difference between a region where the pixel electrode and the island-shaped EL layer are provided and a region where neither the pixel electrode nor the island-shaped EL layer is provided (region between the light-emitting elements). In the display device of one embodiment of the present invention, the step can be planarized with the insulating layer 125 and the insulating layer 127, and the coverage with the common layer 114 and the common electrode 115 can be improved. Thus, connection defects caused by step disconnection can be inhibited. In addition, an increase in electric resistance, which is caused by local thinning of the common electrode 115 due to the level difference, can be inhibited.

For example, the top surface of the insulating layer 127 preferably has a smooth shape with high flatness. The top surface of the insulating layer 127 may include at least one of a flat surface, a convex surface, and a concave surface. For example, the top surface of the insulating layer 127 preferably has a smooth convex shape with high flatness.

The insulating layer 125 can be formed using an inorganic material. As the insulating layer 125, an inorganic insulating film such as an oxide insulating film, a nitride insulating film, an oxynitride insulating film, or a nitride oxide insulating film can be used, for example. Specific examples of these inorganic insulating films are as described above. The insulating layer 125 may have a single-layer structure or a stacked-layer structure. In particular, aluminum oxide is preferably used because it has high selectivity with respect to the EL layer in etching and has a function of protecting the EL layer in forming the insulating layer 127 which is to be described later. In particular, when an inorganic insulating film such as an aluminum oxide film, a hafnium oxide film, or a silicon oxide film is formed by an ALD method as the insulating layer 125, the insulating layer 125 can have few pinholes and an excellent function of protecting the EL layer. The insulating layer 125 may have a stacked-layer structure of a film formed by an ALD method and a film formed by a sputtering method. The insulating layer 125 may have a stacked-layer structure of an aluminum oxide film formed by an ALD method and a silicon nitride film formed by a sputtering method, for example.

The insulating layer 125 preferably has a function of a barrier insulating layer against at least one of water and oxygen. The insulating layer 125 preferably has a function of inhibiting diffusion of at least one of water and oxygen. Alternatively, the insulating layer 125 preferably has a function of capturing or fixing (also referred to as gettering) at least one of water and oxygen.

Note that in this specification and the like, a barrier insulating layer refers to an insulating layer having a barrier property. A barrier property in this specification and the like means a function of inhibiting diffusion of a particular substance (also referred to as a function of less easily transmitting the substance). Alternatively, a barrier property refers to a function of capturing or fixing (also referred to as gettering) a particular sub stance.

When the insulating layer 125 has a function of the barrier insulating layer or a gettering function, entry of impurities (typically, at least one of water and oxygen) that would be diffused into the light-emitting elements from the outside can be inhibited. With this structure, a highly reliable light-emitting element and a highly reliable display device can be provided.

The insulating layer 125 preferably has a low impurity concentration. Accordingly, degradation of the EL layer, which is caused by entry of impurities into the EL layer from the insulating layer 125, can be inhibited. In addition, when the impurity concentration is reduced in the insulating layer 125, a barrier property against at least one of water and oxygen can be increased. For example, one or both of the hydrogen concentration and the carbon concentration in the insulating layer 125 are preferably sufficiently low.

The insulating layer 127 provided over the insulating layer 125 has a function of filling extreme unevenness of the insulating layer 125, which is formed between the adjacent light-emitting elements. In other words, the insulating layer 127 has an effect of improving the planarity of the formation surface of the common electrode 115.

As the insulating layer 127, an insulating layer containing an organic material can be favorably used. As the organic material, a photosensitive organic resin is preferably used, and for example, a photosensitive resin composite containing an acrylic resin is preferably used. Note that in this specification and the like, an acrylic resin refers to not only a polymethacrylic acid ester or a methacrylic resin, but also all the acrylic polymer in a broad sense in some cases.

Alternatively, the insulating layer 127 may be formed using an acrylic resin, a polyimide resin, an epoxy resin, an imide resin, a polyamide resin, a polyimide-amide resin, a silicone resin, a siloxane resin, a benzocyclobutene-based resin, a phenol resin, precursors of these resins, or the like. The insulating layer 127 may be formed using an organic material such as polyvinyl alcohol (PVA), polyvinyl butyral, polyvinylpyrrolidone, polyethylene glycol, polyglycerin, pullulan, water-soluble cellulose, or an alcohol-soluble polyamide resin. A photoresist may be used as the photosensitive organic resin. As the photosensitive organic resin, either a positive-type material or a negative-type material may be used.

The insulating layer 127 may be formed using a material absorbing visible light. When the insulating layer 127 absorbs light emitted from the light-emitting element, light leakage (stray light) from the light-emitting element to the adjacent light-emitting element through the insulating layer 127 can be suppressed. Thus, the display quality of the display device can be improved. Since no polarizing plate is required to improve the display quality of the display device, the weight and thickness of the display device can be reduced.

Examples of the material absorbing visible light include materials containing pigment of black or the like, materials containing dye, light-absorbing resin materials (e.g., polyimide), and resin materials that can be used for color filters (color filter materials). Using the resin material composed of stacked color filter materials of two or three or more colors is particularly preferred, in which case the effect of blocking visible light is enhanced. In particular, mixing color filter materials of three or more colors enables the formation of a black or nearly black resin layer.

[Display Device 50F]

Figure 21:
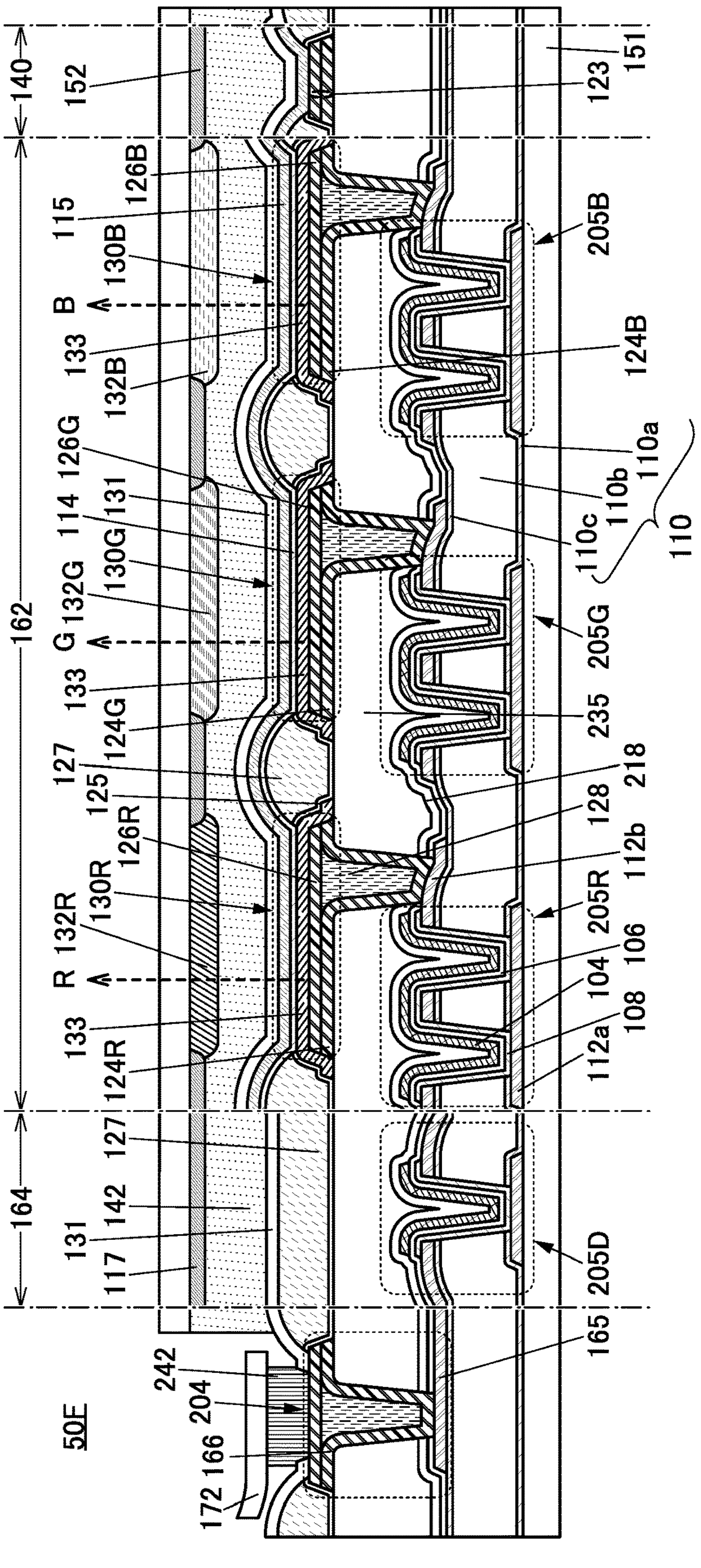
FIG. 21 illustrates a structure example of a display device.

A display device 50F illustrated in FIG. 21 is different from the display device 50E mainly in that the subpixels of different colors include respective coloring layers (color filters or the like) and respective layers 133 in the light-emitting elements.

In the display device 50F illustrated in FIG. 21, the transistors 205D, 205R, 205G, and 205B, the light-emitting elements 130R, 130G, and 130B, the coloring layer 132R transmitting red light, the coloring layer 132G transmitting green light, the coloring layer 132B transmitting blue light, and the like are provided between the substrates 151 and 152.

Light emitted from the light-emitting element 130R is extracted as red light to the outside of the display device 50F through the coloring layer 132R. Similarly, light emitted from the light-emitting element 130G is extracted as green light to the outside of the display device 50F through the coloring layer 132G. Light emitted from the light-emitting element 130B is extracted as blue light to the outside of the display device 50F through the coloring layer 132B.

The light-emitting elements 130R, 130G, and 130B each include the layer 133. The three layers 133 are formed using the same process and the same material. The three layers 133 are isolated from each other. When the EL layer is provided in an island shape for each light-emitting element, leakage current between adjacent light-emitting elements can be inhibited. This can prevent crosstalk due to unintended light emission, so that a display device with extremely high contrast can be obtained.

The light-emitting elements 130R, 130G, and 130B illustrated in FIG. 21 emit white light, for example. When white light emitted from the light-emitting elements 130R, 130G, and 130B passes through the respective coloring layers 132R, 132G, and 132B, light of a desired color can be obtained.

Alternatively, the light-emitting elements 130R, 130G, and 130B illustrated in FIG. 21 emit blue light, for example. In this case, the layer 133 includes one or more light-emitting layers that emit blue light. In the subpixel 11B that emits blue light, blue light emitted from the light-emitting element 130B can be extracted. In each of the subpixel 11R that emits red light and the subpixel 11G that emits green light, a color conversion layer is provided between the light-emitting element 130R or 130G and the substrate 152 so that blue light emitted from the light-emitting element 130R or 130G is converted into light with a longer wavelength, whereby red light or green light can be extracted. Furthermore, it is preferable that over the light-emitting element 130R, the coloring layer 132R be provided between the color conversion layer and the substrate 152 and over the light-emitting element 130G, the coloring layer 132G be provided between the color conversion layer and the substrate 152. When light transmitted through the color conversion layer is extracted through the coloring layer, light other than light of the intended color can be absorbed by the coloring layer, and color purity of light exhibited by a subpixel can be improved.

[Display Device 50G]

Figure 22:
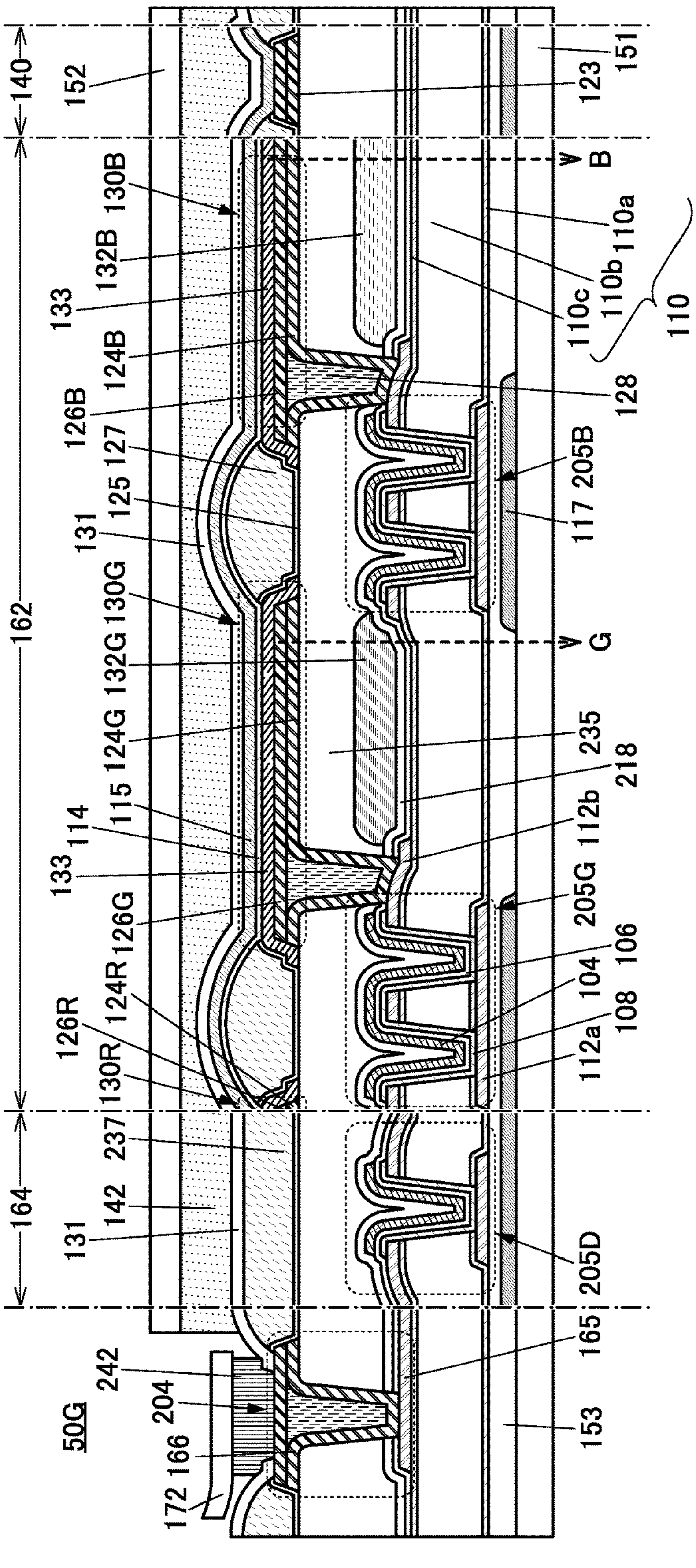
FIG. 22 illustrates a structure example of a display device.

A display device 50G illustrated in FIG. 22 is different from the display device 50F mainly in having a bottom-emission structure.

Light from the light-emitting element is emitted toward the substrate 151. For the substrate 151, a material having a high visible-light-transmitting property is preferably used. By contrast, there is no limitation on the light-transmitting property of a material used for the substrate 152.

The light-blocking layer 117 is preferably formed between the substrate 151 and the transistor. FIG. 22 illustrates an example where the light-blocking layers 117 are provided over the substrate 151, the insulating layer 153 is provided over the light-blocking layers 117, and the transistors 205D, 205R (not illustrated), 205G, and 205B and the like are provided over the insulating layer 153. In addition, the coloring layers 132R (not illustrated), 132G, and 132B are provided over the insulating layer 218 and the insulating layer 235 is provided over the coloring layers 132R (not illustrated), 132G, and 132B.

The light-emitting element 130R overlapping with the coloring layer 132R (not illustrated) includes the conductive layer 124R, the conductive layer 126R, the EL layer 113, the common layer 114, and the common electrode 115.

The light-emitting element 130G overlapping with the coloring layer 132G includes the conductive layer 124G, the conductive layer 126G, the EL layer 113, the common layer 114, and the common electrode 115.

The light-emitting element 130B overlapping with the coloring layer 132B includes the conductive layer 124B, the conductive layer 126B, the EL layer 113, the common layer 114, and the common electrode 115.

A material having a good property of transmitting visible light is used for each of the conductive layers 124R, 124G, 124B, 126R, 126G, and 126B. A material that reflects visible light is preferably used for the common electrode 115. In the display device having a bottom-emission structure, a metal or the like having low resistivity can be used for the common electrode 115; thus, a voltage drop due to the resistance of the common electrode 115 can be suppressed and the display quality can be improved.

The transistor of one embodiment of the present invention can be miniaturized and the area occupied by the transistor can be reduced, so that the aperture ratio of the pixel can be increased or the pixel size can be reduced in the display device having a bottom-emission structure.

Manufacturing Method Example of Display Device

An example of a method for manufacturing a display device having an MML structure will be described below with reference to FIGS. 23A to 23F. Here, steps of fabricating light-emitting elements without using a fine metal mask will be described in detail. FIGS. 23A to 23F are cross-sectional views of three light-emitting elements included in the display portion 162 and the connection portion 140 in the fabrication steps.

For fabrication of the light-emitting element, a vacuum process such as an evaporation method and a solution process such as a spin coating method or an inkjet method can be used. Examples of an evaporation method include physical vapor deposition methods (PVD methods) such as a sputtering method, an ion plating method, an ion beam evaporation method, a molecular beam evaporation method, and a vacuum evaporation method, and a chemical vapor deposition method (CVD method). Specifically, functional layers (e.g., a hole-injection layer, a hole-transport layer, a hole-blocking layer, a light-emitting layer, an electron-blocking layer, an electron-transport layer, an electron-injection layer, and a charge-generation layer) included in the EL layer can be formed by an evaporation method (e.g., a vacuum evaporation method), a coating method (e.g., a dip coating method, a die coating method, a bar coating method, a spin coating method, or a spray coating method), a printing method (e.g., an inkjet method, screen printing (stencil), offset printing (planography), flexography (relief printing), gravure printing, or micro-contact printing), or the like.

In the method described below for manufacturing the display device, the island-shaped layer (the layer including the light-emitting layer) is formed not by using a fine metal mask but by processing a light-emitting layer deposited on the entire surface with a photolithography method. Accordingly, a high-resolution display device or a display device with a high aperture ratio, which has been difficult to be formed so far, can be achieved. Moreover, light-emitting layers can be formed separately for the respective colors, enabling the display device to perform extremely clear display with high contrast and high display quality. Moreover, providing a sacrificial layer over the light-emitting layer can reduce damage to the light-emitting layer in the manufacturing process of the display device, resulting in an increase in reliability of the light-emitting element.

For example, in the case where the display device includes three kinds of light-emitting elements, which are a light-emitting element that emits blue light, a light-emitting element that emits green light, and a light-emitting element that emits red light, three kinds of island-shaped light-emitting layers can be formed by depositing a light-emitting layer and performing processing three times by photolithography.

Figure 23A:
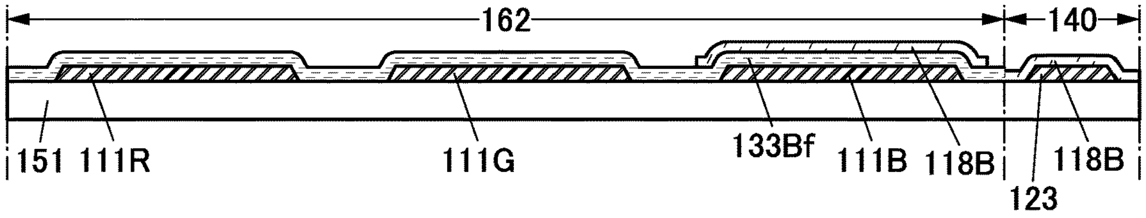
FIGS. 23A to 23F illustrate a method for manufacturing a display device.

First, the pixel electrodes 111R, 111G, and 111B and the conductive layer 123 are formed over the substrate 151 provided with the transistors 205R, 205G, and 205B and the like (not illustrated) (FIG. 23A).

A conductive film to be the pixel electrodes can be formed by a sputtering method or a vacuum evaporation method, for example. A resist mask is formed over the conductive film by a photolithography process, and then the conductive film is processed, whereby the pixel electrodes 111R, 111G, and 111B and the conductive layer 123 can be formed. The conductive film can be processed by a wet etching method and/or a dry etching method.

Next, a film 133Bf to be the layer 133B later is formed over the pixel electrodes 111R, 111G, and 111B (FIG. 23A). The film 133Bf (to be the layer 133B later) includes a light-emitting layer that emits blue light.

In an example described in this embodiment, an island-shaped EL layer included in the light-emitting element that emits blue light is formed first, and then island-shaped EL layers included in the light-emitting elements that emit light of the other colors are formed.

In the formation process of the island-shaped EL layers, the pixel electrode of the light-emitting element of the color formed second or later is sometimes damaged by the preceding step. In this case, the driving voltage of the light-emitting element of the color formed second or later might be high.

In view of this, in manufacture of the display device of one embodiment of the present invention, it is preferable that an island-shaped EL layer of a light-emitting element that emits light with the shortest wavelength (e.g., the blue-light-emitting element) be formed first. For example, it is preferable that the island-shaped EL layers be formed for the blue-, green-, and red-light-emitting elements in this order or the blue-, red-, and green-light-emitting elements in this order.

This enables the blue-light-emitting element to keep the favorable state of the interface between the pixel electrode and the EL layer and to be inhibited from having an increased driving voltage. In addition, the blue-light-emitting element can have a longer lifetime and higher reliability. Note that the red-light-emitting element and the green-light-emitting element have a smaller increase in driving voltage or the like than the blue-light-emitting element, resulting in a lower driving voltage and higher reliability of the whole display device.

Note that the formation order of the island-shaped EL layers is not limited to the above; for example, the island-shaped EL layers may be formed for the red-, green-, and blue-light-emitting elements in this order.

As illustrated in FIG. 23A, the film 133Bf is not formed over the conductive layer 123. The film 133Bf can be deposited only in a desired region using an area mask, for example. Employing a deposition step using an area mask and a processing step using a resist mask enables a light-emitting element to be fabricated by a relatively easy process.

The upper temperature limit of the compounds contained in the film 133Bf is preferably higher than or equal to 100° C. and lower than or equal to 180° C., further preferably higher than or equal to 120° C. and lower than or equal to 180° C., still further preferably higher than or equal to 140° C. and lower than or equal to 180° C. Thus, the reliability of the light-emitting element can be increased. In addition, the upper limit of the temperature that can be applied in the manufacturing process of the display device can be increased. Therefore, the range of choices of the materials and the manufacturing method of the display device can be widened, thereby improving the manufacturing yield and the reliability.

Examples of the upper temperature limit include the glass transition point, the softening point, the melting point, the thermal decomposition temperature, and the 5% weight loss temperature, and the lowest one among the temperatures is preferable.

The film 133Bf can be formed by an evaporation method, specifically a vacuum evaporation method, for example. The film 133Bf may be formed by a transfer method, a printing method, an inkjet method, a coating method, or the like.

Next, a sacrificial layer 118B is formed over the film 133Bf and the conductive layer 123 (FIG. 23A). A resist mask is formed over a film to be the sacrificial layer 118B by a photolithography process, and then the film is processed, whereby the sacrificial layer 118B can be formed.

Providing the sacrificial layer 118B over the film 133Bf can reduce damage to the film 133Bf in the manufacturing process of the display device, resulting in an increase in reliability of the light-emitting element.

The sacrificial layer 118B is preferably provided to cover the end portions of the pixel electrodes 111R, 111G, and 111B. Accordingly, an end portion of the layer 133B formed in a later step is positioned outward from the end portion of the pixel electrode 111B. The entire top surface of the pixel electrode 111B can be used as a light-emitting region, so that the aperture ratio of the pixel can be increased. The end portion of the layer 133B might be damaged in a step after the formation of the layer 113B, and thus is preferably positioned outward from the end portion of the pixel electrode 111B, i.e., not used as the light-emitting region. This can suppress variation in the characteristics of the light-emitting elements and can improve reliability.

When the layer 133B covers the top and side surfaces of the pixel electrode 111B, the steps after the formation of the layer 133B can be performed without exposing the pixel electrode 111B. When the end portion of the pixel electrode 111B is exposed, corrosion might occur in the etching step or the like. When corrosion of the pixel electrode 111B is inhibited, the yield and characteristics of the light-emitting element can be improved.

The sacrificial layer 118B is preferably provided also at a position overlapping with the conductive layer 123. This can inhibit the conductive layer 123 from being damaged during the manufacturing process of the display device.

As the sacrificial layer 118B, a film that is highly resistant to the process conditions for the film 133Bf, specifically, a film having high etching selectivity with respect to the film 133Bf is used.

The sacrificial layer 118B is formed at a temperature lower than the upper temperature limit of each compound included in the film 133Bf. The typical substrate temperature in formation of the sacrificial layer 118B is lower than or equal to 200° C., preferably lower than or equal to 150° C., further preferably lower than or equal to 120° C., still further preferably lower than or equal to 100° C., yet still further preferably lower than or equal to 80° C.

The upper temperature limit of the compound included in the film 133Bf is preferably high because the deposition temperature of the sacrificial layer 118B can be high. For example, the substrate temperature in formation of the sacrificial layer 118B can be higher than or equal to 100° C., higher than or equal to 120° C., or higher than or equal to 140° C. An inorganic insulating film formed at a higher temperature can be denser and have a higher barrier property. Therefore, depositing the sacrificial layer at such a temperature can further reduce damage to the film 133Bf and improve the reliability of the light-emitting element.

Note that the same can be applied to the deposition temperature of another layer formed over the film 133Bf (e.g., an insulating film 125*f*).

The sacrificial layer 118B can be formed by a sputtering method, an ALD method (including a thermal ALD method and a PEALD method), a CVD method, or a vacuum evaporation method, for example. Alternatively, the sacrificial layer 118B may be formed by the above-described wet process.

The sacrificial layer 118B (or a layer that is in contact with the film 133Bf in the case where the sacrificial layer 118B has a stacked-layer structure) is preferably formed by a formation method that causes less damage to the film 133Bf. For example, the sacrificial layer 118B is preferably formed by an ALD method or a vacuum evaporation method rather than a sputtering method.

The sacrificial layer 118B can be processed by a wet etching method or a dry etching method. The sacrificial layer 118B is preferably processed by anisotropic etching.

In the case of employing a wet etching method, damage to the film 133Bf in processing of the sacrificial layer 118B can be reduced as compared to the case of employing a dry etching method. In the case of employing a wet etching method, it is preferable to use a developer, a tetramethylammonium hydroxide (TMAH) aqueous solution, dilute hydrofluoric acid, oxalic acid, phosphoric acid, acetic acid, nitric acid, or a mixed solution containing two or more of these acids, for example. In the case of employing a wet etching method, a mixed acid chemical solution containing water, phosphoric acid, diluted hydrofluoric acid, and nitric acid may be used. A chemical solution used for the wet etching treatment may be alkaline or acid.

As the sacrificial layer 118B, one or more of a metal film, an alloy film, a metal oxide film, a semiconductor film, an inorganic insulating film, and an organic insulating film can be used, for example.

For the sacrificial layer 118B, a metal material such as gold, silver, platinum, magnesium, nickel, tungsten, chromium, molybdenum, iron, cobalt, copper, palladium, titanium, aluminum, yttrium, zirconium, or tantalum or an alloy material containing the metal material can be used, for example.

The sacrificial layer 118B can be formed using a metal oxide such as In—Ga—Zn oxide, indium oxide, In—Zn oxide, In—Sn oxide, indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or indium tin oxide containing silicon.

In addition, in place of gallium described above, an element M (M is one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like) may be used.

For example, a semiconductor material such as silicon or germanium can be used as a material with an affinity for the semiconductor manufacturing process. Alternatively, oxide or nitride of the semiconductor material can be used. Alternatively, a non-metallic material such as carbon or a compound thereof can be used. Alternatively, a metal such as titanium, tantalum, tungsten, chromium, or aluminum, or an alloy containing one or more of these metals can be used. Alternatively, oxide containing the above-described metal, such as titanium oxide or chromium oxide, or nitride such as titanium nitride, nitride chromium, or tantalum nitride can be used.

As the sacrificial layer 118B, a variety of inorganic insulating films that can be used as the protective layer 131 can be used. In particular, an oxide insulating film is preferable because its adhesion to the film 133Bf is higher than that of a nitride insulating film. For example, an inorganic insulating material such as aluminum oxide, hafnium oxide, or silicon oxide can be used for the sacrificial layer 118B. As the sacrificial layer 118B, an aluminum oxide film can be formed by an ALD method, for example. An ALD method is preferably used, in which case damage to a base (in particular, the film 133Bf) can be reduced.

For example, a stacked-layer structure of an inorganic insulating film (e.g., an aluminum oxide film) formed by an ALD method and an inorganic film (e.g., an In—Ga—Zn oxide film, a silicon film, or a tungsten film) formed by a sputtering method can be employed for the sacrificial layer 118B.

Note that the same inorganic insulating film can be used for both the sacrificial layer 118B and the insulating layer 125 that is to be formed later. For example, an aluminum oxide film formed by an ALD method can be used for both the sacrificial layer 118B and the insulating layer 125. For the sacrificial layer 118B and the insulating layer 125, the same deposition condition may be used or different deposition conditions may be used. For example, when the sacrificial layer 118B is deposited under conditions similar to those of the insulating layer 125, the sacrificial layer 118B can be an insulating layer having a high barrier property against at least one of water and oxygen. Meanwhile, since the sacrificial layer 118B is a layer almost or all of which is to be removed in a later step, it is preferable that the processing of the sacrificial layer 118B be easy. Therefore, the sacrificial layer 118B is preferably deposited with a substrate temperature lower than that for deposition of the insulating layer 125.

An organic material may be used for the sacrificial layer 118B. For example, as the organic material, a material that can be dissolved in a solvent chemically stable with respect to at least the uppermost film of the film 133Bf. Specifically, a material that is dissolved in water or alcohol can be suitably used. In depositing a film of such a material, it is preferable to apply the material dissolved in a solvent such as water or alcohol by a wet process and then perform heat treatment for evaporating the solvent. At this time, the heat treatment is preferably performed under a reduced-pressure atmosphere, in which case the solvent can be removed at a low temperature in a short time and thermal damage to the film 133Bf can be accordingly reduced.

The sacrificial layer 118B may be formed using an organic material such as polyvinyl alcohol (PVA), polyvinyl butyral, polyvinylpyrrolidone, polyethylene glycol, polyglycerin, pullulan, water-soluble cellulose, an alcohol-soluble polyamide resin, or a fluororesin such as perfluoropolymer.

For example, a stacked-layer structure of an organic film (e.g., a PVA film) formed by an evaporation method or the above wet process and an inorganic film (e.g., a silicon nitride film) formed by a sputtering method can be employed for the sacrificial layer 118B.

Note that in the display device of one embodiment of the present invention, part of the sacrificial film remains as the sacrificial layer in some cases.

Figure 23B:
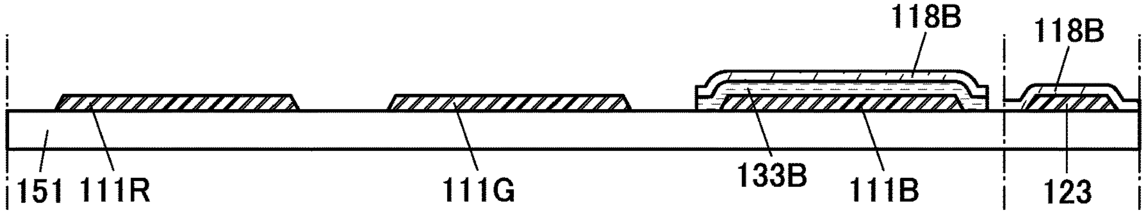

Then, the film 133Bf is processed using the sacrificial layer 118B as a hard mask, so that the layer 133B is formed (FIG. 23B).

Accordingly, as illustrated in FIG. 23B, the stacked-layer structure of the layer 133B and the sacrificial layer 118B remains over the pixel electrode 111B. In addition, the pixel electrodes 111R and 111G are exposed. In a region corresponding to the connection portion 140, the sacrificial layer 118B remains over the conductive layer 123.

The film 133Bf is preferably processed by anisotropic etching. Anisotropic dry etching is particularly preferable. Alternatively, wet etching may be employed.

Figure 23C:
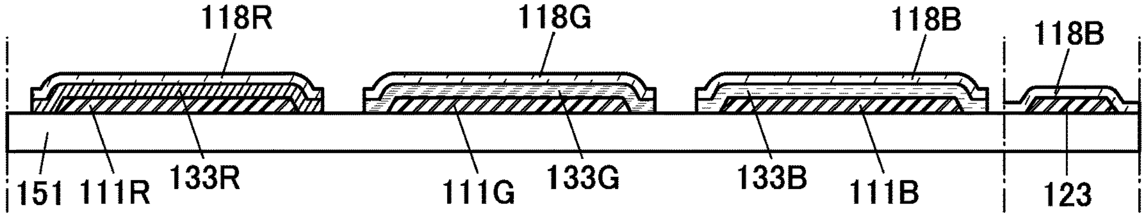

After that, steps similar to the formation step of the film 133Bf, the formation step of the sacrificial layer 118B, and the formation step of the layer 133B are repeated twice under the condition where at least light-emitting materials are changed, whereby a stacked-layer structure of the layer 133R and a sacrificial layer 118R is formed over the pixel electrode 111R and a stacked-layer structure of the layer 133G and a sacrificial layer 118G is formed over the pixel electrode 111G (FIG. 23C). Specifically, the layer 133R and the layer 133G are formed to include a light-emitting layer that emits red light and a light-emitting layer that emits green light, respectively. The sacrificial layers 118R and 118G can be formed using a material that can be used for the sacrificial layer 118B. The sacrificial layers 118R and 118G may be formed using the same material or different materials.

Note that side surfaces of the layers 133B, 133G, and 133R are preferably perpendicular or substantially perpendicular to their formation surfaces. For example, the angle between the formation surfaces and these side surfaces is preferably greater than or equal to 60° and less than or equal to 90°.

As described above, the distance between adjacent layers in the layers 133B, 133G, and 133R formed by a photolithography method can be shortened to less than or equal to 8 μm, less than or equal to 5 μm, less than or equal to 3 μm, less than or equal to 2 μm, or less than or equal to 1 μm. Here, the distance can be determined by, for example, the distance between facing end portions of adjacent layers in the layers 133B, 133G, and 133R. When the distance between the island-shaped EL layers is shortened in this manner, a high-resolution display device with a high aperture ratio can be provided.

Figure 23D:
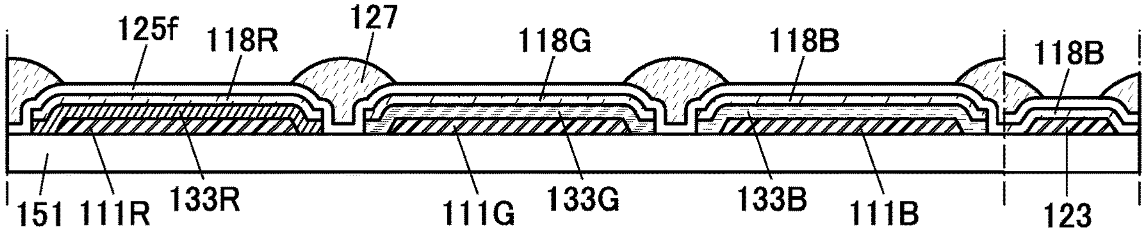

Next, the insulating film 125*f* to be the insulating layer 125 later is formed to cover the pixel electrodes, the layers 133B, 133G, and 133R, and the sacrificial layers 118B, 118G, and 118R, and then the insulating layer 127 is formed over the insulating film 125*f* (FIG. 23D).

The insulating film 125*f* is preferably formed to have a thickness greater than or equal to 3 nm, greater than or equal to 5 nm, or greater than or equal to 10 nm and less than or equal to 200 nm, less than or equal to 150 nm, less than or equal to 100 nm, or less than or equal to 50 nm.

The insulating film 125*f* is preferably formed by an ALD method, for example. An ALD method is preferably used, in which case deposition damage is reduced and a film with good coverage can be deposited. As the inorganic insulating film 125*f*, an aluminum oxide film is preferably formed by an ALD method, for example.

Alternatively, the insulating film 125*f* may be formed by a sputtering method, a CVD method, or a PECVD method that provides a higher deposition rate than an ALD method. In this case, a highly reliable display device can be manufactured with high productivity.

For example, the insulating film to be the insulating layer 127 is preferably formed by the aforementioned wet process (e.g., spin coating) using a photosensitive resin composite containing an acrylic resin. After the deposition, heat treatment (also referred to as pre-baking) is preferably performed to eliminate a solvent contained in the insulating film. Next, part of the insulating film is irradiated with visible light or ultraviolet rays as light exposure. Next, the region of the insulating film exposed to light is removed by development. Then, heat treatment (also referred to as post-baking) is performed. Accordingly, the insulating layer 127 illustrated in FIG. 23D can be formed. Note that the shape of the insulating layer 127 is not limited to the shape illustrated in FIG. 23D. For example, the top surface of the insulating layer 127 can include one or more of a convex surface, a concave surface, and a flat surface. The insulating layer 127 may cover a side surface of an end portion of at least one of the insulating layer 125, the sacrificial layer 118B, the sacrificial layer 118G, and the sacrificial layer 118R.

Figure 23E:
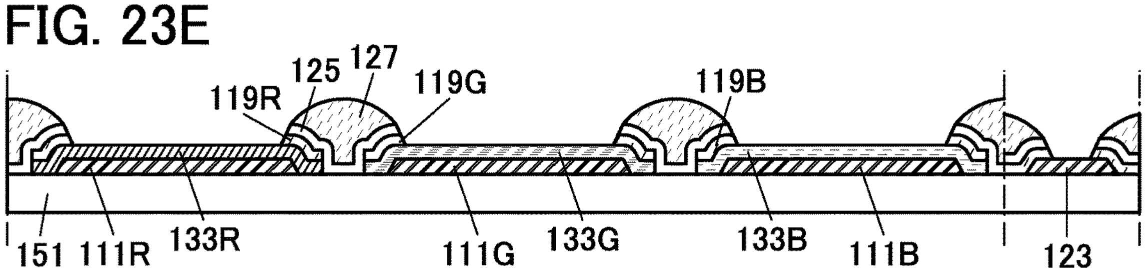

Next, as illustrated in FIG. 23E, etching treatment is performed using the insulating layer 127 as a mask to remove portions of the insulating film 125*f* and the sacrificial layers 118B, 118G, and 118R. Consequently, openings are formed in the sacrificial layers 118B, 118G, and 118R, and the top surfaces of the layer 133B, the layer 133G, the layer 133R, and the conductive layer 123 are exposed. Note that portions of the sacrificial layers 118B, 118G, and 118R may remain in positions overlapping with the insulating layers 127 and 125 (see sacrificial layers 119B, 119G, and 119R).

The etching treatment can be performed by dry etching or wet etching. Note that the insulating film 125*f* is preferably deposited using a material similar to that for the sacrificial layers 118B, 118G, and 118R, in which case etching treatment can be performed collectively.

As described above, by providing the insulating layer 127, the inorganic insulating layer 125, and the sacrificial layers 118R, 118G, and 118B, poor connection due to a disconnected portion and an increase in electric resistance due to a locally thinned portion can be inhibited from occurring in the common layer 114 and the common electrode 115 between the light-emitting elements. Thus, the display device of one embodiment of the present invention can have improved display quality.

Figure 23F:
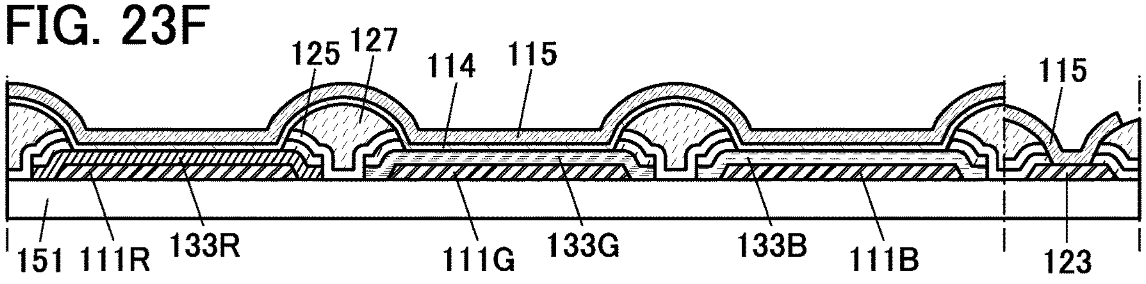

Next, the common layer 114 and the common electrode 115 are formed in this order over the insulating layer 127 and the layers 133B, 133G, and 133R (FIG. 23F).

The common layer 114 can be formed by an evaporation method (including a vacuum evaporation method), a transfer method, a printing method, an inkjet method, a coating method, or the like.

The common electrode 115 can be formed by a sputtering method or a vacuum evaporation method, for example. Alternatively, a film formed by an evaporation method and a film formed by a sputtering method may be stacked.

As described above, in the method for manufacturing the display device of one embodiment of the present invention, the island-shaped layers 133R, 133G, and 133B are formed not by using a fine metal mask but by processing a film deposited on the entire surface; thus, the island-shaped layers can be formed to have a uniform thickness. Consequently, a high-resolution display device or a display device with a high aperture ratio can be obtained. Furthermore, even when the resolution or the aperture ratio is high and the distance between the subpixels is extremely short, the layers 133R, 133G, and 133B can be inhibited from being in contact with each other in the adjacent subpixels. As a result, generation of leakage current between the subpixels can be inhibited. This can prevent crosstalk due to unintended light emission, so that a display device with extremely high contrast can be obtained.

The insulating layer 127 having a tapered end portion and being provided between adjacent island-shaped EL layers can prevent step disconnection and a locally thinned portion to be formed in the common electrode 115 at the time of forming the common electrode 115. Thus, a connection defect due to a disconnection portion and an increase in electric resistance due to a local thinning portion can be inhibited from occurring in the common layer 114 and the common electrode 115. Hence, the display device of one embodiment of the present invention achieves both high resolution and high display quality.

At least part of this embodiment can be implemented in combination with any of the other embodiments described in this specification, as appropriate.

Embodiment 3

In this embodiment, electronic devices of embodiments of the present invention will be described with reference to FIGS. 24A to 24D, FIGS. 25A to 25F, and FIGS. 26A to 26G.

Electronic devices of this embodiment are each provided with the display device of one embodiment of the present invention in a display portion. The display device of one embodiment of the present invention can be easily increased in resolution and definition. Thus, the display device of one embodiment of the present invention can be used for a display portion of a variety of electronic devices.

A semiconductor device of one embodiment of the present invention can also be applied to any other portion of an electronic device than a display portion. For example, the semiconductor device of one embodiment of the present invention is preferably used for a control portion or the like of an electronic device because lower power consumption can be achieved.

Examples of the electronic devices include a digital camera, a digital video camera, a digital photo frame, a mobile phone, a portable game console, a portable information terminal, and an audio reproducing device, in addition to electronic devices with a relatively large screen, such as a television device, desktop and laptop personal computers, a monitor of a computer and the like, digital signage, and a large game machine such as a pachinko machine.

In particular, the display device of one embodiment of the present invention can have a high definition, and thus can be favorably used for an electronic device having a relatively small display portion. Examples of such an electronic device include watch-type and bracelet-type information terminal devices (wearable devices) and wearable devices worn on the head, such as a VR device like a head-mounted display, a glasses-type AR device, and an MR device.

The definition of the display device of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K (number of pixels: 3840×2160), or 8K (number of pixels: 7680×4320). In particular, a definition of 4K, 8K, or higher is preferable. The pixel density (resolution) of the display device of one embodiment of the present invention is preferably 100 ppi or higher, further preferably 300 ppi or higher, further preferably 500 ppi or higher, further preferably 1000 ppi or higher, still further preferably 2000 ppi or higher, still further preferably 3000 ppi or higher, still further preferably 5000 ppi or higher, yet further preferably 7000 ppi or higher. The use of the display device having one or both of such high definition and high resolution can further increase realistic sensation, sense of depth, and the like. There is no particular limitation on the screen ratio (aspect ratio) of the display device of one embodiment of the present invention. For example, the display device is compatible with a variety of screen ratios such as 1:1 (a square), 4:3, 16:9, and 16:10.

The electronic device in this embodiment may include a sensor (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device in this embodiment can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Examples of head-mounted wearable devices will be described with reference to FIGS. 24A to 24D. The wearable devices have at least one of a function of displaying AR contents, a function of displaying VR contents, a function of displaying substitutional reality (SR) contents, and a function of displaying mixed reality (MR) contents. The electronic device having a function of displaying contents of at least one of AR, VR, SR, MR, and the like enables the user to feel a higher level of immersion.

Figure 24A:
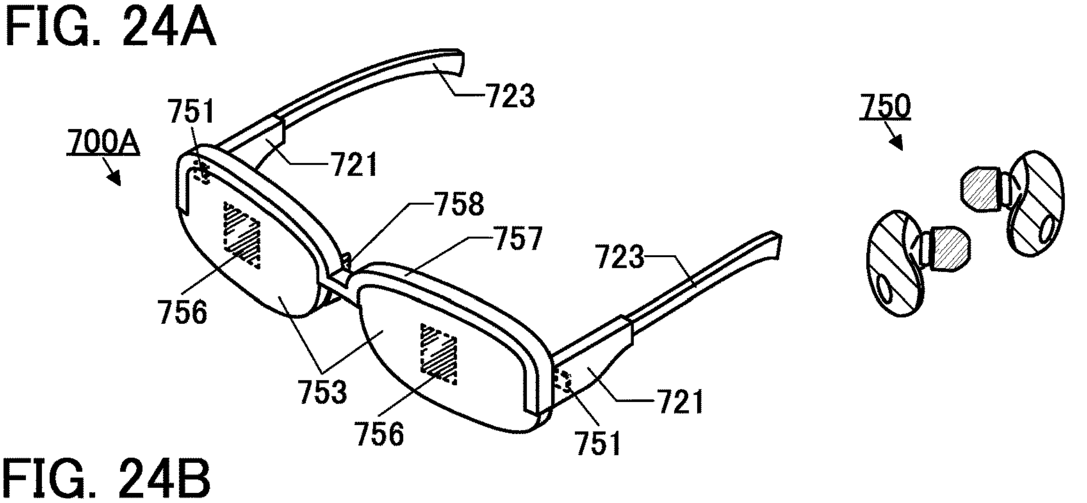
FIGS. 24A to 24D illustrate structure examples of electronic devices.
Figure 24B:
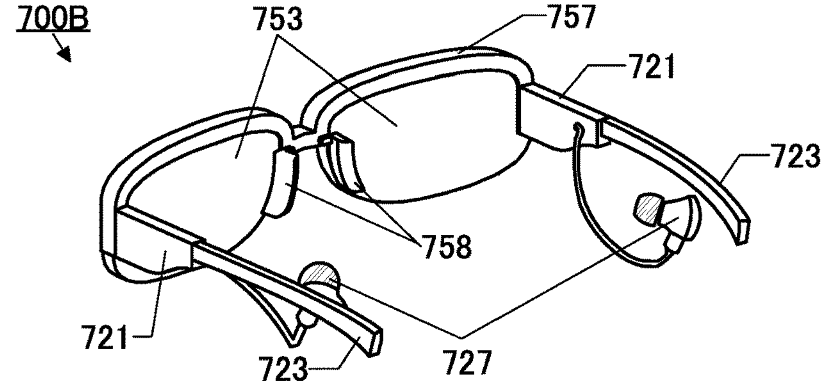

An electronic device 700A illustrated in FIG. 24A and an electronic device 700B illustrated in FIG. 24B each include a pair of display panels 751, a pair of housings 721, a communication portion (not illustrated), a pair of wearing portions 723, a control portion (not illustrated), an image capturing portion (not illustrated), a pair of optical members 753, a frame 757, and a pair of nose pads 758.

The display device of one embodiment of the present invention can be used for the display panels 751. Thus, the electronic devices are capable of performing ultrahigh-resolution display.

The electronic devices 700A and 700B can each project images displayed on the display panels 751 onto display regions 756 of the optical members 753. Since the optical members 753 have a light-transmitting property, the user can see images displayed on the display regions, which are superimposed on transmission images seen through the optical members 753. Accordingly, the electronic devices 700A and 700B are electronic devices capable of AR display.

In the electronic devices 700A and 700B, a camera capable of capturing images of the front side may be provided as the image capturing portion. Furthermore, when the electronic devices 700A and 700B are provided with an acceleration sensor such as a gyroscope sensor, the orientation of the user's head can be sensed and an image corresponding to the orientation can be displayed on the display regions 756.

The communication portion includes a wireless communication device, and a video signal and the like can be supplied by the wireless communication device. Instead of or in addition to the wireless communication device, a connector that can be connected to a cable for supplying a video signal and a power supply potential may be provided.

The electronic devices 700A and 700B are provided with a battery so that they can be charged wirelessly and/or by wire.

A touch sensor module may be provided in the housing 721. The touch sensor module has a function of detecting a touch on the outer surface of the housing 721. Detecting a tap operation, a slide operation, or the like by the user with the touch sensor module enables various types of processing. For example, a video can be paused or restarted by a tap operation, and can be fast-forwarded or fast-reversed by a slide operation. When the touch sensor module is provided in each of the two housings 721, the range of the operation can be increased.

Various touch sensors can be applied to the touch sensor module. For example, any of touch sensors of the following types can be used: a capacitive type, a resistive type, an infrared type, an electromagnetic induction type, a surface acoustic wave type, and an optical type. In particular, a capacitive sensor or an optical sensor is preferably used for the touch sensor module.

In the case of using an optical touch sensor, a photoelectric conversion element can be used as a light-receiving element. One or both of an inorganic semiconductor and an organic semiconductor can be used for an active layer of the photoelectric conversion element.

Figure 24C:
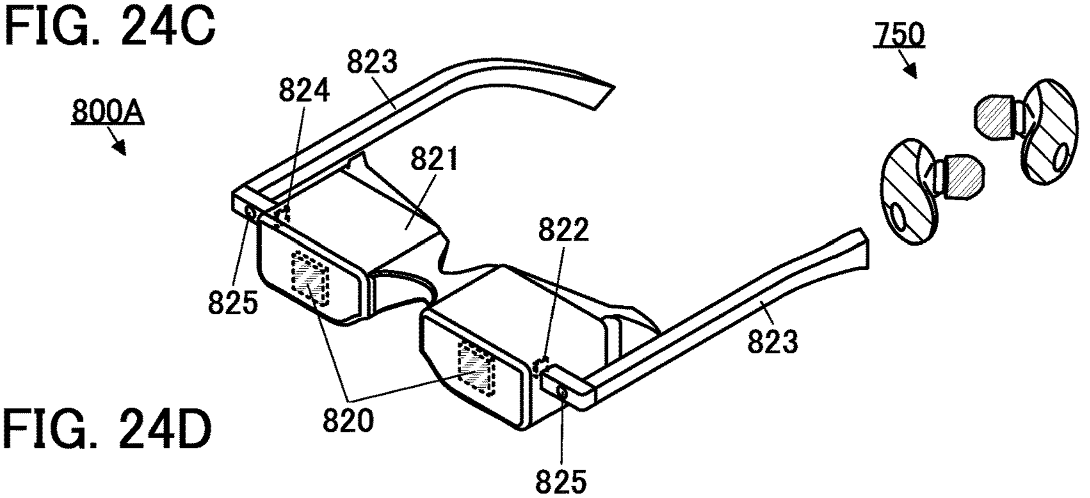
Figure 24D:
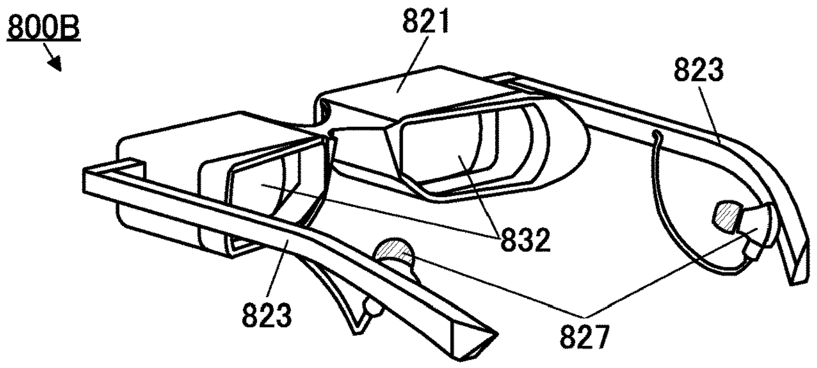

An electronic device 800A illustrated in FIG. 24C and an electronic device 800B illustrated in FIG. 24D each include a pair of display portions 820, a housing 821, a communication portion 822, a pair of wearing portions 823, a control portion 824, a pair of image capturing portions 825, and a pair of lenses 832.

The display device of one embodiment of the present invention can be used in the display portions 820. Thus, the electronic devices are capable of performing ultrahigh-resolution display. Such electronic devices provide a high sense of immersion to the user.

The display portions 820 are positioned inside the housing 821 so as to be seen through the lenses 832. When the pair of display portions 820 display different images, three-dimensional display using parallax can be performed.

The electronic devices 800A and 800B can be regarded as electronic devices for VR. The user who wears the electronic device 800A or the electronic device 800B can see images displayed on the display portions 820 through the lenses 832.

The electronic devices 800A and 800B preferably include a mechanism for adjusting the lateral positions of the lenses 832 and the display portions 820 so that the lenses 832 and the display portions 820 are positioned optimally in accordance with the positions of the user's eyes. Moreover, the electronic devices 800A and 800B preferably include a mechanism for adjusting focus by changing the distance between the lenses 832 and the display portions 820.

The electronic device 800A or the electronic device 800B can be mounted on the user's head with the wearing portions 823. FIG. 24C and the like illustrate examples where the wearing portion 823 has a shape like a temple of glasses; however, one embodiment of the present invention is not limited thereto. The wearing portion 823 can have any shape with which the user can wear the electronic device, for example, a shape of a helmet or a band.

The image capturing portion 825 has a function of obtaining information on the external environment. Data obtained by the image capturing portion 825 can be output to the display portion 820. An image sensor can be used for the image capturing portion 825. Moreover, a plurality of cameras may be provided so as to support a plurality of fields of view, such as a telescope field of view and a wide field of view.

Although an example where the image capturing portion 825 is provided is shown here, a range sensor (hereinafter also referred to as a sensing portion) capable of measuring a distance between the user and an object just needs to be provided. In other words, the image capturing portion 825 is one embodiment of the sensing portion. As the sensing portion, an image sensor or a range image sensor such as a light detection and ranging (LiDAR) sensor can be used, for example. By using images obtained by the camera and images obtained by the range image sensor, more information can be obtained and a gesture operation with higher accuracy is possible.

The electronic device 800A may include a vibration mechanism that functions as bone-conduction earphones. For example, at least one of the display portion 820, the housing 821, and the wearing portion 823 can include the vibration mechanism. Thus, without additionally requiring an audio device such as headphones, earphones, or a speaker, the user can enjoy video and sound only by wearing the electronic device 800A.

The electronic devices 800A and 800B may each include an input terminal. To the input terminal, a cable for supplying a video signal from a video output device or the like, power for charging the battery provided in the electronic device, and the like can be connected.

The electronic device of one embodiment of the present invention may have a function of performing wireless communication with earphones 750. The earphones include a communication portion (not illustrated) and have a wireless communication function. The earphones 750 can receive information (e.g., audio data) from the electronic device with the wireless communication function. For example, the electronic device 700A in FIG. 24A has a function of transmitting information to the earphones 750 with the wireless communication function. As another example, the electronic device 800A in FIG. 24C has a function of transmitting information to the earphones 750 with the wireless communication function.

The electronic device may include an earphone portion. The electronic device 700B in FIG. 24B includes earphone portions 727. For example, the earphone portion can be connected to the control portion by wire. Part of a wiring that connects the earphone portion 727 and the control portion may be positioned inside the housing 721 or the mounting portion 723.

Similarly, the electronic device 800B in FIG. 24D includes earphone portions 827. For example, the earphone portion 827 can be connected to the control portion 824 by wire. Part of a wiring that connects the earphone portion 827 and the control portion 824 may be positioned inside the housing 821 or the mounting portion 823. Alternatively, the earphone portions 827 and the mounting portions 823 may include magnets. This is preferable because the earphone portions 827 can be fixed to the mounting portions 823 with magnetic force and thus can be easily housed.

The electronic device may include an audio output terminal to which earphones, headphones, or the like can be connected. The electronic device may include one or both of an audio input terminal and an audio input mechanism. As the audio input mechanism, a sound collecting device such as a microphone can be used, for example. The electronic device may have a function of a headset by including the audio input mechanism.

As described above, both the glasses-type device (e.g., the electronic devices 700A and 700B) and the goggles-type device (e.g., the electronic devices 800A and 800B) are preferable as the electronic device of one embodiment of the present invention.

The electronic device of one embodiment of the present invention can transmit information to earphones by wire or wirelessly.

Figure 25A:
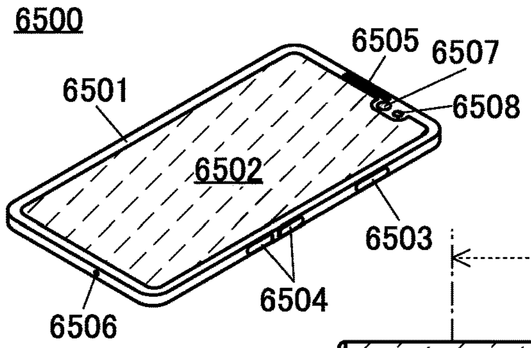
FIGS. 25A to 25F illustrate structure examples of electronic devices.

An electronic device 6500 illustrated in FIG. 25A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502.

Figure 25B:
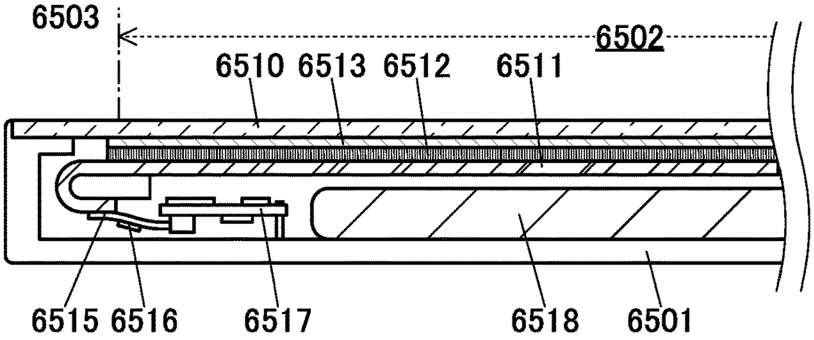

FIG. 25B is a schematic cross-sectional view including an end portion of the housing 6501 on the microphone 6506 side.

A protection member 6510 having a light-transmitting property is provided on the display surface side of the housing 6501. A display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be achieved. Since the display panel 6511 is extremely thin, the battery 6518 with high capacity can be mounted without an increase in the thickness of the electronic device. Moreover, part of the display panel 6511 is folded back so that a connection portion with the FPC 6515 is provided on the back side of the pixel portion, whereby an electronic device with a narrow bezel can be achieved.

Figure 25C:
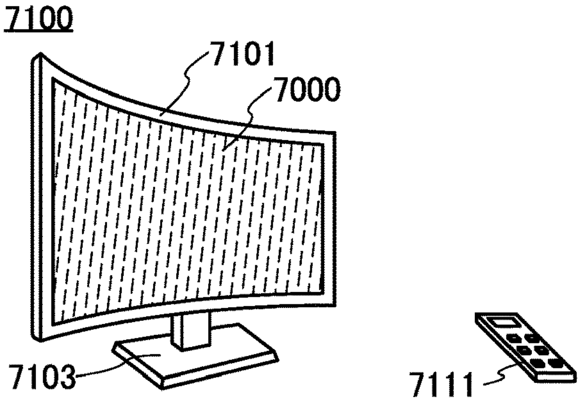

FIG. 25C illustrates an example of a television device. In a television device 7100, a display portion 7000 is incorporated in a housing 7101. Here, the housing 7101 is supported by a stand 7103.

The display device of one embodiment of the present invention can be used in the display portion 7000.

Operation of the television device 7100 illustrated in FIG. 25C can be performed with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel provided in the remote controller 7111, channels and volume can be controlled and videos displayed on the display portion 7000 can be controlled.

Note that the television device 7100 includes a receiver, a modem, and the like. A general television broadcast can be received with the receiver. When the television device is connected to a communication network by wire or wirelessly via the modem, one-way (from a transmitter to a receiver) or two-way (between a transmitter and a receiver or between receivers, for example) data communication can be performed.

Figure 25D:
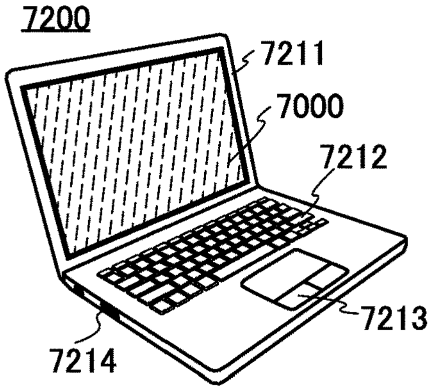

FIG. 25D illustrates an example of a laptop personal computer. The laptop personal computer 7200 includes a housing 7211, a keyboard 7212, a pointing device 7213, an external connection port 7214, and the like. The display portion 7000 is incorporated in the housing 7211.

The display device of one embodiment of the present invention can be used in the display portion 7000.

Figure 25E:
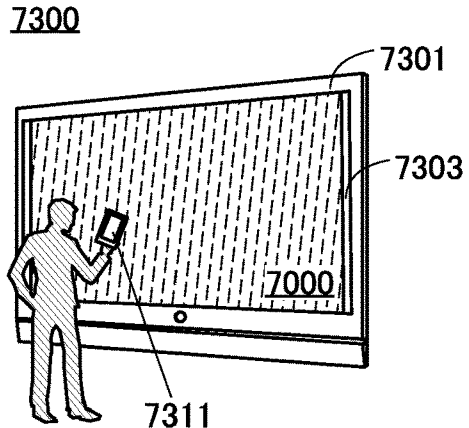
Figure 25F:
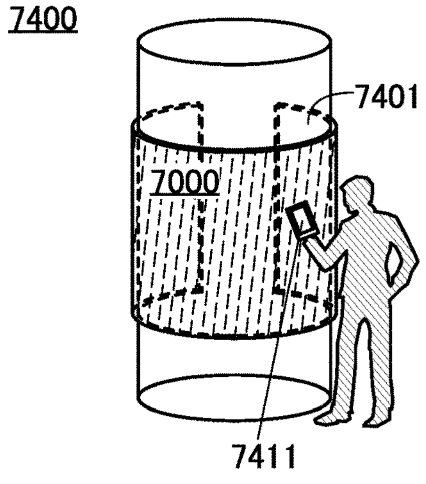

FIGS. 25E and 25F illustrate examples of digital signage.

Digital signage 7300 illustrated in FIG. 25E includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 25F illustrates digital signage 7400 attached to a cylindrical pillar 7401. The digital signage 7400 includes the display portion 7000 provided along a curved surface of the pillar 7401.

The display device of one embodiment of the present invention can be used in the display portion 7000 illustrated in each of FIGS. 25E and 25F.

A larger area of the display portion 7000 can increase the amount of information that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIGS. 25E and 25F, it is preferable that the digital signage 7300 or the digital signage 7400 can work with an information terminal 7311 or an information terminal 7411, such as a smartphone that a user has, through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Electronic devices illustrated in FIGS. 26A to 26G include a housing 9000, a display portion 9001, a speaker 9003, an operation key 9005 (including a power switch or an operation switch), a connection terminal 9006, a sensor 9007 (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

In FIGS. 26A to 26G, the display device of one embodiment of the present invention can be used in the display portion 9001.

The electronic devices illustrated in FIGS. 26A to 26G have a variety of functions. For example, the electronic devices can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may be provided with a camera or the like and have a function of capturing a still image or a moving image, a function of storing the captured image in a storage medium (an external storage medium or a storage medium incorporated in the camera), a function of displaying the captured image on the display portion, and the like.

The electronic devices in FIGS. 26A to 26G will be described in detail below.

Figure 26A:
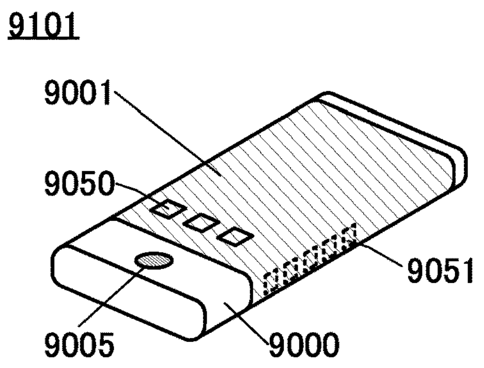
FIGS. 26A to 26G illustrate structure examples of electronic devices.

FIG. 26A is a perspective view of a portable information terminal 9101. The portable information terminal 9101 can be used as a smartphone, for example. The portable information terminal 9101 may include the speaker 9003, the connection terminal 9006, the sensor 9007, or the like. The portable information terminal 9101 can display text and image information on its plurality of surfaces. FIG. 26A illustrates an example where three icons 9050 are displayed. Furthermore, information 9051 indicated by dashed rectangles can be displayed on another surface of the display portion 9001. Examples of the information 9051 include notification of reception of an e-mail, an SNS message, or an incoming call, the title and sender of an e-mail, an SNS message, or the like, the date, the time, remaining battery, and the radio field intensity. Alternatively, the icon 9050 or the like may be displayed at the position where the information 9051 is displayed.

Figure 26B:
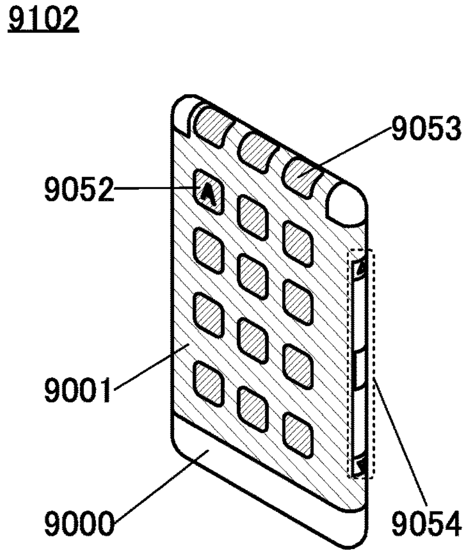

FIG. 26B is a perspective view of a portable information terminal 9102. The portable information terminal 9102 has a function of displaying information on three or more surfaces of the display portion 9001. Here, information 9052, information 9053, and information 9054 are displayed on different surfaces. For example, the user of the portable information terminal 9102 can check the information 9053 displayed such that it can be seen from above the portable information terminal 9102, with the portable information terminal 9102 put in a breast pocket of his/her clothes. The user can see the display without taking out the portable information terminal 9102 from the pocket and decide whether to answer the call, for example.

Figure 26C:
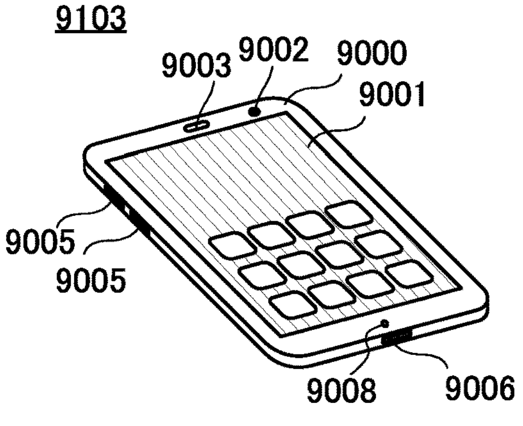

FIG. 26C is a perspective view of a tablet terminal 9103. The tablet terminal is capable of executing a variety of applications such as mobile phone calls, e-mailing, viewing and editing texts, music reproduction, Internet communication, and a computer game, for example. The tablet terminal 9103 includes the display portion 9001, the camera 9002, the microphone 9008, and the speaker 9003 on the front surface of the housing 9000; the operation keys 9005 as buttons for operation on the left side surface of the housing 9000; and the connection terminal 9006 on the bottom surface of the housing 9000.

Figure 26D:
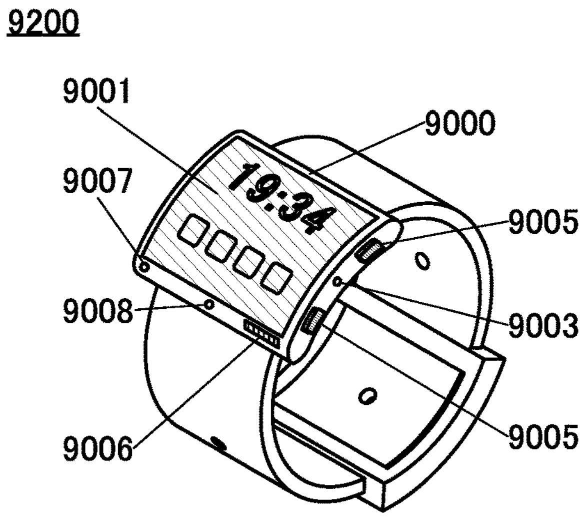

FIG. 26D is a perspective view of a watch-type portable information terminal 9200. The portable information terminal 9200 can be used as a Smartwatch (registered trademark), for example. The display surface of the display portion 9001 is curved, and an image can be displayed on the curved display surface. Furthermore, for example, mutual communication between the portable information terminal 9200 and a headset capable of wireless communication can be performed, and thus hands-free calling is possible. With the connection terminal 9006, the portable information terminal 9200 can perform mutual data transmission with another information terminal and charging. Note that the charging operation may be performed by wireless power feeding.

Figure 26E:
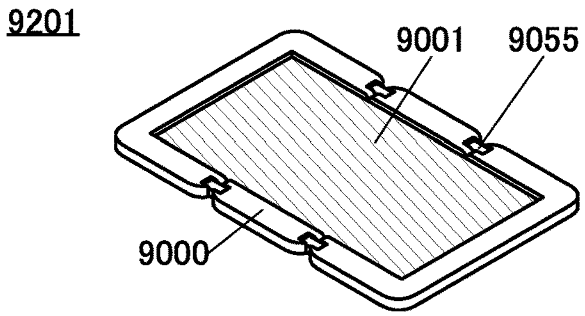
Figure 26F:
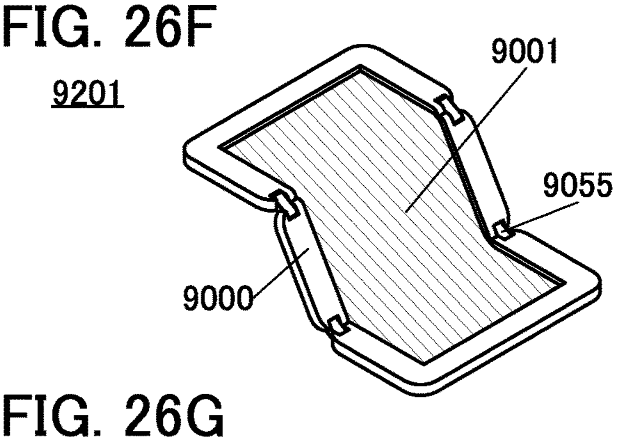
Figure 26G:
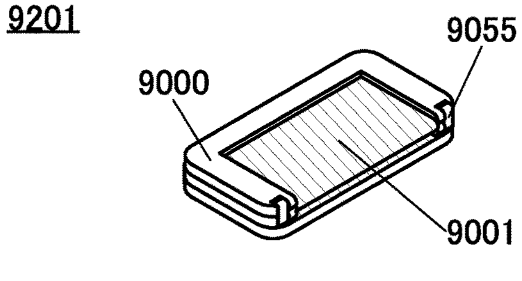

FIGS. 26E to 26G are perspective views of a foldable portable information terminal 9201. FIG. 26E is a perspective view illustrating the portable information terminal 9201 that is opened. FIG. 26G is a perspective view illustrating the portable information terminal 9201 that is folded. FIG. 26F is a perspective view illustrating the portable information terminal 9201 that is shifted from one of the states in FIGS. 26E and 26G to the other. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. The display portion can be folded with a radius of curvature greater than or equal to 0.1 mm and less than or equal to 150 mm, for example.

At least part of this embodiment can be implemented in combination with any of the other embodiments described in this specification, as appropriate.

This application is based on Japanese Patent Application Serial No. 2022-079206 filed with Japan Patent Office on May 13, 2022, the entire contents of which are hereby incorporated by reference.

What is claimed is:

1. A semiconductor device comprising:

a first transistor;

a second transistor; and an insulating layer, wherein the first transistor comprises a first semiconductor layer, a gate insulating layer, a gate electrode, and a first conductive layer, wherein the second transistor comprises a second semiconductor layer, the gate insulating layer, the gate electrode, and a second conductive layer, wherein the insulating layer comprises a first side surface and a second side surface, wherein the first side surface is over the first conductive layer, wherein the second side surface is over the second conductive layer, wherein the first semiconductor layer comprises a portion over the insulating layer, a portion in contact with the first side surface, and a portion in contact with a top surface of the first conductive layer, wherein the second semiconductor layer comprises a portion over the insulating layer, a portion in contact with the second side surface, and a portion in contact with a top surface of the second conductive layer, wherein the gate insulating layer comprises a portion over the insulating layer, a portion facing the first side surface with the first semiconductor layer therebetween, and a portion facing the second side surface with the second semiconductor layer therebetween, wherein the gate electrode comprises a portion over the insulating layer, a portion facing the first side surface with the gate insulating layer and the first semiconductor layer therebetween, and a portion facing the second side surface with the gate insulating layer and the second semiconductor layer therebetween, and wherein, over the insulating layer, the first semiconductor layer is electrically connected to the second semiconductor layer.

2. The semiconductor device according to claim 1, further comprising a third conductive layer, wherein the third conductive layer is over the insulating layer, and wherein the first semiconductor layer and the second semiconductor layer each comprise a portion in contact with the third conductive layer.

3. The semiconductor device according to claim 2, further comprising a fourth conductive layer, wherein over the insulating layer, the fourth conductive layer is in contact with the third conductive layer, wherein the third conductive layer comprises an oxide, and wherein the fourth conductive layer comprises a metal or an alloy.

4. The semiconductor device according to claim 1, further comprising a third conductive layer, wherein the third conductive layer is over the insulating layer, wherein the first semiconductor layer and the second semiconductor layer each comprise a portion in contact with the third conductive layer, wherein the first conductive layer, the first semiconductor layer, the third conductive layer, the gate insulating layer, and the gate electrode overlap with each other, and wherein the second conductive layer, the second semiconductor layer, the third conductive layer, the gate insulating layer, and the gate electrode overlap with each other.

5. The semiconductor device according to claim 1, further comprising a fifth conductive layer, wherein the fifth conductive layer is under the insulating layer, wherein the fifth conductive layer is in contact with one or both of the first conductive layer and the second conductive layer, wherein the first conductive layer and the second conductive layer each comprise an oxide, and wherein the fifth conductive layer comprises a metal or an alloy.

6. The semiconductor device according to claim 1, wherein the first semiconductor layer is a first part of a first film, and wherein the second semiconductor layer is a second part of the first film.

7. A semiconductor device comprising:

a first transistor;

a second transistor; and an insulating layer, wherein the first transistor comprises a first semiconductor layer, a gate insulating layer, a gate electrode, and a first conductive layer, wherein the second transistor comprises a second semiconductor layer, the gate insulating layer, the gate electrode, and a second conductive layer, wherein the insulating layer comprises a first side surface and a second side surface, wherein the first side surface is over the first conductive layer, wherein the second side surface is over the second conductive layer, wherein the first semiconductor layer comprises a portion over the insulating layer, a portion in contact with the first side surface, and a portion in contact with a top surface of the first conductive layer, wherein the second semiconductor layer comprises a portion over the insulating layer, a portion in contact with the second side surface, and a portion in contact with a top surface of the second conductive layer, wherein the gate insulating layer comprises a portion over the insulating layer, a portion facing the first side surface with the first semiconductor layer therebetween, and a portion facing the second side surface with the second semiconductor layer therebetween, wherein the gate electrode comprises a portion over the insulating layer, a portion facing the first side surface with the gate insulating layer and the first semiconductor layer therebetween, and a portion facing the second side surface with the gate insulating layer and the second semiconductor layer therebetween, and wherein, under the insulating layer, the first conductive layer is electrically connected to the second conductive layer.

8. The semiconductor device according to claim 7, wherein the first semiconductor layer is a first part of a first film, and wherein the second semiconductor layer is a second part of a second film.

* * * * *